US007981573B2

(12) United States Patent
Ishibashi et al.

(10) Patent No.: US 7,981,573 B2
(45) Date of Patent: *Jul. 19, 2011

(54) REFLECTIVE MASK BLANK, REFLECTIVE MASK AND METHODS OF PRODUCING THE MASK BLANK AND THE MASK

(75) Inventors: Shinichi Ishibashi, Tokyo (JP); Tsutomu Shoki, Tokyo (JP); Morio Hosoya, Tokyo (JP); Yuki Shiota, Tokyo (JP); Mitsuhiro Kureishi, Tokyo (JP)

(73) Assignee: Hoya Corporation, Tokyo (JP)

( * ) Notice: Subject to any disclaimer, the term of this patent is extended or adjusted under 35 U.S.C. 154(b) by 334 days.

This patent is subject to a terminal disclaimer.

(21) Appl. No.: 12/116,550

(22) Filed: May 7, 2008

(65) Prior Publication Data
US 2008/0248409 A1    Oct. 9, 2008

Related U.S. Application Data

(62) Division of application No. 10/510,916, filed on Oct. 12, 2004, now Pat. No. 7,390,596.

(51) Int. Cl.
*G03F 1/00* (2006.01)
(52) U.S. Cl. .......................................................... 430/5
(58) Field of Classification Search .............. 430/5, 313, 430/312, 394, 31; 428/428, 430
See application file for complete search history.

(56) References Cited

U.S. PATENT DOCUMENTS
5,754,619 A    5/1998   Yoshihara et al.
6,939,650 B2   9/2005   Wasson et al.

FOREIGN PATENT DOCUMENTS
| JP | 6-095358 A    | 4/1994 |
| JP | 7-333829 A    | 12/1995 |
| JP | 8-213303      | 8/1996 |
| JP | 11307442 A    | 11/1999 |
| JP | 2000-150364 A | 5/2000 |

(Continued)

OTHER PUBLICATIONS

Korean Office Action dated Nov. 11, 2008.

(Continued)

*Primary Examiner* — Stephen Rosasco
(74) *Attorney, Agent, or Firm* — Sughrue Mion, PLLC

(57) ABSTRACT

A reflective mask blank has a substrate (11) on which a reflective layer (12) for reflecting exposure light in a short-wavelength region including an extreme ultraviolet region and an absorber layer (16) for absorbing the exposure light are successively formed. The absorber layer (16) has an at least two-layer structure including as a lower layer an exposure light absorbing layer (14) formed by an absorber for the exposure light in the short-wavelength region including the extreme ultraviolet region and as an upper layer a low-reflectivity layer (15) formed by an absorber for inspection light used in inspection of a mask pattern. The upper layer is made of a material containing tantalum (Ta), boron (B), and nitrogen (N). The content of B is 5 at % to 30 at %. The ratio of Ta and N (Ta:N) falls within a range of 8:1 to 2:7. Alternatively, the reflective mask blank has a substrate on which a multi-layer reflective film and an absorber layer are successively formed. In this case, the absorber layer is made of a material containing tantalum (Ta), boron (B), and nitrogen (N). The content of B is 5 at % to 25 at %. The ratio of Ta and N (Ta:N) falls within a range of 8:1 to 2:7.

10 Claims, 17 Drawing Sheets

FOREIGN PATENT DOCUMENTS

| | | |
|---|---|---|
| JP | 2001-237174 A | 8/2001 |
| JP | 2002-246299 A | 8/2002 |

OTHER PUBLICATIONS

Ted Liang, et al., Enhanced Optical Inspectability of Patterned EUVL Mask, pp. 288-296.

Notification of Transmittal of Copies of Translation of the International Preliminary Examination Report PCT Gazette—Section II—Corrected Versions of Pamphlets—Feb. 24, 2005.

Shinji Tsuboi, et al., Recent progress in 1X x-ray mask technology: Feasiblity Study using ASET-NIST format TaXN x-ray masks with 100 nm rule 4 Gbit dynamic random access memory test patterns, 2001 American Society, pp. 2416-2422.

M. Takahashi, et al., Smooth, low-stress, sputtered tantalum and tantalum alloy films for the absorber material of reflective-type EUVL, In Emerging Lithographic Technologies IV, Elizabeth A. Dabisz, Editor, Proceedings of SPIE vol. 3997 (2000), pp. 484-495.

Kenneth Racette, et al., Sputter deposition and annealing of Ta, $TaSI_x$ and $TaB_x$ composite films and their application in next generation lithography masks, 2000 American Vacuum Society, pp. 1119-1124.

T. Liang, et al "Enhanced Optical Inspectability of Patterned EUVL Mask", Intel Corporation, Components Research, pp. 288-295.

Takahashi M et al "Tantalum Nitride Films for the Absorber Material of Reflective-Type EUVL Mask" Proceedings of the SPIE—The International Society for Optical Engineering SPIE—Int. Soc. Opt. Eng. USA, vol. 4343, 2001, pp. 760-770 XP002458381 ISSN: 0277-786X.

Cardinale G F et al: "Effects of Smoothing on Defect Printability at Extreme Ultraviolet Wavelengths & ast;" Journal of Vacuum Science & Technology B: Microelectronics Processing and Phenomena, American Vacuum Society, New York, NY, US, vol. 18, No. 6, Nov. 2000, pp. 2944-2949, XP012008496 Issn: 0734-211X.

Ohkubo R et al: "Characteristics of Ta4B-SiC X-ray Mask Blanks", Proceedings of the SPIE—The International Society for Optical Engineering SPIE—Int. Soc. Opt. Eng. USA, vol. 2793, 1996, pp. 219-224, XP002462592 Issn: 0277-786X.

(a)

(b)

(c)

(d)

(e)

(b)

(c)

(d)

(e)

US 7,981,573 B2

REFLECTIVE MASK BLANK, REFLECTIVE MASK AND METHODS OF PRODUCING THE MASK BLANK AND THE MASK

This is a divisional of application Ser. No. 10/510,916 filed Oct. 12, 2004 now U.S. Pat. No. 7,390,596. The entire disclosure(s) of the prior application(s), application Ser. No. 10/510,916 is considered part of the disclosure of the accompanying divisional application and is hereby incorporated by reference.

TECHNICAL FIELD

This invention relates to a reflective mask and a reflective mask blank suitably used in lithography using exposure light within a short-wavelength region, such as extreme ultraviolet light, and to methods of producing the mask and the mask blank and, in particular, to a reflective mask and the like enabling accurate and quick inspection of a mask pattern.

BACKGROUND ART

In recent years, following the development of a highly-integrated semiconductor product, such as a semiconductor memory and a VLSI (Very Large Scale Integrated circuit), there arises a demand for a fine pattern exceeding a transfer limit in photolithography. In order to enable such a fine pattern to be transferred, proposal has been made of lithography using extreme ultraviolet light (hereinafter abbreviated to EUV light) having a shorter wavelength or the like. It is noted here that the EUV light means light of a wavelength band within a soft X-ray region or a vacuum ultraviolet region, specifically, light having a wavelength of about 0.2-100 nm.

In the meanwhile, proposal has been made of a reflective mask used as an exposure mask within a short-wavelength region including the EUV light or X-ray. The reflective mask has a basic structure comprising a Si or quartz substrate, a reflective layer formed on the substrate to reflect the EUV light or the X-ray, and an absorber pattern formed on the reflective layer to absorb the EUV light or the X-ray. Generally, the reflective layer comprises a multilayer film including thin films of at least two kinds of substances alternately laminated. In a direction inclined at several degrees (typically, 2 to 5 degrees) from a perpendicular direction to the mask, exposure light is incident to the mask. The exposure light is absorbed in an area where the absorber pattern is present. In a remaining area, the exposure light is reflected by the reflective layer. Therefore, a reflected image corresponding to the absorber pattern is formed. By reduction projection of the reflected image through an appropriate optical system onto a silicon wafer, transfer is carried out.

Japanese Patent Application Publication (JP-A) Nos. H7-333829 and H8-213303 disclose a structure including an intermediate layer formed between the reflective layer and the absorber, in addition to the above-mentioned basic structure of the reflective mask. Thus, the intermediate layer is formed in order to protect the reflective layer during patterning of the absorber, in particular, during etching so that the reflective layer as an underlying layer is not damaged by etching.

Now, referring to FIG. 1, description will be made of a method of producing a reflective mask used in the lithography using the EUV light (for example, the EUV light having a wavelength of about 13.4 nm within the soft X-ray region). FIG. 1 includes schematic sectional views sequentially showing a production process of an existing reflective mask.

A mask blank 101 is prepared by successively depositing, on a substrate 11 of quartz or the like, a laminate film 12 as a reflective layer for the EUV light (hereinafter called an EUV reflective layer), a buffer layer 13 (corresponding to the above-mentioned intermediate layer) formed on the laminate film for the purpose of protecting the EUV reflective layer in an absorber pattern forming step, an absorber layer 14 formed on the buffer layer to absorb the EUV light (hereinafter called an EUV absorber layer) (see FIG. 1(a)).

Next, the EUV absorber layer 14 as an absorber for the EUV light is processed to form an EUV absorber pattern having a predetermined pattern (see FIG. 1(b)).

Then, inspection is carried out to confirm whether or not the EUV absorber pattern is formed exactly as designed. For example, it is assumed that, as a result of the pattern inspection, detection is made of occurrence of a pinhole defect (a defect that the absorber layer is removed at a position where it should not be etched off, may be called a white (clear) defect) 21 resulting from adhesion of foreign matters to a resist layer during pattern formation and an underetching defect (a position where the absorber layer is not sufficiently removed due to underetching, may be called a black (opaque) defect) 22, as shown in FIG. 1(b). In this event, the pinhole defect 21 is repaired by depositing a carbon film 23 in a pinhole using focused ion beam (FIB) assisted deposition. The underetching defect 22 is repaired by removing a residual part 22a using FIB gas assisted etching to obtain a removed part 25 where the absorber layer 14 is removed. By irradiation energy during repair, a damaged part 24 (a part 24a removed by FIB and a part 24b penetrated by FIB ions) is present on a surface of the buffer layer 13 (see FIG. 1(c)).

Thereafter, by removing a part of the buffer layer 13 corresponding to the removed part 25 where the EUV absorber layer 14 is removed, a pattern 26 is formed so that the reflective mask for the EUV light is produced (see FIG. 1(d)).

When the reflective mask is exposed by EUV light 31, the light is absorbed in an area where the absorber pattern is present. In a remaining area (where the absorber layer 14 and the buffer layer 13 are removed), the EUV light 31 is reflected by the reflective layer 12 which is exposed (see FIG. 1(e)). Thus, the reflective mask can be used as a mask for the lithography using the EUV light.

As described above, in the above-mentioned mask production process, inspection is carried out, after the pattern is formed on the EUV absorber layer 14, to confirm whether or not the EUV absorber pattern is formed exactly as designed. The inspection of the mask pattern is carried out by the use of an inspecting apparatus using light having a wavelength of, for example, about 257 nm (generally, deep ultraviolet light having a wavelength of 190-260 nm). Specifically, by irradiating the mask with the light of about 257 nm, a pattern of a reflected image is produced to be subjected to the inspection. The inspection of the mask pattern is carried out after completion of the pattern forming step (step in FIG. 1(b)) for the EUV absorber layer 14 on a surface as described above. Based on the result of the inspection, the pattern is repaired if necessary. Specifically, the inspection is carried out by a difference in reflectivity between the surface of the buffer layer 13 exposed after the absorber on the surface is removed by patterning and the surface of the absorber as the remaining pattern when the light used in the inspection (hereinafter will be referred to as inspection light) is irradiated onto the mask. Therefore, if the difference in reflectivity for the wavelength of the inspection light between the surface of the buffer layer and the surface of the absorber layer is small, a contrast upon the inspection is insufficient so that defect inspection can not accurately be carried out.

Typically, in case of the existing reflective mask, the EUV absorber on the surface is formed by a tantalum film or a tantalum nitride film and the buffer layer is formed by a SiO$_2$ film. For the inspection light having a wavelength of 257 nm, the difference between the reflectivity of the surface of the absorber and the reflectivity on the surface of the buffer layer is small so that the contrast upon the inspection is insufficient. As a result, a pattern defect can not sufficiently be detected during the inspection of the mask and an accurate defect test can not be carried out.

On the other hand, by inspection with an electron microscope using an electron beam, an EUV absorber film is damaged by the electron beam irradiated thereto. Therefore, practical use is difficult.

Proposal is also made of a method of using light of about 13.4 nm as an EUV light wavelength mentioned above to inspect a mask pattern. However, in order to equip the inspection apparatus with an EUV light source, an extremely high facility cost is required. Further, as compared with an existing inspection apparatus using an ultraviolet wavelength, a pattern inspecting step is increased in scale and complicated because a structure of holding a whole of an optical system in vacuum is required in order to avoid absorption in atmospheric air. In addition, a throughput is reduced due to a time required for evacuation into vacuum.

Referring to FIG. 1, description will be made of a specific example where the reflective layer 12 is a multilayer reflective film. Specifically, the multilayer reflective film comprising thin films made of substances different in refractive index and alternately laminated is generally used as the reflective layer 12. For example, as the multilayer reflective film for light having a wavelength of about 13 nm, a multilayer film comprising Si and Mo alternately laminated in about 40 periods is known.

In the specific example, it is assumed that the buffer layer 13 comprises a SiO$_2$ film or a Cr film and the absorber layer 14 is made of Ta or a Ta alloy.

After the step in FIG. 1(d) (the step of removing a predetermined part of the buffer layer 13 on the reflective layer 12 to form the pattern 26), inspection for final confirmation is carried out to confirm whether or not the absorber pattern is formed in exact conformity with a specification. The final inspection of the pattern is also carried out by observing the contrast in reflection of the inspection light on the surface of the mask using deep ultraviolet light as the inspection light, in the manner similar to the above-mentioned first inspection after completion of the pattern forming step (the step in FIG. 1(b)) for the absorber layer 14.

Specifically, in the first inspection, the inspection is carried out by observing the contrast in reflection of the inspection light between the surface of the buffer layer 13 exposed in the area where the absorber layer 14 is removed and the surface of the absorber layer 14 in the area where the absorber layer 14 remains. On the other hand, in the inspection for final confirmation, the inspection is carried out by the contrast in reflection of the inspection light between the surface of the multilayer reflective film 12 exposed in the area where the buffer layer 13 is removed and the surface of the absorber layer 14 in the area where the absorber layer 14 remains.

Therefore, if the difference in reflectivity between the surface of the buffer layer 13 and the surface of the absorber layer 14 for the wavelength of the inspection light is small, the contrast during the first inspection is inferior so that the first inspection can not accurately be carried out. If the difference in reflectivity between the surface of the multilayer reflective film and the surface of the absorber layer for the wavelength of the inspection light is small, the contrast during the final inspection is inferior so that the final inspection can not accurately be carried out.

For example, in case where the deep ultraviolet light having a wavelength of 257 nm is used as the inspection light, the reflectivity of Ta or the Ta alloy used as the absorber layer for the EUV light is as relatively high as about 35%. On the other hand, the reflectivity of the buffer layer is about 40% in case of SiO$_2$ and about 50% in case of Cr. Therefore, the difference in reflectivity is small so that a sufficient contrast can not be obtained in the pattern inspection. A Mo/Si periodic multilayer film generally used for the exposure light having a wavelength of about 13 nm has a reflectivity of about 60% for far ultraviolet light. In this case, it is also difficult to achieve a contrast sufficient to obtain an accurate result in the inspection for final confirmation.

On the other hand, it is possible to decrease the reflectivity for the inspection light by roughening the surface of the absorber layer. In this case, however, edge roughness after pattern formation is increased so that the dimensional accuracy of the mask is degraded.

In order to decrease the reflectivity, it is effective to add nitrogen. However, tantalum nitride (TaN) containing Ta with nitrogen added thereto is a crystalline substance. In particular, if a metal film is used as the buffer layer, a TaN film formed thereon has a granular structure. In this case also, the edge roughness after pattern formation is increased and the dimensional accuracy of the mask is degraded.

DISCLOSURE OF THE INVENTION

It is an object of this invention to provide a reflective mask and a reflective mask blank which enable mask pattern inspection to be accurately and quickly carried out and to provide methods of producing the mask and the mask blank.

As a result of diligent study in order to achieve the above-mentioned object, the present inventor has found out that, by functionally separating an absorber layer on a surface of an existing mask into a layer for absorbing exposure light and a layer having a low reflectivity for a mask pattern inspection wavelength and by laminating these layers, a sufficient contrast is obtained upon pattern inspection.

Specifically, a mask blank according to this invention is a mask blank comprising a substrate on which a reflective layer for reflecting exposure light in a short-wavelength region including an EUV region, a buffer layer for protecting the reflective layer during formation of a mask pattern, and an absorber layer for absorbing the exposure light are successively formed, wherein the absorber layer has an at least two-layer structure including as a lower layer an exposure light absorbing layer comprising an absorber for the exposure light within the short-wavelength region including the EUV region and as an upper layer a low-reflectivity layer comprising an absorber for inspection light used in inspection of the mask pattern.

A reflective mask according to this invention is obtained by patterning at least the low-reflectivity layer and the exposure light absorbing layer in the above-mentioned mask blank.

The reflective mask according to this invention is applicable to a mask for EUV light. The exposure light has a wavelength within the EUV region, specifically, within a wavelength region of several nanometers to 100 nanometers.

Specifically, the low-reflectivity layer as an uppermost layer may be formed by a material having a low reflectivity for the wavelength of the mask pattern inspection light.

In this invention, the absorber layer has a laminated structure in which the absorber layer is functionally separated into the layer for absorbing the exposure light (exposure light absorbing layer) and the low-reflectivity layer for the inspection light. With this structure, an exposure light absorbing function as a primary function is not impaired and the reflectivity for the pattern inspection wavelength is remarkably decreased by the low-reflectivity layer formed on an uppermost surface. Thus, a difference in reflectivity between the surface of the low-reflectivity layer and the surface of the buffer layer exposed after the absorber layer is removed by pattern formation is increased at the pattern inspection wavelength. Therefore, a sufficient contrast upon inspection is achieved and a reflected image pattern of a high contrast is formed. Consequently, it is possible to accurately and quickly inspect the mask pattern by the use of a mask inspection apparatus used at present.

By functionally separating the absorber layer into the layer for absorbing the exposure light (exposure light absorbing layer) and the low-reflectivity layer for the inspection light, it is possible to optimize light absorption and light reflection characteristics individually for the exposure light and the inspection light and to further reduce the thickness. Although the absorber layer has a laminated structure, the thickness is suppressed to a level equivalent to that of an existing single-layer structure. Therefore, it is possible to suppress blurring at an edge portion of the pattern during exposure. Further, by reducing a processing time for pattern formation, a pattern damage is minimized to achieve an improvement in quality.

Preferably, the exposure light absorber of the lower layer in the absorber layer is made of at least one substance selected from a lower layer substance group including one element selected from an element group including, for example, chromium, manganese, cobalt, copper, zinc, gallium, germanium, molybdenum, palladium, silver, cadmium, tin, antimony, tellurium, iodine, hafnium, tantalum, tungsten, titanium, and gold, a substance containing at least one of nitrogen and oxygen and the above-mentioned one element selected, an alloy containing one element selected from the element group, and a substance containing at least one of nitrogen and oxygen and the above-mentioned alloy.

The above-mentioned alloy containing one element includes an alloy of the above-mentioned elements, such as a tantalum germanium alloy (TaGe), an alloy with silicon, such as a tantalum silicon alloy (TaSi) or a tantalum germanium silicon alloy (TaGeSi), an alloy with boron, such as a tantalum boron alloy (TaB), a tantalum silicon boron alloy (TaSiB), or a tantalum germanium boron alloy (TaGeB), and so on.

Preferably, the inspection light absorber forming the low-reflectivity layer as the upper layer of the absorber layer is made of at least one substance selected from an upper layer substance group including one of nitride, oxide, and oxynitride of a substance forming the exposure light absorber, one of the nitride, the oxide, and the oxynitride with silicon added thereto, and oxynitride of silicon.

A method of producing a mask blank according to this invention comprises steps of forming on a substrate a reflective layer for reflecting exposure light in a short-wavelength region including an EUV region, forming on the reflective layer a buffer layer for protecting the reflective layer during formation of a mask pattern, forming on the buffer layer an exposure light absorbing layer for the exposure light in the short-wavelength region including the EUV region, and forming on the exposure light absorbing layer a low-reflectivity layer for inspection light used in inspection of the mask pattern. Depending upon a material of the absorber, the low-reflectivity layer for the inspection light used in the inspection of the mask pattern may be formed by treating a surface of the exposure light absorbing layer for the exposure light in the short-wavelength region including the EUV region after the exposure light absorbing layer is formed on the buffer layer.

In the latter technique, a work can be simplified and a working time can be shortened.

In the method of producing a mask blank according to this invention, it is preferable to obtain a relationship between a thickness of the low-reflectivity layer formed on the exposure light absorbing layer for the exposure light and the reflectivity on the low-reflectivity layer for the inspection light wavelength and to select the thickness of the low-reflectivity layer so that the reflectivity on the low-reflectivity layer for the inspection light wavelength is minimized.

The reflective mask according to this invention is produced by patterning the low-reflectivity layer as the upper layer and the exposure light absorbing layer as the lower layer which form the absorber layer of the mask blank. Preferably, after the low-reflectivity layer and the exposure light absorbing layer are patterned, the buffer layer is removed in an area where the low-reflectivity layer and the exposure light absorbing layer are removed. By removing the buffer layer, the reflective mask is improved in reflection characteristic for the exposure light.

As a result of diligent study in order to achieve the above-mentioned object, the present inventor has found out that, by selecting a specific material as the material of the absorber layer, a sufficient contrast is obtained in pattern inspection without degrading the dimensional accuracy of the mask.

The present inventor has found out that the above-mentioned object is achieved by using as the absorber layer a material containing tantalum, boron, and at least one element selected from oxygen and nitrogen.

Specifically, a reflective mask blank according to this invention is a reflective mask blank comprising a substrate on which a multilayer reflective film for reflecting exposure light and an absorber layer for absorbing the exposure light are successively formed, with a buffer layer formed between the multilayer reflective film and the absorber layer to protect the multilayer reflective film during etching for pattern formation on the absorber layer, wherein the absorber layer is made of a material containing tantalum (Ta), boron (B), and nitrogen (N), the composition of Ta, B, and N being selected so that the content of B is 5 at % to 25 at % and that the ratio of Ta and N (Ta:N) falling within a range of 8:1 to 2:7.

Alternatively, a reflective mask blank according to this invention is a reflective mask blank comprising a substrate on which a multilayer reflective film for reflecting exposure light and an absorber layer for absorbing the exposure light are successively formed, with a buffer layer formed between the multilayer reflective film and the absorber layer to protect the multilayer reflective film during etching for pattern formation on the absorber layer, wherein the absorber layer is made of a material containing tantalum (Ta), boron (B), and oxygen (O). In this case, the material of the absorber layer may further contain nitrogen (N).

Preferably, the material of the absorber layer has an amorphous state.

Preferably, the buffer layer combined with the material of the absorber layer in this invention is made of a material containing chromium (Cr).

A reflective mask according to this invention is obtained by patterning the absorber layer of the reflective mask blank.

BEST MODE FOR EMBODYING THE INVENTION

First Embodiment

Figure 1:
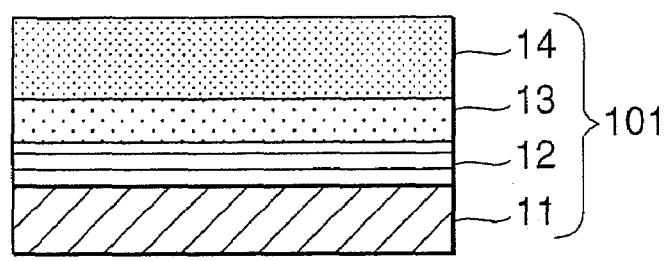
FIG. 1 shows schematic sectional views illustrating a production process of an existing reflective mask.
Figure 1:
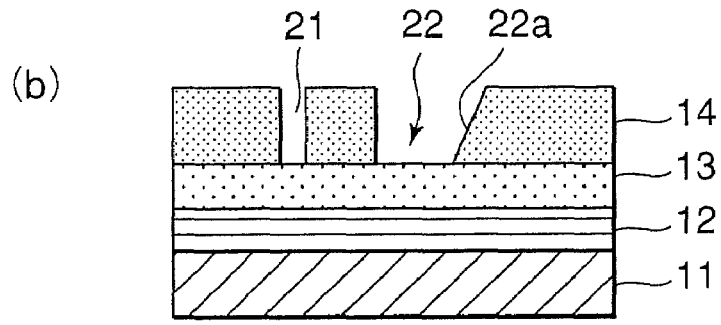
Figure 1:
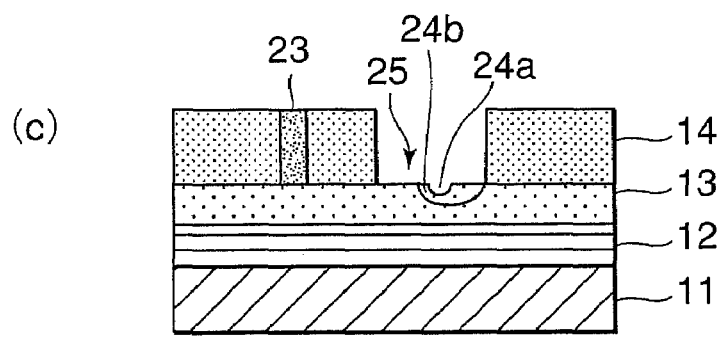
Figure 1:
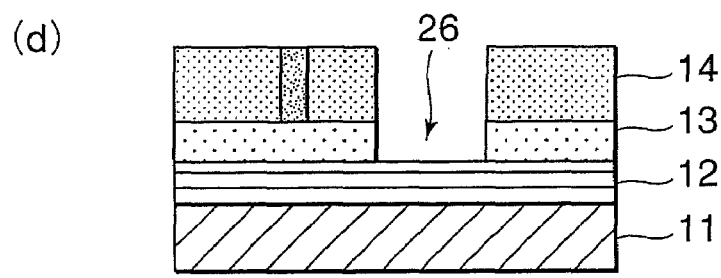
Figure 1:
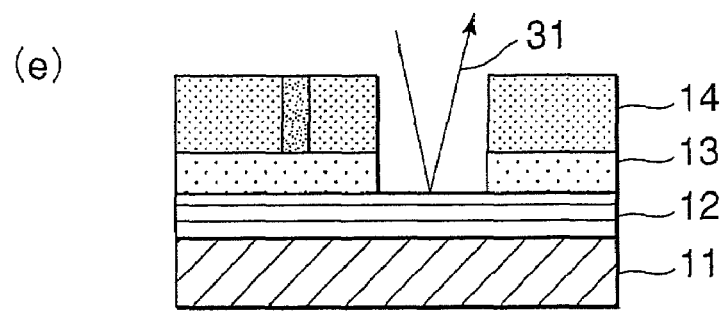

Now, a first embodiment of this invention will be described in detail with reference to the drawing.

Figure 2:
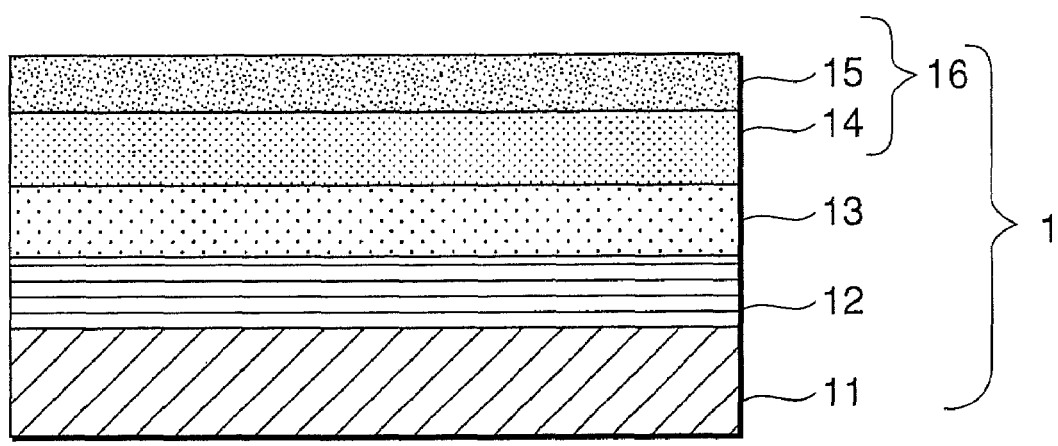
FIG. 2 is a schematic sectional view of a mask blank according to a first embodiment of this invention.
Figure 3:
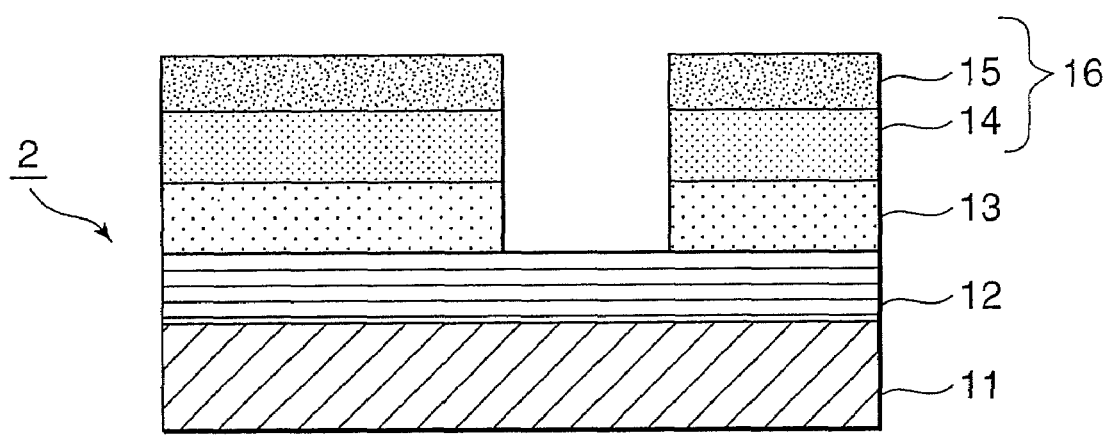
FIG. 3 is a schematic sectional view of a reflective mask formed by using the mask blank in FIG. 2.
Figure 4:
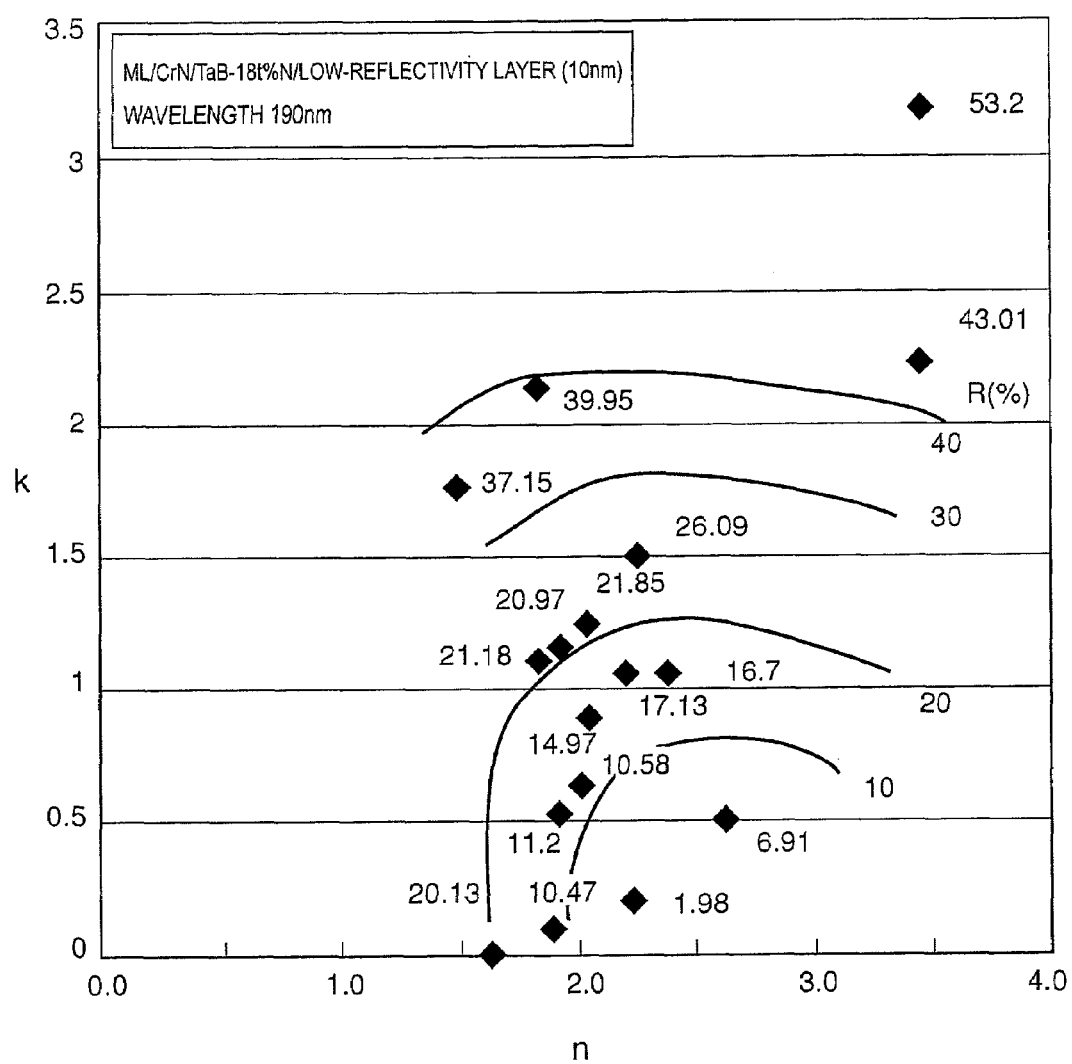
FIG. 4 is a view for describing this invention, in which a reflectivity R at an inspection wavelength of 190 nm in case where a low-reflectivity layer is formed to a thickness of 10 nm by the use of materials having various values of a refractive index n and an extinction coefficient k is plotted on axes n and k.
Figure 5:
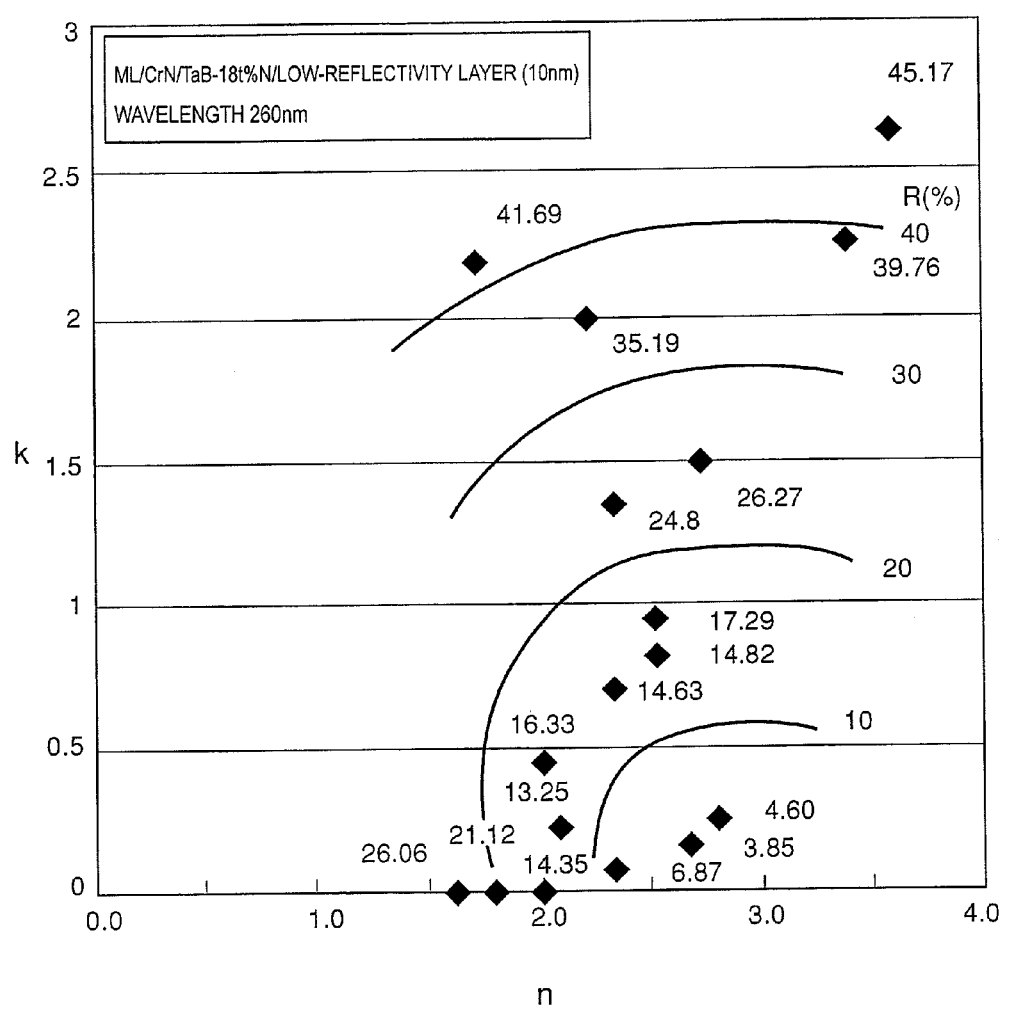
FIG. 5 is a view for describing this invention, in which a reflectivity R at an inspection wavelength of 260 nm in case where a low-reflectivity layer is formed to a thickness of 10 nm by the use of materials having various values of a refractive index n and an extinction coefficient k is plotted on axes n and k.
Figure 6:
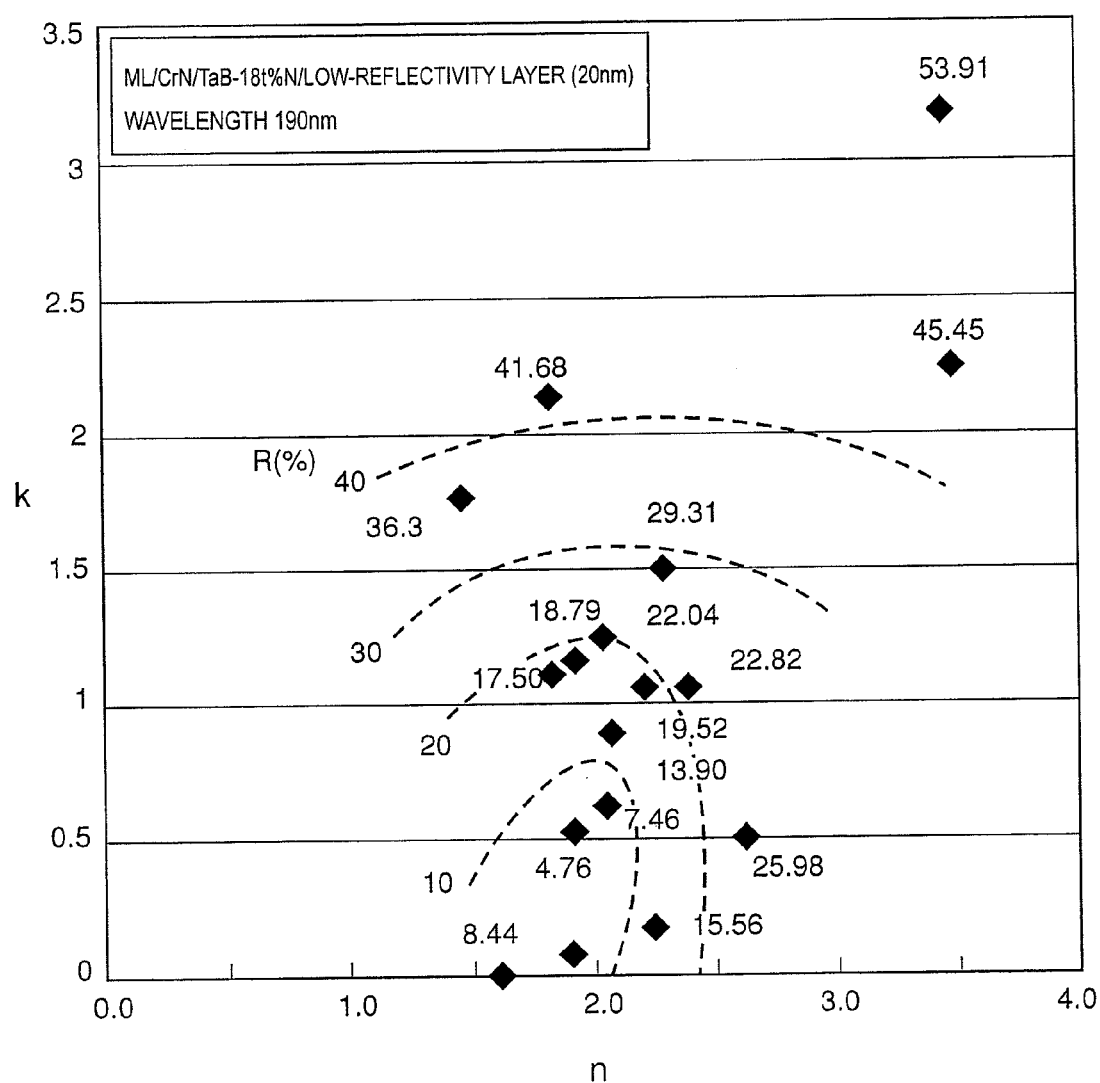
FIG. 6 is a view for describing this invention, in which a reflectivity R at an inspection wavelength of 190 nm in case where a low-reflectivity layer is formed to a thickness of 20 nm by the use of materials having various values of a refractive index n and an extinction coefficient k is plotted on axes n and k.
Figure 7:
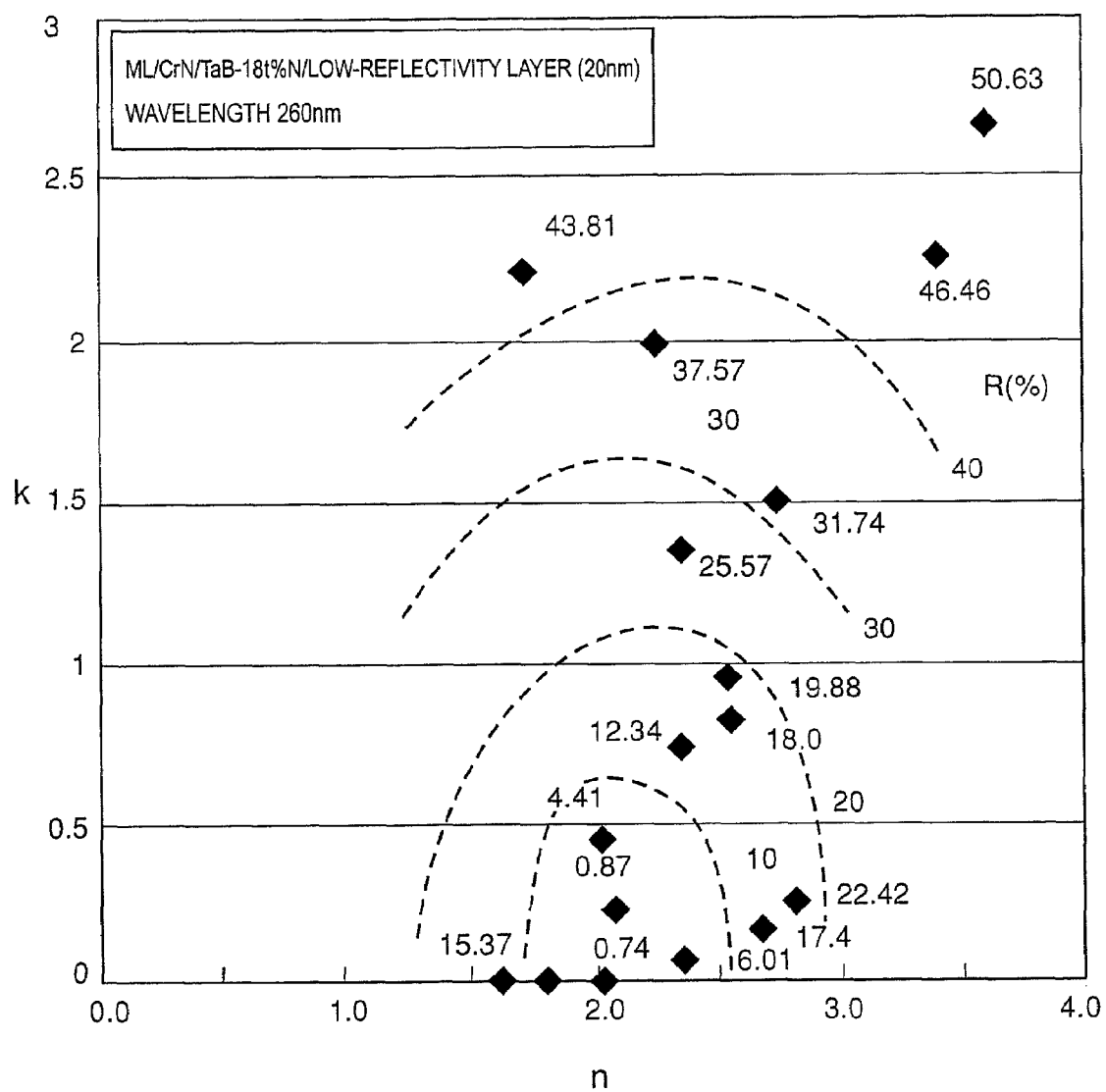
FIG. 7 is a view for describing this invention, in which a reflectivity R at an inspection wavelength of 260 nm in case where a low-reflectivity layer is formed to a thickness of 20 nm by the use of materials having various values of a refractive index n and an extinction coefficient k is plotted on axes n and k.

FIG. 2 is a schematic sectional view of a mask blank according to the first embodiment of this invention and FIG. 3 is a schematic sectional view of a reflective mask formed by using the mask blank in FIG. 2.

The mask blank according to the first embodiment of this invention has a structure illustrated in FIG. 2. Specifically, the mask blank 1 comprises a substrate 11 on which a reflective layer 12 for reflecting exposure light in a short-wavelength region including an EUV region, a buffer layer 13 for protecting the reflective layer 12 during formation of a mask pattern, and an absorber layer 16 for absorbing the exposure light are successively formed. In this embodiment, the absorber layer 16 has a two-layer structure comprising as a lower layer an exposure light absorbing layer 14 formed by an absorber for the exposure light in the short-wavelength region including the EUV region and as an upper layer a low-reflectivity layer 15 for inspection light used in inspection of the mask pattern.

As shown in FIG. 3, a reflective mask 2 in this invention is obtained by patterning at least the absorber layer 16, i.e., the low-reflectivity layer 15 and the exposure light absorbing layer 14, in the mask blank 1.

In the reflective mask in this invention, the absorber layer has a laminate structure in which the absorber layer on a the surface of the mask is functionally separated into a layer for absorbing the exposure light and a layer having a low reflectivity for a mask pattern inspection wavelength. Thus, a sufficient contrast during inspection of the mask pattern is obtained.

The reflective mask in this invention makes it possible to transfer a fine pattern beyond a transfer limit by the known photolithography. Therefore, the reflective mask may be used in lithography using light in the short-wavelength region including the EUV region and may be used as a reflective mask for the EUV light.

Next, description will be made of a structure of each layer.

Generally, a quartz glass or a silicon wafer optically polished appropriately is used as the substrate 11. The size and the thickness of the substrate 11 are appropriately determined depending upon designed values of the mask and may have any desired values in this invention.

The exposure light reflective layer 12 is formed by a material reflecting the exposure light in the short-wavelength region including the EUV region. As a matter of course, it is particularly preferable to form the reflective layer by a material having an extremely high reflectivity for the light in the short-wavelength region such as EUV light because a contrast when used as a reflective mask is enhanced. For example, as the reflective layer for the EUV light having a wavelength of about 12-14 nm in a soft X-ray region, a periodic laminate film comprising thin films of silicon (Si) and molybdenum (Mo) alternately laminated. Typically, these thin films (having a thickness on the order of several nanometers) are laminated in 40-50 periods (the number of pairs of layers) to form a multilayer film. The multilayer film is deposited, for example, by ion beam sputtering or magnetron sputtering.

As described above, the buffer layer 13 is formed in order to protect the reflective layer 12 as an underlying layer from being damaged by etching when the mask pattern is formed on the absorber layer 16 for the exposure light on a surface as described above.

Therefore, as a material of the buffer layer 13, selection is made of a substance which is hardly affected by etching of the absorber layer 16 on the surface of the mask, i.e., which is lower in etching rate than the absorber layer 16 and is hardly subjected to an etching damage and which can be removed later by etching. For example, substances such as Cr, Al, Ru, Ta, nitride thereof, $SiO_2$, $Si_3N_4$, and $Al_2O_3$ are preferable. From these substances, an appropriate substance is selected taking into account the material of the absorber layer 16 and the etching technique. The buffer layer 13 must be removable later in the following reason. By removing, after the absorber layer 16 is patterned, the buffer layer 13 in an area where the absorber layer 16 is removed to expose the surface of the reflective layer 12, the reflection characteristic of the reflective mask for the exposure light is improved. Thus, such removal of the buffer layer is desirable. If the above-mentioned substance such as Cr is selected, the buffer layer 13 is given a function as an exposure light absorbing layer because the substance has an absorption characteristic for the EUV light. Correspondingly, the thickness of the absorber layer 16 as an overlying layer can be reduced. It is therefore possible to suppress blurring at an edge portion of the pattern during exposure. Further, a pattern damage is reduced by shortening a processing time for pattern formation. In this case, however, it is essential to remove the buffer layer 13 in the area where the absorber layer 16 is removed by patterning.

It is desired that the thickness of the buffer layer 13 is small. This is because, if the thickness of the buffer layer 13 is large, a difference in height between the surface of the reflective layer 12 and the surface of the absorber layer 16 is increased as is obvious from FIG. 3. In this event, there arises a disadvantage that the edge portion of the mask pattern blurs in relation to an optical path of EUV exposure with an incident angle of about 5 degrees. Further, also in case where the buffer layer 13 is later removed by etching, a reduced thickness is desirable because the processing time can be shortened. Therefore, the thickness of the buffer layer 13 is 100 nm or less, preferably 80 nm or less.

The buffer layer 13 may be deposited by a well-known deposition technique, such as magnetron sputtering and ion beam sputtering, like in case of the reflective layer 12.

The buffer layer is provided if necessary. Depending upon the method and the condition of pattern formation onto the absorber, the absorber layer may be formed directly on the reflective layer.

As already described, the absorber layer 16 has at two-layer structure including as the lower layer the exposure light absorbing layer 14 comprising the absorber for the exposure light in the short-wavelength region including the EUV region and as the upper layer the low-reflectivity layer 15 for the inspection light used in inspection of the mask pattern. In this invention, the absorber layer 16 has a laminated structure in which the absorber layer is functionally separated into the exposure light absorbing layer and the low-reflectivity layer for the inspection light.

The exposure light absorbing layer 14 as the lower layer is made of a material absorbing light in the short-wavelength region, such as EUV. Preferably, such exposure light absorber is made of at least one substance selected from a lower layer substance group including one element selected from an element group including, for example, chromium, manganese, cobalt, copper, zinc, gallium, germanium, molybdenum, palladium, silver, cadmium, tin, antimony, tellurium, iodine, hafnium, tantalum, tungsten, titanium, and gold, a substance containing at least one of nitrogen and oxygen and the above-mentioned one element selected, an alloy containing one element selected from the element group, and a substance containing at least one of nitrogen and oxygen and the above-mentioned alloy.

For example, in case of tantalum, use may be made of a tantalum element (Ta), tantalum nitride (TaN), tantalum oxide (TaO), tantalum silicon alloy (TaSi), tantalum silicon nitride (TaSiN), tantalum boron alloy (TaB), tantalum boron nitride (TaBN), tantalum germanium alloy (TaGe), and tantalum germanium nitride (TaGeN).

As minimum characteristics required for the inspection light low-reflectivity layer 15 as the upper layer, it is essential to exhibit low reflection for the mask pattern inspection wavelength, to allow pattern formation, not to be etched when the buffer layer is etched off (to have an etch selectivity with respect to the buffer layer). Further, to have an EUV light absorbing function is more preferable because the total thickness of the absorber layer 16 can be reduced.

The inspection of the mask pattern is generally carried out by the use of deep ultraviolet light having a wavelength on the order of 190-260 nm, for example, light having a wavelength of 257 nm mentioned above or 193 nm. As a material having a low reflectivity for such inspection light wavelength, use may be made of, for example, nitride, oxide, or oxynitride of the substance forming the exposure light absorber, a material containing silicon in addition thereto, or silicon oxynitride.

As the material of the low-reflectivity layer, nitride has an effect of lowering the reflectivity at the inspection wavelength and, in case of a polycrystalline film, has an effect of reducing a crystal grain size to improve smoothness. Oxide has a greater effect of lowering the reflectivity at the inspection wavelength than that of nitride. Silicide has a less effect of lowering the reflectivity at the inspection wavelength but has an effect of widening a wavelength region over which the reflectivity is lowered. Thus, nitride or oxide provides a curve having a minimum value of reflectivity at a specific wavelength portion. If silicon is added to those substances, a low reflectivity is obtained in a wider wavelength range (see FIGS. 10 and 11 in Example 1-1 and Example 1-2 which will later be described). When the low reflectivity is obtained in a wider wavelength range, it is possible to flexibly accommodate the change in inspection wavelength. Further, the change in reflectivity is small even if the minimum value is shifted due to the change in thickness of the uppermost layer. Therefore, an allowance value for deviation from a designed thickness is increased so that a constraint imposed upon production is relaxed.

Therefore, as the material of the low-reflectivity layer, nitrogen or oxygen must be contained in a compound. As described above, the low-reflectivity layer preferably comprises at least one substance selected from an upper layer substance group including nitride, oxide, or oxynitride of a substance forming the exposure light absorber, a substance containing one of nitride, oxide, and oxynitride and silicon, and silicon oxynitride.

Boride does not much contribute to the reflectivity but is involved in amorphization of a film to contribute to the smoothness of the film. Therefore, by containing boron into the compound, the smoothness of the film of the low-reflectivity layer is improved.

Herein, specific examples of the material of the low-reflectivity layer will be given: oxide, nitride, or oxynitride of a metal used as the exposure light absorbing layer as the lower layer, oxide, nitride, or oxynitride of an alloy of boron and the metal used as the exposure light absorbing layer as the lower layer, oxide, nitride, or oxinitride of an alloy of silicon and the metal used as the exposure light absorbing layer as the lower layer, oxide, nitride, or oxynitride of an alloy of silicon, boron, and the metal used as the exposure light absorbing layer as the lower layer, and so on. For example, if tantalum is used as the metal of the exposure light absorber, use may be made of tantalum oxide (TaO), tantalum nitride (TaN), tantalum oxynitride (TaNO), tantalum boron oxide (TaBO), tantalum boron nitride (TaBN), tantalum boron oxynitride (TaBNO), tantalum silicon oxide (TaSiO), tantalum silicon nitride (TaSiN), tantalum silicon oxynitride (TaSION), tantalum silicon boron oxide (TaSiBO), tantalum silicon boron nitride (TaSiBN), tantalum silicon boron oxynitride (TaSiBNO), tantalum germanium nitride (TaGeN), tantalum germanium oxide (TaGeO), tantalum germanium oxynitride (TaGeNO), tantalum germanium silicon nitride (TaGeSiN), tantalum germanium silicon oxide (TaGeSiO), tantalum germanium silicon oxynitride (TaGeSiNO), and so on.

When the thickness of the low-reflectivity layer is changed, a position of the minimum value of the reflectivity curve is shifted. For example, in case of a tantalum-based material such as TaO or TaSiON or a molybdenum-based material, the position is shifted towards a longer wavelength if the thickness is increased. Therefore, by changing the thickness of the low-reflectivity layer, the reflectivity at a specific wavelength is changed. Accordingly, it is possible to control the reflectivity by adjusting the thickness to some extent so that the reflectivity at the inspection wavelength is minimum. However, since an excessively large thickness of the low-reflectivity layer is not preferable as will later be described, the thickness is adjusted within a range between 5 and 30 nm, preferably between 10 and 20 nm. By changing the composition ratio of the material of the low-reflectivity layer, for example, the composition ratio between a metal and oxygen or nitrogen, the reflectivity is changed. Generally, when the composition ratio of oxygen or nitrogen is increased, the reflectivity is lowered and the absorptivity for the EUV light tends to be lowered.

Comparing nitride and oxide, there is a tendency that oxide has a greater effect of lowering the reflectivity as described above. Therefore, as the material of the low-reflectivity layer, a material containing a metal, oxygen, and silicon (for example, a material containing a metal, oxygen, and silicon as main components, a material containing a metal, silicon, oxygen, and nitrogen as main components, and so on) is most preferable in view of a low reflectivity and a wide wavelength range over which the reflectivity is lowered. Herein, it is further preferable to use a metal element used as the exposure light absorber because the low-reflectivity layer has an EUV light absorption function.

Although the wavelength region over which the reflectivity is lowered is slightly narrower, oxide without containing silicon provides a low reflectivity in a specific wavelength region. Depending upon the material, mere inclusion of nitrogen may not provide a sufficient reduction in reflectivity but, as compared with a metal element, nitride thereof is lowered in reflectivity. Further, addition of nitrogen provides an effect of improving the smoothness of the film as described above. If the smoothness of the film is poor, edge roughness of the pattern is increased and the dimensional accuracy of the mask is degraded. Therefore, the film is desirably as smooth as possible.

As the material of the low-reflectivity layer, use may be made of a material which does not contain a metal but comprises, for example, silicon, nitrogen, and oxygen (silicon oxynitride). In this case, however, the effect of absorbing the EUV light in the low-reflectivity layer is small.

For example, if the low-reflectivity layer comprises a material containing a metal, Si, N, and O, a composition ratio for obtaining a low reflectivity at the deep ultraviolet light of about 190-260 nm as the inspection wavelength is preferably 20-25 at % metal such as tantalum, molybdenum, or chromium, 17-23% Si, 15-20% N, and the balance O. The ratio of Si and O is preferably 1:1.5 to 1:2.

In order to obtain a smooth surface of the absorbing layer, the low-reflectivity layer preferably comprises a film having an amorphous structure. For example, in case of Ta, amorphization is achieved by inclusion of an appropriate amount of B.

Addition of Si or Ge to Ta also provides the film having the amorphous structure and is therefore preferable.

For example, in case where the low-reflectivity layer comprises tantalum boron nitride (TaBN), the content of N is preferably 30-70 at %, more preferably 40-60 at % as the composition ratio for obtaining the low reflectivity at the above-mentioned inspection wavelength. If the content of N is small, a sufficient low-reflection characteristic can not be obtained. On the contrary, if the content is excessively large, acid resistance is degraded. Further, if both of the low-reflectivity layer and the absorbing layer under the low-reflectivity layer comprise the tantalum boron nitride, the content of N in the low-reflectivity layer is 30-70 at %, preferably 40-60 at % while the content of N in the exposure light absorbing layer is 0-25 at %, preferably 5-20 at %. A smaller content of N in the absorbing layer is not preferable in view of the surface roughness. On the contrary, a greater content lowers the absorption coefficient for the EUV light.

In case of the TaBN film, the content of B is 5-30 at %, preferably 5-25 at %. The ratio of Ta and N is preferably 8:1 to 2:7.

In case where the low-reflectivity layer comprises tantalum boron oxide (TaBO), the content of O is 30-70 at %, preferably 40-60 at %. If the content of O is small, the low-reflection characteristic can not be obtained. On the contrary, if the content is great, insulation is increased so that charge-up occurs by electron beam irradiation. In case where the low-reflectivity layer comprises tantalum boron oxynitride (TaBNO), it is preferable that the content of N is 5-70 at % and the content of O is 5-70 at %.

In case of the TaBO film, it is preferable that the content of B is 5-25 at % and the ratio of Ta and O falls within a range of 7:2 to 1:2. In case of the TaBNO film, it is preferable that the content of B is 5-25 at % and the ratio of Ta and N+O, i.e., Ta:(N+O) falls within a range of 7:2 to 2:7.

In each of the above-mentioned substances containing boron, the ratio of B is preferably 5-30%, more preferably 5-25%, in order to form the amorphous structure.

In the meanwhile, description will be made of a combination of materials of the exposure light absorbing layer 14 as the lower layer and the low-reflectivity layer 15 as the upper layer. Preferably, a metal used in the exposure light absorbing layer 14 is contained in the low-reflectivity layer 15. For example, if a material containing tantalum is used as the exposure light absorbing layer, the low-reflectivity layer is also made of a material containing tantalum. Specifically, as the exposure light absorbing layer, a material containing tantalum, for example, one substance selected from a Ta element, TaN, TaB, TaBN, TaBO, and TaBNO may be used. As the low-reflectivity layer, a material containing tantalum and nitrogen or oxygen, for example, one substance selected from TaO, TaBO, TaBNO, TaNO, TaSiO, and TaSION may be used. Thus, the low-reflectivity layer using a metal same as that of the exposure light absorbing layer provides various advantages. Specifically, since a metal having an EUV light absorption function is contained, the low-reflectivity layer has the EUV light absorption function to some extent. Since materials high in etch selectivity are selected as the buffer layer and the exposure light absorbing layer, the etch selectivity is basically large also between the buffer layer and the low-reflectivity layer. The exposure light absorbing layer and the low-reflectivity layer can be deposited in a same deposition chamber. The exposure light absorbing layer and the low-reflectivity layer can be patterned under the same etching condition.

It is more preferable to use a film having an amorphous structure or a fine crystalline structure as the material of the lower layer because the film excellent in smoothness is obtained.

As to the reflectivity, by obtaining the relationship between the composition of the material of the low-reflectivity layer and the reflectivity on the surface of the absorbing layer and the relationship between the thickness and the reflectivity, it is possible to determine the composition and the thickness with which the low reflectivity is obtained at the inspection wavelength used.

In the reflective mask and the reflective mask blank according to this invention, the surface roughness of the surface of the absorber layer is preferably 0.5 nmRms or less, more preferably 0.4 nmRms or less, further preferably 0.3 nmRms or less. If the surface roughness of the surface of the absorber layer is large, the edge roughness of the absorber pattern is increased and the dimensional accuracy of the pattern is degraded. As the pattern is finer, the influence of the edge roughness is remarkable and, therefore, the surface of the absorber layer is required to be smooth.

In order to reduce the surface roughness at the surface of the absorber, it is effective that the upper layer of the absorber layer (i.e., the low-reflectivity layer) comprises a film having an amorphous structure. It is further preferable that the lower layer of the absorber layer also comprises a film having an amorphous structure or a fine crystalline structure and excellent in smoothness. In case where the buffer layer is provided, it is necessary to use a smooth film as the buffer layer.

Next, description will be made of a combination of the materials of the exposure light absorbing layer 14, the low-reflectivity layer 15, and the buffer layer 13. In this invention, it is preferable that each of the exposure light absorbing layer 14 and the low-reflectivity layer 15 is made of a material containing tantalum and the buffer layer 13 is made of a material containing chromium. By the use of the chromium-based material as the buffer layer, various advantages are achieved. Specifically, the buffer layer is given the EUV light absorption function as described above. Since the reflectivity for the inspection light in the deep ultraviolet region is about 40%, it is easy to design the reflectivity so that the reflectivity for the inspection wavelength is lowered successively from the surface of the multilayer reflective film, the surface of the buffer layer, and the surface of the absorber layer. The etch selectivity with the absorber layer containing tantalum is large. Further, when the buffer layer is removed, almost no damage is given to the multilayer reflective film.

As the material containing chromium used as the buffer layer, use is preferably made of, in addition to a Cr element, a material containing Cr and at least one element selected from N, O, and C. For example, use may be made of chromium nitride (CrN), chromium oxide (CrO), chromium carbide (CrC), chromium oxynitride (CrNO), and chromium carboxynitride (CrCNO).

For example, in case of chromium nitride (CrN), a preferable composition ratio of chromium and nitride is given by $Cr_{1-X}N_X$ where $0.05 \leq X \leq 0.5$, more preferably $0.05 \leq X \leq 0.2$. X smaller than 0.05 is not preferable in view of the acid resistance, the film stress, and the surface roughness. If X is greater than 0.5, the reflectivity for the inspection light is excessively lowered so that the contrast with the surface of the absorber layer is not sufficiently large. Further, a small amount of, for example, about 5% of oxygen, carbon, or the like may be added to chromium nitride. A CrN film having a fine crystalline structure is preferable because of an excellent smoothness.

Preferably, the total thickness of the absorber layer 16 comprising the exposure light absorbing layer 14 as the lower layer and the inspection light low-reflectivity layer 15 as the upper layer is small. This is because the etching process time upon patterning the absorber layer 16 is proportional to the thickness. In the etching process, the surface of the resist pattern is damaged in correspondence to the etching process time proportional to the thickness of the absorber layer 16. This brings about easy occurrence of nonuniform etching distribution within the plate resulting in an increase of mask pattern defects due to an increase in frequency of occurrence of white defects and black defects. Further, there arises serious problems such as reduction in mass producibility because a long time is required to repair those defects, and a resultant increase in cost. Further, if the total thickness of the absorber layer 16 is large, the difference in height between the surface of the reflective layer 12 and the surface of the absorber layer 16 is increased, like in the above-mentioned case where the thickness of the buffer layer 13 is large. In this event, there arises a disadvantage that an edge portion of the mask pattern blurs during exposure.

Thus, the total thickness of the absorber layer 16 is 100 nm or less, preferably 80 nm or less, more preferably 60 nm or less. However, if the thickness of the absorber layer 16 is excessively small, the exposure light absorption characteristic is degraded. Therefore, the thickness is preferably 35 nm or more at minimum.

In the absorber layer 16, the thickness of the low-reflectivity layer 15 as the upper layer is desirably smaller than the thickness of the exposure light absorbing layer 14 as the lower layer. If the thickness of the low-reflectivity layer 15 as the upper layer is excessively large, the EUV light absorption characteristic of the absorber layer 16 as a whole may be degraded. Therefore, the thickness of the low-reflectivity layer 15 as the upper layer is preferably about 5-30 nm while the thickness of the exposure light absorbing layer 14 as the lower layer is preferably about 30-60 nm. As described above, the absorber layer 16 has a laminated structure but can be suppressed to the thickness substantially equivalent to that of the existing single layer structure. Further, by providing the buffer layer 13 with the function as the exposure light absorbing layer, it is possible to correspondingly reduce the thickness of the exposure light absorbing layer 14 as the upper layer even if the absorption characteristic thereof is degraded.

A preferable range of the total thickness of the buffer layer 13 and the absorber layer 16 is 60 nm to 130 nm. Although depending upon the material, if the total thickness is less than 60 nm, a sufficient EUV light absorption characteristic may not be obtained. If the total thickness is greater than 130 nm, the problem of shadow of the pattern itself is increased.

Each of the exposure light absorbing layer 14 and the low-reflectivity layer 15 may be deposited by the use of a known deposition technique, such as magnetron sputtering, ion beam sputtering, CVD, and vapor deposition, like the reflective layer 12 and the buffer layer 13 described above.

In the meanwhile, the reflectivity for the wavelength of the pattern inspection light is preferably designed so that the reflectivity is lowered in the order of the surface of the exposure light reflective layer, the surface of the buffer layer, and the surface of the low-reflectivity layer. The reason is as follows. In each of the inspection between the surface of the buffer layer and the surface of the low-reflectivity layer after pattern formation and the inspection between the surface of the exposure light reflective layer and the low-reflectivity layer after removal of the buffer layer, a portion where the pattern is present is dark without reversal of pattern contrast. Therefore, setting of the inspection apparatus need not be changed and the result is easily recognized. In case of the Mo/Si multilayer film used as the exposure light reflective layer, the reflectivity is as high as about 60%. Therefore, in order to assure a sufficient contrast with the respective layers, it is advantageous to lower the reflectivity of the other layers.

Next, description will be made of a relationship between the values of the refractive index n and the extinction coefficient k of the material of the low-reflectivity layer 15 and the reflectivity for the inspection wavelength.

Referring to FIGS. 4, 5, 6, and 7, chromium nitride is used as the buffer layer (50 nm), tantalum boron nitride (TaBN) (the content of N being about 18%) is deposited to 50 nm as the exposure light absorbing layer, and each of materials having different values of the refractive index n and the extinction coefficient k is deposited thereon to a thickness of 10 nm or 20 nm as the low-reflectivity layer. The reflectivity R for each of the inspection wavelengths of 190 nm and 260 nm is plotted on axes n and k. From the result, it is understood that the low reflectivity is obtained by the use of a material satisfying n and k within specific ranges.

Specifically, the relationship among the inspection wavelength, the thickness, and preferable ranges of n and k is as follows.

(1) Comparing the cases where the thickness is 10 nm and 20 nm, the reflectivity is 10% or less in either case if the extinction coefficient k is about 0.7 or less. If the reflectivity is allowed to be 20% or less, k is 1.2 or less. In this event, a preferable range of the refractive index n is slightly different between the cases where the thickness is 10 nm and 20 nm. In case of the thickness of 20 nm, the reflectivity R is 10% or less when n is about 1.5 to 2.5. If the reflectivity is allowed to be 20% or less, n is about 1 to 3. In case of the thickness of 10 nm, the reflectivity R is 10% or less when n is 2.0 to 3.5. If the reflectivity is 20% or less, n is about 1.5 to 4.0.

(2) Comparing the cases where the inspection wavelength is 190 nm and 260 nm, there is no considerable difference. In case of 260 nm, a preferable range of n tends to be slightly shifted towards a greater value.

(3) Considering the above in total, it is understood that, in case where the thickness is 10 to 20 nm, the reflectivity of 10% or less is obtained within the deep ultraviolet region by selecting a material having the extinction coefficient k of 0.7 or less and the refractive index n of 1.5 to 3.5.

The absorber layer 16 may have a so-called laminated structure such as a two-layer structure in this embodiment or a structure in which nitrogen or oxygen has a predetermined distribution through the absorber layer 16 from the side adjacent to the buffer layer 13 towards the surface of the absorber layer. In this case, by increasing the amount of nitrogen or oxygen towards the surface of the absorber layer, the reflectivity on the surface of the absorber layer 16 for the inspection wavelength can be decreased. The distribution of composition of nitrogen or oxygen in a thickness direction of the absorber layer may be continuously changed linearly or in a curved line or may be changed stepwise. The distribution of composition of nitrogen or oxygen in the thickness direction of the absorber layer can be achieved by controlling the amount of each element which is added during deposition. For example, in case of the TaBN film, sputtering is carried out by the use of a target containing Ta and B. During the sputtering, deposition is carried out while changing the amount of a nitrogen gas added. In this manner, continuous or stepwise distribution of composition of nitrogen can be obtained in the thickness direction of the absorber layer 16.

Further, the reflective mask blank and the reflective mask of this invention may have an intermediate region formed between the lower layer and the upper layer of the absorber layer and continuously varied in composition from the composition of the lower layer towards the composition of the upper layer.

The intermediate region is a transition region in which the element contained in the lower layer and the element contained in the upper layer are mixed.

By providing the intermediate region, a pattern having a smooth sectional structure is obtained without a boundary formed between the upper and the lower layers when the absorber layer is patterned.

It is preferable that the metal elements contained in the upper and the lower layers are same because the absorber layer can be continuously patterned. In addition, there is another advantage that the adhesiveness of the upper and the lower layers is improved.

The intermediate region must have a thickness of about 2 to 15 nm.

Figure 8:
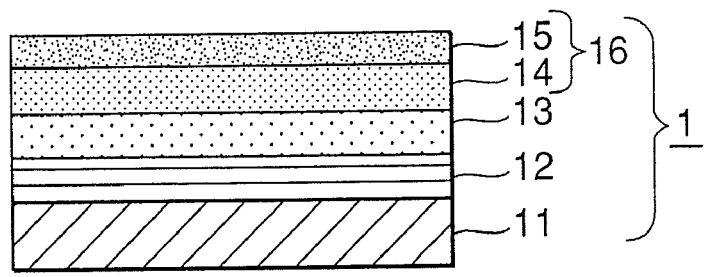
FIG. 8 shows schematic sectional views illustrating a production process of the reflective mask in FIG. 3.
Figure 8:
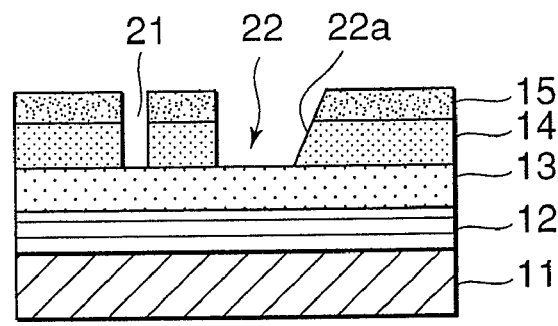
Figure 8:
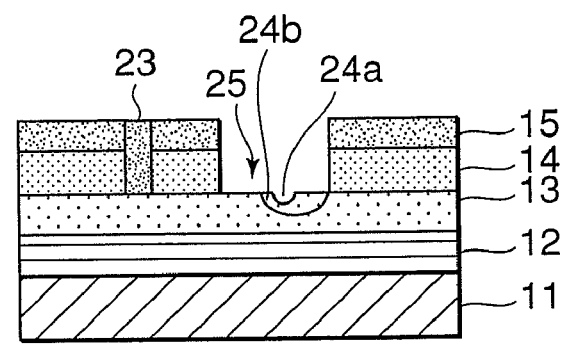
Figure 8:
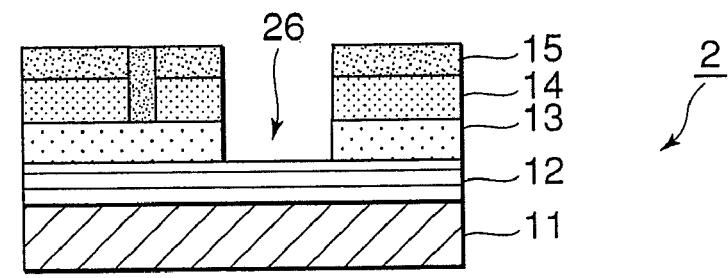
Figure 8:
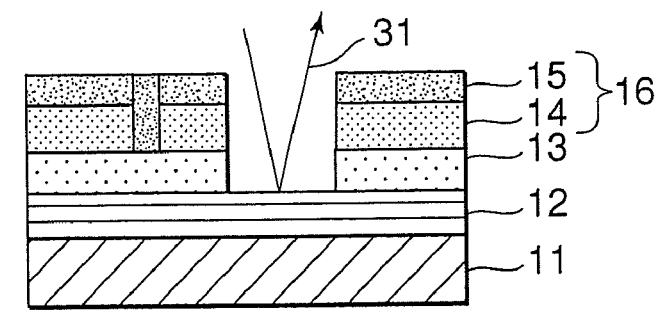

Next referring to FIG. 8, description will be made of a method of producing a reflective mask according to this invention. FIG. 8 shows schematic sectional view illustrating a production process of the reflective mask according to this invention.

FIG. 8(a) shows the structure of the mask blank 1. The structure has already been described. The mask blank 1 is formed by successively depositing, on the substrate 11, the exposure light reflective layer 12, the buffer layer 13, the exposure light absorbing layer 14, and the inspection light low-reflectivity layer 15 in this order.

Herein, use may be made of a method of at first depositing the exposure light absorbing layer 14 on the buffer layer 13 and then depositing the inspection light low-reflectivity layer 15 thereon. Depending upon the material of the low-reflectivity layer, for example, in case where the low-reflectivity layer 15 as the upper layer is made of oxide of a same metal as that used in the exposure light absorbing layer 14 as the lower layer, it is possible to form the inspection light low-reflectivity layer 15 at an uppermost surface by forming the exposure light absorbing layer 14 on the buffer layer 13 and thereafter treating the surface of the exposure light absorbing layer 14 by oxidization using a process gas containing oxygen or oxidization using an acid solution. With the latter method, it is possible to reduce a time required for changing a deposition condition, to reduce the number of kinds of materials, and to reduce the number of deposition chambers. Thus, the work is simplified and the working time is shortened.

Preferably, the low-reflectivity layer as the upper layer and the lower layer are continuously formed in the same deposition chamber. In this manner, it is possible to prevent adsorption of impurities and foreign matters to the surface of the lower layer and deterioration (oxidation) of the surface from occurring between the lower and the upper layers and to obtain an excellent interface between the lower and the upper layers.

Upon occurrence of adsorption of impurities or deterioration at the interface between the upper and the lower layers, a stress of the absorber layer may be changed and optical characteristics, such as an inspection light reflectivity, may be affected. Therefore, parameters at the interface must be taken into consideration and designed characteristics can not be obtained. Thus, a reproducibility or a controllability is degraded.

On the other hand, if the lower and the upper layers are continuously formed in the same deposition chamber, the substrate is not taken out from the deposition chamber and is not left unprocessed. Accordingly, an excellent interface is obtained without adsorption of impurities to the interface and deterioration. It is therefore possible to form the absorber layer with excellent reproducibility and excellent controllability. There is another advantage that the deposition process is not complicated.

Continuous formation of the upper and the lower layers in the same deposition chamber is particularly effective in case where the upper and the lower layers contain metal elements and these metal elements are same. This is because deposition can continuously be carried out by using a common source of the metal element and changing a gas supplied during deposition.

For example, in case where reactive sputtering is used, continuous deposition is easily carried out by using a target containing a metal element common to the upper and the lower layers and changing the content of a gas (nitrogen, oxygen, or the like) supplied.

For example, in case where a material containing Ta is used as the upper and the lower layers, a target containing Ta is used in common. The content and the species of a gas (oxygen, nitrogen, or the like) introduced for reduction in reflectivity are changed between the formation of the lower layer and the formation of the upper layer.

By continuous deposition in the same deposition chamber, it is easy to intentionally introduce, between the upper and the lower layers, the above-mentioned intermediate region where the composition is continuously changed.

Specifically, the deposition condition is continuously changed from the deposition condition of the lower layer to the deposition condition of the upper layer. If the same metal element is contained in the lower and the upper layers in common, a metal element source such as a target is used in common and the flow rate of an introduced gas such as oxygen or nitrogen is changed. Between the formation of the lower layer and the formation of the upper layer, the flow rate of the gas used in the formation of the lower layer is reduced or the flow is stopped while the introduced amount of the gas used in the formation of the upper layer is increased or introduction is started with the gas flow rate continuously changed. Thus, by carrying out deposition in the state where the gases used in the formation of the both layers are coexistent, the intermediate region is easily formed.

Next, by processing the absorber layer 16 comprising the exposure light absorbing layer 14 as the EUV light absorber and the inspection light low-reflectivity layer 15, an absorber pattern having a predetermined pattern is formed (patterning step, see FIG. 8(b)). Generally, a resist pattern having a predetermined pattern is formed on the surface of the absorber layer 16 by an electron beam writing process. Next, the absorber layer is subjected to an etching process. The etching process may be dry etching or wet etching. Depending upon the material, an appropriate method and an appropriate condition are selected. Finally, the residual resist pattern is removed.

Then, inspection is carried out to confirm whether or not the absorber pattern is formed exactly as designed. As a result of the pattern inspection, if a pinhole defect (may also be called a white defect) 21 resulting from adhesion of foreign matters to the resist layer during pattern formation and an underetching defect (may also be called a black defect) 22 are present, necessary repair is carried out. The pinhole defect 21 is repaired by depositing a carbon film 23 in a pinhole by focused ion beam (FIB) assisted deposition. The underetching defect 22 is repaired by removing a residual part 22a by FIB gas assisted etching to obtain a removed part 25 where the absorber layer 16 having a two-layer structure is removed. By energy of ion irradiation, a damaged part 24 (a part 24a removed by FIB and a part 24b penetrated by FIB ions) is present on the surface of the buffer layer 13 (see FIG. 8(c)).

Next, the buffer layer 13 is removed, for example, by dry etching in an area corresponding to the removed part 25 where the absorber layer 16 is removed (buffer layer removing step). At this time, it is important to determine an etching condition so that etching proceeds in the buffer layer 13 alone without damaging other layers. By forming a pattern 26 on the exposure light reflective layer 12 in the above-mentioned manner, a reflective mask 2 is produced (see FIG. 8(d)).

The reflective mask 2 produced as mentioned above is exposed to EUV light 31. The EUV light 31 is absorbed in an area where the absorber pattern is present on the surface of the mask and reflected by the reflective layer 12 exposed in a remaining area where the absorber layer 16 and the buffer layer 13 are removed (see FIG. 8(a)). Thus, the mask can be used as a mask for the lithography using the EUV light.

As mentioned above, in the reflective mask in this invention, the absorber layer which is a single layer in the existing mask has a laminated structure in which the absorber layer is functionally separated into the exposure light absorbing layer 14 as the lower layer and the inspection light low-reflectivity layer 15 as the upper layer. With this structure, a sufficient exposure light absorbing function is assured and the reflectivity on the surface of the inspection light low-reflectivity layer 15 as the upper layer formed on an uppermost surface is remarkably lowered at the wavelength of the pattern inspection light. Thus, a difference in reflectivity at the wavelength of the pattern inspection light between the surface of the inspection light low-reflectivity layer 15 and the surface of the buffer layer 13 exposed after removing the absorber layer 16 by formation of the mask pattern (see FIG. 8(b)) is increased so that a sufficient contrast upon inspection is obtained. Accordingly, a reflected image pattern having a high contrast is obtained. Therefore, by the use of an existing mask inspection apparatus using light having a wavelength within a deep ultraviolet region, for example, a wavelength of 257 nm, it is possible to carry out accurate and quick inspection of the mask pattern, which has been difficult so far.

The contrast will further be described. For example, the ratio of the reflectivity of the surface of the inspection light low-reflectivity layer 15 and the reflectivity of the surface of the buffer layer 13 is generally usable as an index of magnitude of the contrast. Also, the following definition formula is known. The value of the definition formula may be used as the index of magnitude of the contrast.

Specifically, in case where $R_1$ and $R_2$ represent values of reflectivity at specific wavelengths, respectively, and $R_2$ is greater than $R_1$, $$\text{contrast } (\%) = \{(R_2 - R_1)/(R_2 + R_1)\} \times 100.$$

A sufficient contrast must be obtained in the pattern inspection. As a rough standard, the ratio of reflectivity is preferably 1:3 or less, more preferably 1:4 or less, further preferably 1:10 or less. The contrast value given by the above definition formula is preferably 40% or more, 50% or more, more preferably 60% or more, further preferably 80% or more. The contrast value mentioned herein is a contrast between the absorber layer and the reflective layer or a contrast between the absorber layer and the buffer layer. The reflectivity of the low-reflectivity layer 15 is preferably 20% or less, more preferably 10% or less, further preferably 5% or less.

EXAMPLES

Now, this invention will be described more in detail in conjunction with specific examples. For convenience of description, the reference numerals mentioned in FIGS. 2, 3, and 8 are used as appropriate.

Example 1-1

The respective layers were deposited on the substrate 11 to produce a mask blank. Herein, a low-expansion $SiO_2$—$TiO_2$ glass substrate having an outer dimension of 6 inch square and a thickness of 6.3 mm was used as the substrate 11. The glass substrate was subjected to mechanical polishing to have a smooth surface of 0.12 nmRms (Rms: root mean square roughness) and a flatness of 100 nm or less.

At first, on the substrate 11, a Mo/Si laminate film of molybdenum (Mo) and silicon (Si) was deposited by DC magnetron sputtering as the EUV light reflective layer 12. At first, using a Si target, a Si film was deposited to 4.2 nm under an Ar gas pressure of 0.1 Pa. Then, using a Mo target, a Mo film was deposited to 2.8 nm under an Ar gas pressure of 0.1 Pa. Defining the above-mentioned deposition as one period, 40 periods of deposition was carried out. Finally, a Si film was deposited to 7 nm. The total thickness was 287 nm. The multilayer reflective film thus obtained had a reflectivity of 60% with respect to light having a wavelength of 257 nm.

On the multilayer reflective film, a $SiO_2$ thin film was deposited to a thickness of 50 nm as the buffer layer 13. Specifically, using a Si target, deposition was carried out by DC magnetron sputtering using a mixed gas of argon (Ar) and oxygen ($O_2$). The $SiO_2$ buffer layer had a surface roughness of 0.4 nmRms.

On the buffer layer, a tantalum nitride (TaN) thin film was deposited to a thickness of 50 nm as the exposure light absorbing layer (comprising an EUV light absorber) 14. Specifically, using a Ta target, deposition was carried out by DC magnetron sputtering using a mixed gas of argon and nitrogen ($N_2$). The film had a composition of $Ta_{61}N_{39}$.

Finally, a TaSiON thin film was deposited to a thickness of 20 nm as the low-reflectivity layer 15 for the inspection light having a wavelength of 257 nm. Specifically, using a TaSi alloy target, deposition was carried out by DC magnetron reactive sputtering using a mixed gas of argon, oxygen, and nitrogen. The film had a composition of $Ta_{21}Si_{17}O_{47}N_{15}$. The TaSiON film had a refractive index of 2.09 and an extinction coefficient of 0.24 for light having a wavelength of 260 nm and a refractive index of 2.00 and an extinction coefficient of 0.59 for light having a wavelength of 190 nm. The TaSiON film had an amorphous structure. The surface of the TaSiON film had a surface roughness of 0.4 nmRms.

Next, using the mask blank produced as mentioned above, a predetermined mask pattern was formed thereon. Herein, an EUV mask having a 16 Gbit-DRAM pattern with 0.07 μm design rule was produced. The mask pattern was formed in the following manner. At first, an electron beam resist material was uniformly applied on a surface of the mask blank by a spinner or the like. After pre-baking, electron beam writing and development were carried out to form a resist pattern. Next, dry etching using a chlorine gas was carried out. After completion of the etching, the resist pattern was removed. Thus, the mask pattern was formed on the exposure light absorbing layer 14 and the low-reflectivity layer 15 above the buffer layer 13.

The mask pattern formed as mentioned above was inspected by a mask inspecting apparatus using light having a wavelength of 257 nm. As a result, a pinhole defect (white defect) and an underetching defect (black defect) were confirmed.

Then, those pattern defects were repaired with reference to the inspection result. Specifically, for the above-mentioned white defect, a carbon film was deposited in a pinhole by focused ion beam (FIB) assisted deposition. For the black defect, a residual part was removed by FIB gas assisted etching. By irradiation energy, a damaged part changed in optical characteristics due to change in film structure was present on the surface of the buffer layer 13 (see (b) and (c) in FIG. 8 mentioned above).

Next, a part of the buffer layer 13 exposed in an area without the patterns of the exposure light absorbing layer 14 and the low-reflectivity layer 15 was removed by etching (see (d) in FIG. 8 mentioned above). At this time, the $SiO_2$ buffer layer alone was dry-etched using a fluorine-based gas so that the absorber pattern was not damaged but served as an etching mask. Thus, the reflective mask in this example was produced.

When the EUV light is irradiated onto the mask, the EUV light is reflected by a pattern portion on the surface of the reflective layer 12. Thus, a function as the reflective mask is achieved.

For the purpose of comparison, by the existing process illustrated in FIG. 1, preparation was made of a sample comprising an exposure light absorbing layer (EUV light absorbing layer) as a single layer without the low-reflectivity layer 15 as the uppermost layer in this example. The exposure light absorbing layer (EUV light absorbing layer) as a single layer had a thickness of 70 nm equal to the total thickness of the two layers including the exposure light absorbing layer (EUV light absorbing layer) and the inspection light low-reflectivity layer in this example.

Figure 10:
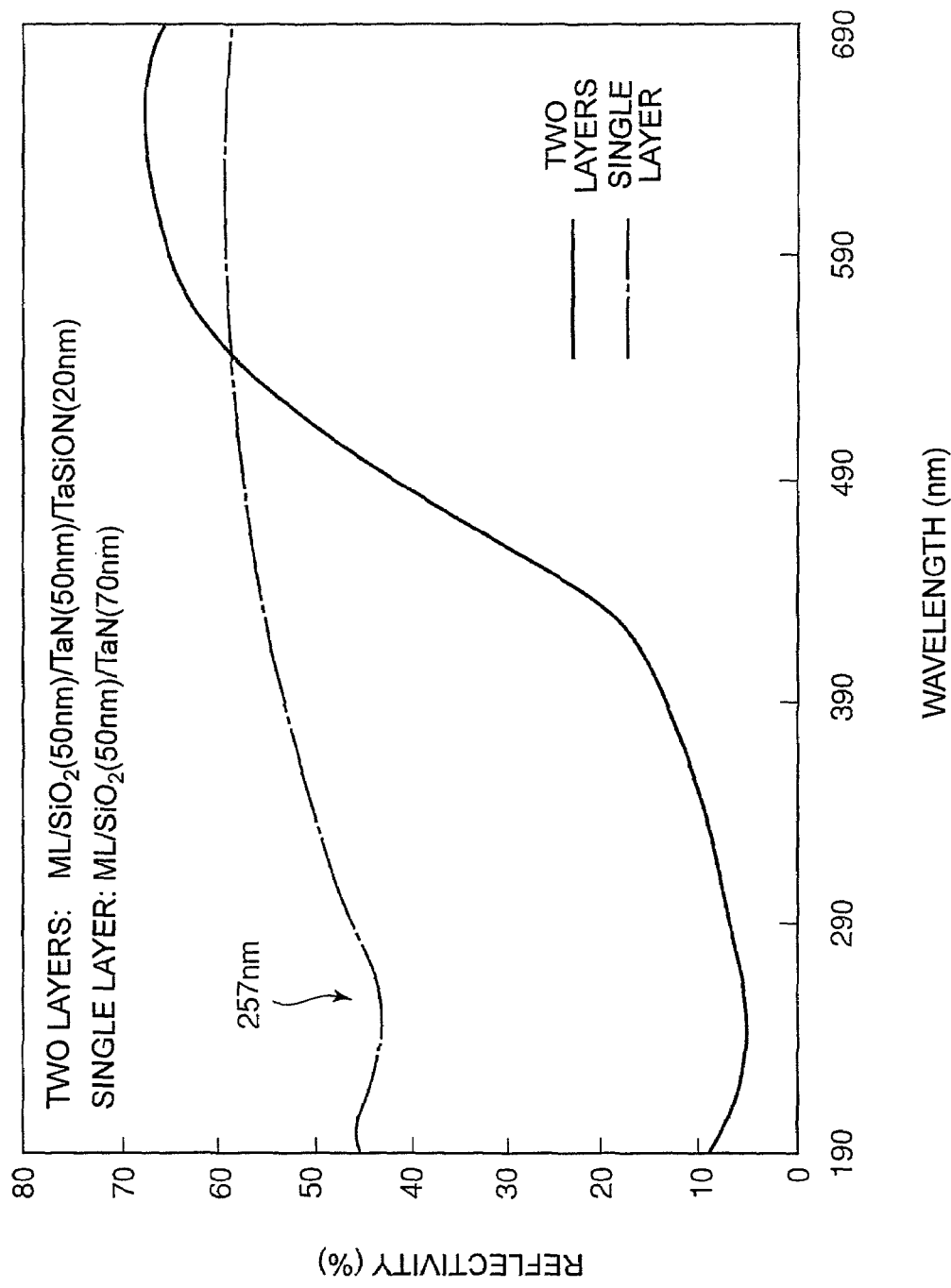
FIG. 10 is a view showing values of the reflectivity for lights having wavelengths from 190 nm to 690 nm in an example 1-1 of this invention and in the existing reflective mask.

FIG. 10 shows the values of reflectivity on the surface of the absorber pattern of the mask with respect to the light having a wavelength within a range from 190 nm to 690 nm. In the figure, the reflectivity on the surface of the two-layer absorber layer of the mask in this example is labeled TWO LAYER while the reflectivity on the surface of the single-layer exposure light absorbing layer (EUV light absorbing layer) of the existing mask is labeled SINGLE LAYER. In the figure, ML represents the EUV light reflective layer. It is understood that, in the mask of this example, a low-reflectivity wavelength region is relatively wide.

From the above-mentioned result, in case where the pattern inspection light had a wavelength of 257 nm, the reflectivity on the surface of the low-reflectivity layer of the mask in this example was 5.2% at the above-mentioned wavelength and the reflectivity of the buffer layer ($SiO_2$) was 42.1% at the above-mentioned wavelength. Therefore, a contrast between the surface of the low-reflectivity layer and the surface of the buffer layer at the above-mentioned wavelength was 1:8.1 in terms of the ratio of reflectivity. The contrast value given by the above-mentioned definition formula was 78%. The ratio of reflectivity between the surface of the low-reflectivity film and the surface of the multilayer film was 1:11.5 and the contrast value was 84%.

On the other hand, the reflectivity on the surface of the absorbing layer of the existing mask was 43.4% at the above-mentioned wavelength. The contrast between the surface of the absorbing layer and the surface of the buffer layer at the above-mentioned wavelength was 1:0.97 in terms of the ratio of reflectivity. The contrast value was 1.5%. The ratio of reflectivity between the low-reflectivity film and the multi-layer film was 1:1.4. The contrast value was as low as 16%.

In the mask in this example, the reflectivity for the EUV light having a wavelength of 13.4 nm was 0.6% and 62.4% on the surface of the low-reflectivity layer as the upper layer of the absorber layer 16 and on the surface of the EUV light reflective layer, respectively. The contrast between the surface of the absorber layer 16 and the surface of the reflective layer for the EUV light was 1:104 in terms of the ratio of reflectivity. The contrast value was 98%. Similarly, in the existing mask, the contrast between the surface of the single-layer absorbing layer and the surface of the reflective layer with respect to the EUV light was 1:105 and the contrast value was 98%.

Figure 9:
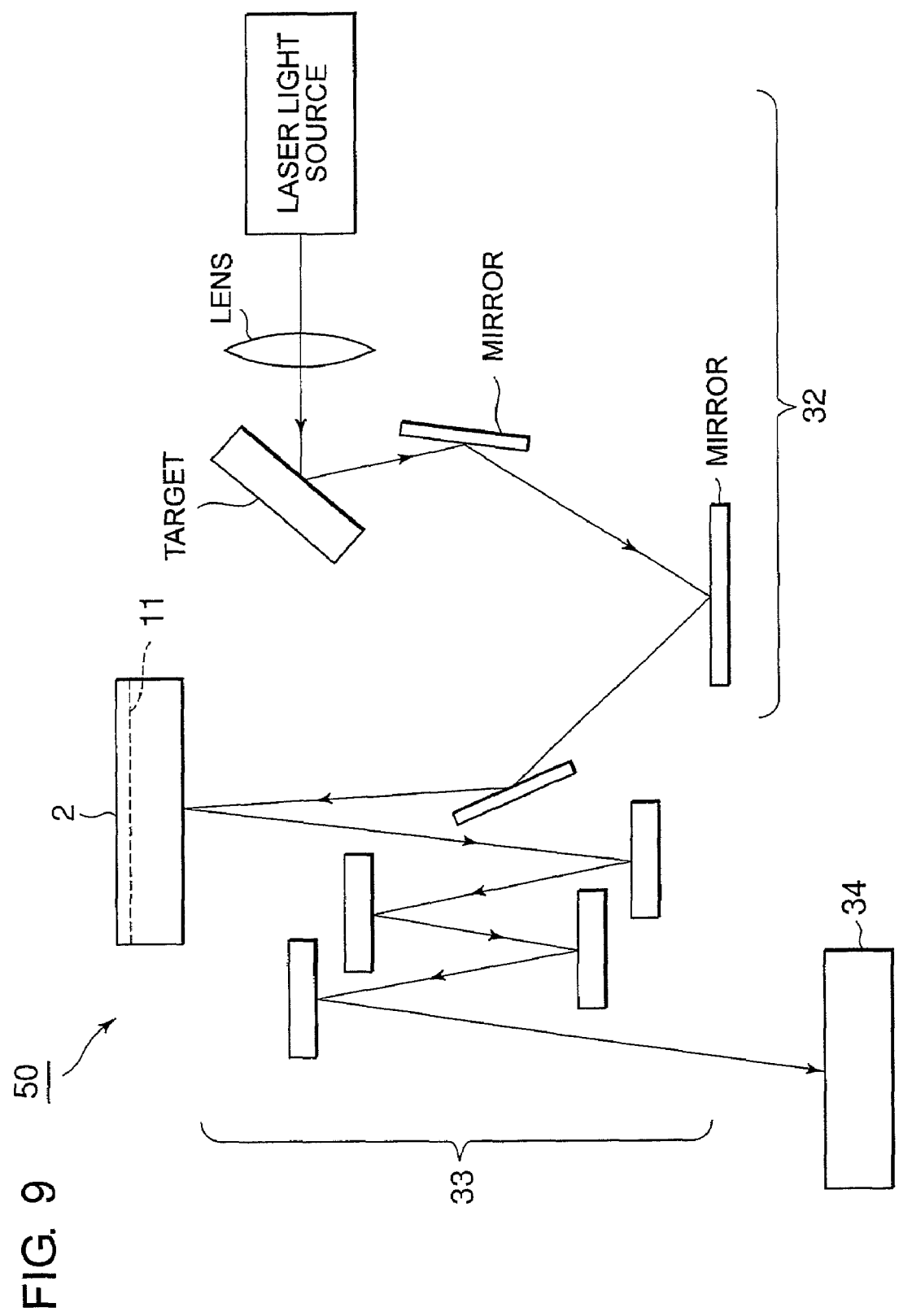
FIG. 9 is a schematic view of a pattern transfer apparatus using the reflective mask in FIG. 3.

Next, description will be made of a method of transferring a pattern by the EUV light onto a semiconductor substrate (silicon wafer) with a resist by the use of the reflective mask in this example. FIG. 9 shows a general structure of a pattern transfer apparatus. The pattern transfer apparatus 50 generally comprises a laser plasma X-ray source 32, the reflective mask 2, and a reducing optical system 33. The reducing optical system 33 comprises an X-ray reflection mirror. The pattern reflected by the reflective mask 2 is generally reduced to about ¼. Since the wavelength band of 13-14 nm is used as the exposure wavelength, an optical path was preliminarily positioned in vacuum.

In the above-mentioned state, the EUV light obtained from the laser plasma X-ray source 32 was incident to the reflective mask 2. The light reflected by the mask was transferred to the silicon wafer 34 through the reducing optical system 33. The light incident to the reflective mask 2 was absorbed by the absorber (selectively formed on the reflective layer on the substrate 11) and was not reflected in an area where the absorber pattern is present. The light incident to an area where the absorber pattern is not present was reflected by the EUV light reflective layer (formed on the substrate 11). Thus, an image formed by the light reflected from the reflective mask 2 was incident to the reducing optical system 33. The exposure light passing through the reducing optical system 33 exposed a transfer pattern onto a resist layer on the silicon wafer 34. By developing the resist layer after exposure, a resist pattern was formed on the silicon wafer 34.

As described above, pattern transfer onto the semiconductor substrate was carried out. As a result, it was confirmed that the reflective mask in this example had an accuracy of 16 nm or less which is a required accuracy in the 70 nm design rule.

From the above-mentioned result, the mask in this example assures a high contrast for the EUV light and also assures a high contrast for the pattern inspection wavelength. Therefore, pattern inspection can be accurately and quickly carried out. On the other hand, the existing mask assures a high contrast for the EUV light. However, the contrast for the pattern inspection wavelength is extremely inferior so that accurate pattern inspection is difficult.

Further, a mask was produced in the manner similar to this example except that a MoSiON thin film was deposited as the inspection light low-reflectivity layer 15 in this example. In this case also, a high contract was obtained for both of the inspection wavelength and the EUV light, like in this example.

Example 1-2

In the manner similar to Example 1-1, a Mo/Si laminate film of molybdenum (Mo) and silicon (Si) was deposited on the substrate 11 as the EUV light reflective layer 12. On the reflective layer, a $SiO_2$ thin film was deposited to a thickness of 50 nm as the buffer layer 13.

On the buffer layer, a tantalum (Ta) thin film was formed to a thickness of 50 nm as the exposure light absorbing layer (comprising the EUV light absorber) 14. Specifically, using a Ta target, deposition was carried out by DC magnetron reactive sputtering using an argon gas.

On the exposure light absorbing layer, a TaO thin film was deposited to a thickness of 10 nm as the low-reflectivity layer 15 for the inspection light having a wavelength of 257 nm. Specifically, using the same Ta target and in the same deposition chamber as those in the formation of the lower layer of Ta, deposition was carried out by DC magnetron reactive sputtering using a mixed gas of argon and oxygen. The film had a composition of $Ta_{38}O_{62}$. The TaO film had a refractive index of 2.68 and an extinction coefficient of 0.18 for light having a wavelength of 260 nm and a refractive index of 2.04 and an extinction coefficient of 0.87 for light having a wavelength of 190 nm. The surface of the TaO film had a surface roughness of 0.7 nmRms.

In case where the inspection light low-reflectivity layer comprises oxide of a metal same as that of the EUV light absorbing layer as described in this example, the surface of the EUV light absorbing layer may be treated by an oxidization process using a process gas containing an oxygen gas or an oxidization process using an acid solution.

Using a mask blank produced as mentioned above, an EUV mask having a 16 Gbit-DRAM pattern with 0.07 μm design rule was produced in the manner similar to Example 1-1.

For the purpose of comparison, preparation was made of a sample of an EUV light absorbing layer as a single layer without the low-reflectivity layer 15 as the uppermost layer in this example. The EUV light absorbing layer as a single layer had a thickness of 60 nm equal to the total thickness of the two layers including the exposure light absorbing layer (EUV light absorbing layer) and the low-reflectivity layer in this example.

Figure 11:
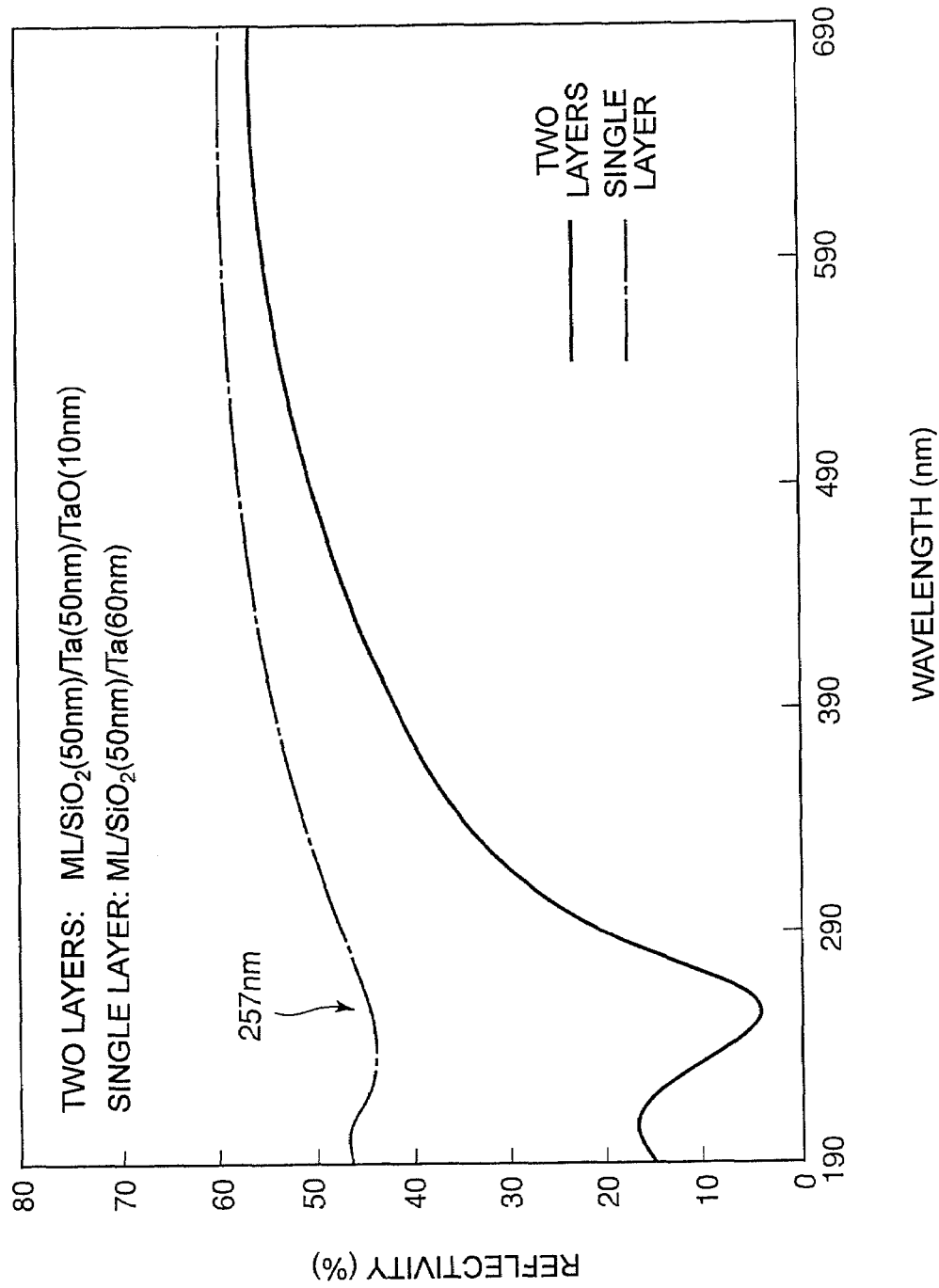
FIG. 11 is a view showing values of the reflectivity for lights having wavelengths from 190 nm to 690 nm in an example 1-2 of this invention and in the existing reflective mask.

FIG. 11 shows the values of reflectivity on the surface of the absorber pattern of the mask with respect to the light having a wavelength within a range from 190 nm to 690 nm. In this example, a wavelength region exhibiting a minimum value of the reflectivity is extremely narrow as compared with the low-reflectivity layer in Example 1-1.

From the above-mentioned result, in case where the pattern inspection light had a wavelength of 257 nm, the reflectivity on the surface of the low-reflectivity layer of the mask in this example was 4.0% at the above-mentioned wavelength and the reflectivity of the buffer layer ($SiO_2$) was 42.1% at the above-mentioned wavelength. Therefore, a contrast between the surface of the low-reflectivity layer and the surface of the buffer layer at the above-mentioned wavelength was 1:10 in terms of the ratio of reflectivity. The contrast value was 83%. The ratio of reflectivity between the surface of the low-reflectivity film and the surface of the multilayer film was 1:15 and the contrast value was 88%.

On the other hand, the reflectivity on the surface of the absorbing layer of the existing mask was 44% at the above-mentioned wavelength. The contrast between the surface of the absorbing layer and the surface of the buffer layer at the above-mentioned wavelength was 1:0.96 in terms of the ratio of reflectivity. The contrast value was 2.2%. The ratio of reflectivity between the surface of the absorber and the surface of the multilayer film was 1:1.4. The contrast value was as low as 15%.

In the mask in this example, the reflectivity for the EUV light having a wavelength of 13.4 nm was 0.5% and 62.4% on the surface of the low-reflectivity layer as the upper layer of the absorber layer 16 and on the surface of the EUV light reflective layer, respectively. The contrast between the surface of the absorber layer 16 and the surface of the reflective layer for the EUV light was 1:125 in terms of the ratio of reflectivity. The contrast value was 98%. Similarly, in the existing mask, the contrast between the surface of the single-layer absorbing layer and the surface of the reflective layer with respect to the EUV light was 1:105 and the contrast value was 98%.

Using the reflective mask in this example, exposure and transfer were carried out onto the semiconductor substrate as illustrated in FIG. 9 in the manner similar to Example 1-1. As a result, it was confirmed that the reflective mask had a sufficient exposure characteristic. Specifically, it was confirmed that the EUV reflective mask in this example had an accuracy of 16 nm or less which is a required accuracy in the 70 nm design rule.

From the above-mentioned result, the mask in this example assures a high contrast for the EUV light and also assures a high contrast for the pattern inspection wavelength. On the other hand, the existing mask assures a high contrast for the EUV light. However, the contrast for the pattern inspection wavelength is extremely inferior.

Example 1-3

In the manner similar to Example 1-1, a Mo/Si laminate film of molybdenum (Mo) and silicon (Si) was deposited on the substrate 11 as the EUV light reflective layer 12. On the reflective layer, a Cr thin film was deposited by DC magnetron sputtering to a thickness of 50 nm as the buffer layer 13. The surface roughness of the surface of the Cr thin film was 0.5 nmRms.

In the manner similar to Example 1-2 described above, a tantalum (Ta) thin film was formed on the buffer layer as the exposure light absorbing layer (comprising the EUV light absorber) 14 and a TaO thin film was deposited on the exposure light absorbing layer as the low-reflectivity layer 15 for the inspection light having a wavelength of 257 nm. In this example, the tantalum film had a thickness of 40 nm. The surface of the TaO film had a surface roughness of 0.7 nmRms.

Using a mask blank produced as mentioned above, an EUV reflective mask having a 16 Gbit-DRAM pattern with 0.07 μm design rule was produced in the manner similar to Example 1-1.

For the purpose of comparison, preparation was made of a sample of an EUV light absorbing layer as a single layer without the inspection light low-reflectivity layer 15 as the uppermost layer in this example. The EUV light absorbing layer as a single layer had a thickness of 50 nm equal to the total thickness of the two layer including the exposure light absorbing layer (EUV light absorbing layer) and the inspection light low-reflectivity layer in this example.

Figure 12:
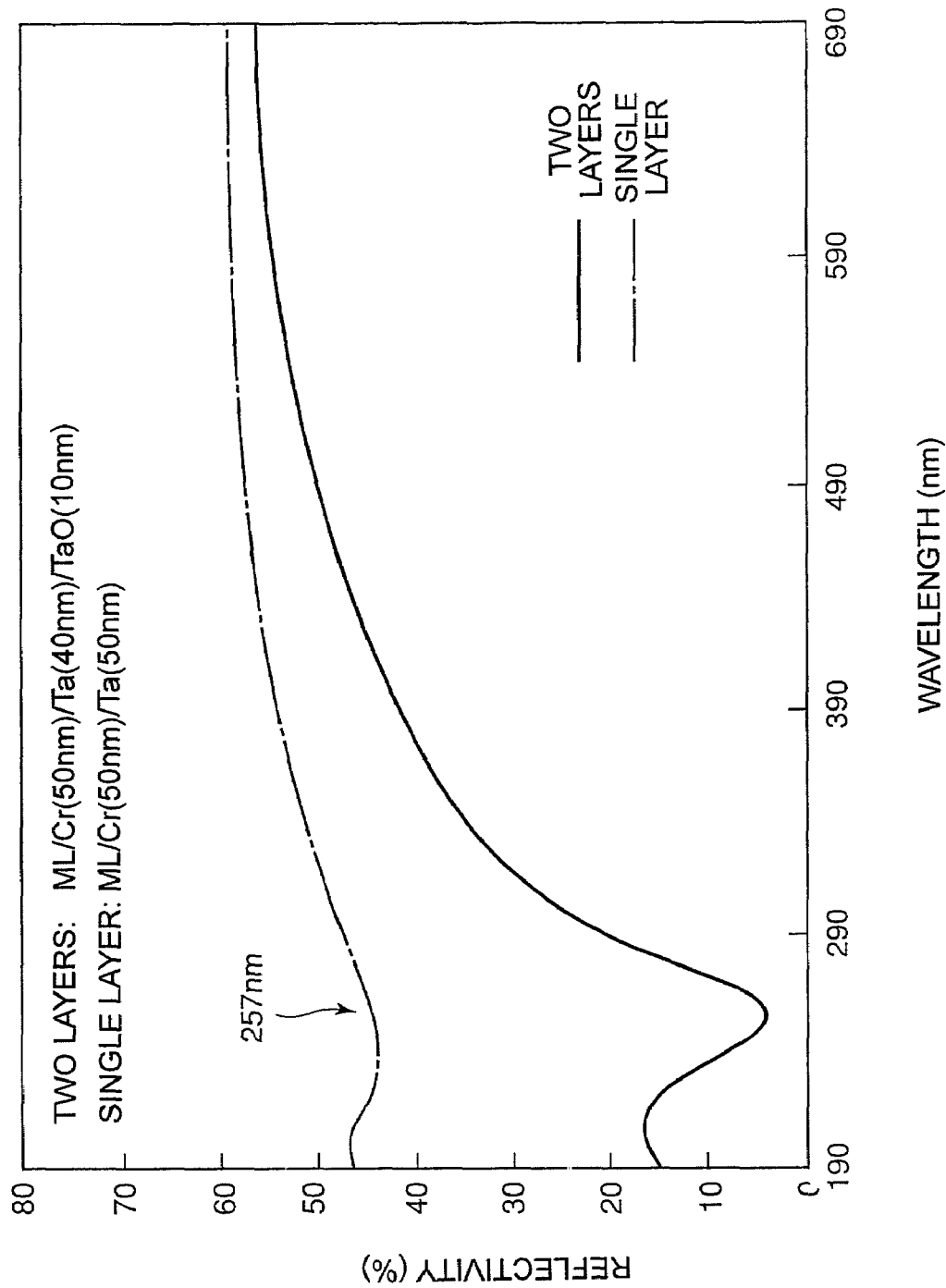
FIG. 12 is a view showing values of the reflectivity for lights having wavelengths from 190 nm to 690 nm in an example 1-3 of this invention and in the existing reflective mask.

FIG. 12 shows the values of reflectivity on the surface of the absorber pattern of the mask with respect to the light having a wavelength within a range from 190 nm to 690 nm.

From the above-mentioned result, in case where the pattern inspection light had a wavelength of 257 nm, the reflectivity on the surface of the low-reflectivity layer of the mask in this example was 4.0% at the above-mentioned wavelength and the reflectivity of the buffer layer (Cr) was 57.0% at the above-mentioned wavelength. Therefore, a contrast between the surface of the low-reflectivity layer and the surface of the buffer layer at the above-mentioned wavelength was 1:14 in terms of the ratio of reflectivity. The contrast value was 87%. The ratio of reflectivity between the surface of the low-reflectivity film and the surface of the multilayer film was 1:15 and the contrast value was 88%.

On the other hand, the reflectivity on the surface of the absorbing layer of the existing mask was 44% at the above-mentioned wavelength. The contrast between the surface of the absorbing layer and the surface of the buffer layer at the above-mentioned wavelength was 1:1.3 in terms of the ratio of reflectivity. The contrast value was 13%. The ratio of reflectivity between the surface of the low-reflectivity layer and the surface of the multilayer film was 1:1.4. The contrast value was as low as 15%.

In the mask in this example, the reflectivity for the EUV light having a wavelength of 13.4 nm was 0.5% and 62.4% on the surface of the low-reflectivity layer as the upper layer of the absorber layer 16 and on the surface of the EUV light reflective layer, respectively. The contrast between the surface of the absorber layer 16 and the surface of the reflective layer for the EUV light was 1:125 in terms of the ratio of reflectivity. The contrast value was 98%. Similarly, in the existing mask, the contrast between the surface of the single-layer absorbing layer and the surface of the reflective layer with respect to the EUV light was 1:105 and the contrast value was 98%.

Using the reflective mask in this example, exposure and transfer were carried out onto the semiconductor substrate as illustrated in FIG. 9 in the manner similar to Example 1-1. As a result, it was confirmed that the reflective mask had a sufficient exposure characteristic. Specifically, it was confirmed that the EUV reflective mask in this example had an accuracy of 16 nm or less which is a required accuracy of the 70 nm design rule.

From the above-mentioned result, the mask in this example assures a high contrast for the EUV light and also assures a high contrast for the pattern inspection wavelength. Further, the mask in this example uses the Cr film as the buffer layer so that the buffer layer also has a function as the EUV light absorbing layer. It is therefore possible to further reduce the thickness of the exposure light absorbing layer (EUV light absorbing layer) as the upper layer without degrading the contrast. On the other hand, the existing mask assures a high contrast for the EUV light. However, the contrast for the pattern inspection wavelength is extremely inferior.

Example 1-4

In the manner similar to Example 1-1, the EUV light reflective layer 12 was deposited on the substrate 11. On the reflective layer 12, a chromium nitride film was deposited to a thickness of 50 nm as the buffer layer 13. The chromium nitride film was formed by DC magnetron sputtering. For deposition, a Cr target was used and a gas containing Ar with 10% nitrogen added thereto was used as a sputter gas.

The chromium nitride film thus deposited had a composition of $Cr_{1-x}N_x$ where x=0.1. The chromium nitride film had a film stress of +40 MPa per 100 nm. The chromium nitride film had a reflectivity of 52% for the light having a wavelength of 257 nm. The surface roughness of the surface of the CrN film was 0.27 nmRms.

Next, on the buffer layer 13 comprising the chromium nitride film, a tantalum boron nitride (TaBN) film was formed to a thickness of 50 nm as the exposure light absorbing layer (comprising the EUV light absorber). The TaBN film was formed by DC magnetron sputtering using a target containing Ta and B and a gas containing Ar with 10% nitrogen added thereto. The TaBN film had a composition ratio of 0.8 Ta, 0.1 B, and 0.1 N. The TaBN film had an amorphous structure.

On the TaBN absorbing layer, a tantalum boron nitride (TaBN) film was formed to a thickness of 15 nm as the low-reflectivity layer 15. The TaBN film as the low-reflectivity layer was deposited by DC magnetron sputtering using a target containing Ta and B and a gas containing Ar with 40% nitrogen added thereto. At this time, deposition was successively carried out in the same deposition chamber as the TaBN film as the lower layer, using the same target, changing the amount of the nitrogen gas between the formation of the lower layer and the formation of the upper layer. The TaBN film deposited herein as the low-reflectivity layer had a composition ratio of 0.5 Ta, 0.1 B, and 0.4 N where the ratio of nitrogen is increased as compared with the TaBN film as the exposure light absorbing layer (EUV light absorbing layer). The TaBN film was amorphous also.

The TaBN film has a refractive index of 2.3 and an extinction coefficient of 1.0 for the light having a wavelength of 257 nm. The absorption coefficient for the EUV light having a wavelength of 13.4 nm is 0.036. The surface roughness is 0.25 nmRms. Thus, the film was extremely smooth.

The reflectivity on the low-reflectivity layer thus obtained was 18% for the light having a wavelength of 257 nm. The total stress of the exposure light absorbing layer (EUV light absorbing layer) and the low-reflectivity layer was −50 MPa per 100 nm.

As described above, a reflective mask blank in this example was obtained.

Next, using the mask blank produced as mentioned above, an EUV reflective mask having a 16 Gbit-DRAM pattern with 0.07 μm design rule was produced in the manner similar to Example 1-1.

In the manner similar to Example 1-1, an absorber pattern was at first formed on the low-reflectivity layer and the exposure light absorbing layer (EUV light absorbing layer). Herein, using the light having a wavelength of 257 nm as inspection light, the absorber pattern was inspected. The ratio of reflectivity between the buffer layer and the low-reflectivity layer for the inspection light was 1:0.35. The contrast value was 48%. In the inspection, a sufficient contrast was obtained.

Next, the buffer layer comprising chromium nitride was removed by dry etching in conformity with the absorber pattern. The dry etching was carried out by the use of a mixed gas of chlorine and oxygen.

As described above, a reflective mask in this example was obtained. The reflective mask thus obtained was again inspected to confirm the absorber pattern by the use of the inspection light having a wavelength of 257 nm. As a result, the ratio of reflectivity between the EUV reflective layer and the low-reflectivity layer for the inspection light was 1:0.3. The contrast value was 50%. Thus, a sufficient contrast was obtained In the inspection for confirmation also. For the reflective mask thus obtained, the reflectivity was measured by the use of the EUV light having a wavelength of 13.4 nm and an incident angle of 5 degrees. As a result, the reflectivity was 65% and the reflection characteristic was excellent.

Using the reflective mask in this example, exposure and transfer were carried out onto the semiconductor substrate as illustrated in FIG. 9 in the manner similar to Example 1-1. As a result, it was confirmed that the reflective mask had a sufficient exposure characteristic. Specifically, it was confirmed that the EUV reflective mask in this example had an accuracy of 16 nm or less which is a required accuracy in the 70 nm design rule.

Example 1-5

This example is different from Example 1-4 in that a tantalum boron oxynitride (TaBNO) film was used as the low-reflectivity layer. In the manner similar to Example 1-4, the EUV light reflective layer 12, the buffer layer 13, and the exposure light absorbing layer (comprising the EUV light absorber) 14 were deposited on the substrate 11.

Next, on the exposure light absorbing layer (comprising the EUV light absorber) 14, the tantalum boron oxynitride (TaBNO) film was formed to a thickness of 15 nm as the low-reflectivity layer 15. The TaBNO film was deposited by DC magnetron sputtering using a target containing Ta and B and a gas containing Ar with 10% nitrogen and 20% oxygen added thereto. The TaBNO film deposited herein as the low-reflectivity layer had a composition ratio of 0.4 Ta, 0.1 B, 0.1 N, and 0.4 O. The TaBNO low-reflectivity layer had a surface roughness of 0.25 nmRms and was very smooth. The TaBNO film had an amorphous structure.

The TaBNO film has a refractive index of 2.4 and an extinction coefficient of 0.5 for the light having a wavelength of 257 nm. The absorption coefficient for the EUV light having a wavelength of 13.4 nm is 0.036. The TaBN layer as the lower layer and the TaBNO layer as the upper layer were successively deposited in the same deposition chamber, changing the species of gas, using the same target.

The reflectivity on the low-reflectivity layer thus obtained was 10% for the light having a wavelength of 257 nm. The total stress of the EUV light absorbing layer and the low-reflectivity layer was −50 MPa per 100 nm.

As described above, a reflective mask blank in this example was obtained.

Next, using the mask blank produced as mentioned above, an EUV reflective mask having a 16 Gbit-DRAM pattern with 0.07 μm design rule was produced in the manner similar to Example 1-1.

In the manner similar to Example 1-1, an absorber pattern was at first formed on the low-reflectivity layer and the exposure light absorbing layer (EUV light absorbing layer). Herein, using the light having a wavelength of 257 nm as inspection light, the absorber pattern was inspected. The ratio of reflectivity between the buffer layer and the low-reflectivity layer for the inspection light was 1:0.19. The contrast value was 68%. In the inspection, a sufficient contrast was obtained.

Next, the buffer layer comprising chromium nitride was removed by dry etching in conformity with the absorber pattern in the manner similar to Example 1-4.

As described above, a reflective mask in this example was obtained. The reflective mask thus obtained was again inspected to confirm the absorber pattern by the use of the inspection light having a wavelength of 257 nm. As a result, the ratio of reflectivity between the EUV reflective layer and the low-reflectivity layer for the inspection light was 1:0.17. The contrast value was 71%. Thus, a sufficient contrast was obtained in the inspection for confirmation also. For the reflective mask thus obtained, the reflectivity was measured by the use of the EUV light having a wavelength of 13.4 nm and an incident angle of 5 degrees. As a result, the reflectivity was 65% and the reflection characteristic was excellent.

Using the reflective mask in this example, exposure and transfer were carried out onto the semiconductor substrate as illustrated in FIG. 9 in the manner similar to Example 1-1. As a result, it was confirmed that the reflective mask had a sufficient exposure characteristic. Specifically, it was confirmed that the EUV reflective mask in this example had an accuracy of 16 nm or less which is a required accuracy in the 70 nm design rule.

Example 1-6

This example is different from Example 1-4 in that a tantalum boron oxide (TaBO) film was used as the low-reflectivity layer. In the manner similar to Example 1-4, the EUV light reflective layer 12, the buffer layer 13, and the exposure light absorbing layer 14 were deposited on the substrate 11.

Next, on the exposure light absorbing layer 14, the tantalum boron oxide (TaBO) film was formed to a thickness of 12 nm as the low-reflectivity layer 15. The TaBO film was deposited by DC magnetron sputtering using a target containing Ta and B and a gas containing Ar with 30% oxygen added thereto. Between the formation of the exposure light absorbing layer (EUV light absorbing layer) and the formation of the low-reflectivity layer, a DC power was stopped and the gas used in deposition was changed. The TaBO film deposited herein as the low-reflectivity layer had a composition ratio of 0.4 Ta, 0.1 B, and 0.5O. The TaBO film had an amorphous structure.

The TaBO film has a refractive index of 2.5 and an extinction coefficient of 0.3 for the light having a wavelength of 257 nm. The absorption coefficient for the EUV light having a wavelength of 13.4 nm is 0.035. The TaBO film had a surface roughness of 0.25 nmRms and was very smooth.

The reflectivity on the low-reflectivity layer thus obtained was 5% for the light having a wavelength of 257 nm. The total stress of the exposure light absorbing layer (EUV light absorbing layer) and the low-reflectivity layer was −50 MPa per 100 nm. The lower layer and the upper layer of the absorber layer were successively deposited in the same deposition chamber, using the same target, changing the gas.

As described above, a reflective mask blank in this example was obtained.

Next, using the mask blank produced as mentioned above, an EUV reflective mask having a 16 Gbit-DRAM pattern with 0.07 μm design rule was produced in the manner similar to Example 1-1.

In the manner similar to Example 1-1, an absorber pattern was at first formed on the low-reflectivity layer and the absorbing layer. Herein, using the light having a wavelength of 257 nm as inspection light, the absorber pattern was inspected. The ratio of reflectivity between the buffer layer and the low-reflectivity layer for the inspection light was 1:0.10. The contrast value was 82%. In the inspection, a sufficient contrast was obtained.

Next, the buffer layer comprising chromium nitride was removed by dry etching in conformity with the absorber pattern in the manner similar to Example 1-4.

As described above, a reflective mask in this example was obtained. The reflective mask thus obtained was again inspected to confirm the absorber pattern by the use of the inspection light having a wavelength of 257 nm. As a result, the ratio of reflectivity between the EUV reflective layer and the low-reflectivity layer for the inspection light was 1:0.08. The contrast value was 85%. Thus, a sufficient contrast was obtained In the inspection for confirmation also. For the reflective mask thus obtained, the reflectivity was measured by the use of the EUV light having a wavelength of 13.4 nm and an incident angle of 5 degrees. As a result, the reflectivity was 65% and the reflection characteristic was excellent.

Using the reflective mask in this example, exposure and transfer were carried out onto the semiconductor substrate as illustrated in FIG. 9 in the manner similar to Example 1-1. As a result, it was confirmed that the reflective mask had a sufficient exposure characteristic. Specifically, it was confirmed that the EUV reflective mask in this example had an accuracy of 16 nm or less which is a required accuracy in the 70 nm design rule.

Example 1-7

MoSiN as the Upper Layer

In the manner similar to Example 1-4, a Mo/Si reflective multilayer film, a CrN buffer layer of 50 nm, and an absorber lower layer comprising a TaBN film of 50 nm were formed on a glass substrate.

Next, as the low-reflectivity layer as the upper layer, a film comprising Mo, Si, and N (MoSiN) was formed to a thickness of 10 nm. Deposition was carried out by DC magnetron sputtering using a target containing Si and Mo and a gas containing argon and nitrogen. The MoSiN film thus obtained had a composition of Mo:Si:N=23:27:50. The film had an amorphous structure.

The refractive index and the extinction coefficient for the light having a wavelength of 260 nm are 2.56 and 0.97, respectively. The refractive index and the extinction coefficient for the light having a wavelength of 190 nm are 2.39 and 1.05, respectively.

The surface of the MoSiN film had a surface roughness of 0.25 nmRms and was very smooth.

The reflectivity on the surface of the MoSiN film was 17% for the inspection light having a wavelength of 257 nm.

As described above, a reflective mask blank in this example was obtained.

Next, using the mask blank, a reflective mask having a 16 Gbit-DRAM pattern with 0.07 μm design rule was produced.

In the manner similar to Example 1-1, a resist pattern was at first formed on the low-reflectivity layer. Subsequently, by dry etching using a fluorine gas, the MoSiN low-reflectivity layer was patterned along the resist pattern to expose a part of the TaBN film as the absorber lower layer.

Next, by dry etching using a chlorine gas, the TaBN film thus exposed was patterned in conformity with the MoSiN film to expose a part of the CrN buffer layer.

Herein, in the manner similar to Example 1-1, the absorber pattern was inspected by the use of the inspection light having a wavelength of 257 nm.

The ratio of reflectivity between the surface of the absorber layer and the surface of the buffer layer for the inspection light was 1:3. The contrast value was 50%. Thus, a sufficient contrast was obtained.

In the manner similar to Example 1-1, defects were repaired by FIB. Thereafter, the exposed part of the CrN buffer layer was removed by dry etching using chlorine and oxygen to form a pattern in conformity with the absorber pattern.

As described above, a reflective mask in this example was obtained.

The reflective mask was subjected to final inspection of the pattern by the use of the inspection light having a wavelength of 257 nm. The ratio of reflectivity between the surface of the absorber layer and the surface of the multilayer reflective film for the inspection light was 1:3.5. The contrast value was 56%. Thus, a sufficient contrast was obtained.

Using the reflective mask in this example, pattern transfer was carried out onto a semiconductor substrate (silicon wafer) with a resist in the manner similar to Example 1-1. As a result, it was confirmed that the reflective mask in this example had an accuracy of 16 nm or less which is a required accuracy in the 70 nm design rule.

Example 1-8

MoSiON as the Upper Layer

In the manner similar to Example 1-4, a Mo/Si reflective multilayer film, a CrN buffer layer of 50 nm, and an absorber lower layer comprising a TaBN film of 50 nm were formed on a glass substrate.

Next, as the low-reflectivity layer as the upper layer, a film comprising Mo, Si, O, and N (MoSiON) was formed to a thickness of 20 nm. Deposition was carried out by DC magnetron sputtering using a target containing Si and Mo and a gas containing argon, nitrogen, and oxygen. The MoSiON film thus obtained had a composition of Mo:Si:O:N=19:19:19:43. The film had an amorphous structure.

The refractive index and the extinction coefficient for the light having a wavelength of 260 nm are 2.01 and 0.46, respectively. The refractive index and the extinction coefficient for the light having a wavelength of 190 nm are 1.91 and 0.52, respectively.

The surface of the MoSiON film had a surface roughness of 0.25 nmRms and was very smooth.

The reflectivity on the surface of the MoSiON film was 4.4% for the inspection light having a wavelength of 257 nm.

As described above, a reflective mask blank in this example was obtained.

Next, using the mask blank, a reflective mask having a 16 Gbit-DRAM pattern with 0.07 µm design rule was produced.

In the manner similar to Example 1-1, a resist pattern was at first formed on the low-reflectivity layer. Subsequently, by dry etching using a fluorine gas, the MoSiON low-reflectivity layer was patterned along the resist pattern to expose a part of the TaBN film as the absorber lower layer.

Next, by dry etching using a chlorine gas, the TaBN film thus exposed was patterned in conformity with the MoSiN film to expose a part of the CrN buffer layer.

Herein, in the manner similar to Example 1-1, the absorber pattern was inspected by the use of the inspection light having a wavelength of 257 nm.

The ratio of reflectivity between the surface of the absorber layer and the surface of the buffer layer for the inspection light was 1:12. The contrast value was 84%. Thus, a sufficient contrast was obtained.

In the manner similar to Example 1-1, defects were repaired by FIB. Thereafter, the exposed part of the CrN buffer layer was removed by dry etching using chlorine and oxygen to form a pattern in conformity with the absorber pattern.

As described above, a reflective mask in this example was obtained.

The reflective mask was subjected to final inspection of the pattern by the use of the inspection light having a wavelength of 257 nm. The ratio of reflectivity between the surface of the absorber layer and the surface of the multilayer reflective film for the inspection light was 1:14. The contrast value was 86%. Thus, a sufficient contrast was obtained.

Using the reflective mask in this example, pattern transfer was carried out onto a semiconductor substrate (silicon wafer) with a resist in the manner similar to Example 1-1. As a result, it was confirmed that the reflective mask in this example had an accuracy of 16 nm or less which is a required accuracy in the 70 nm design rule.

Example 1-9

CrO as the Upper Layer

In the manner similar to Example 1-4, a Mo/Si reflective multilayer film, a CrN buffer layer of 50 nm, and an absorber lower layer comprising a TaBN film of 50 nm were formed on a glass substrate.

Next, as the low-reflectivity layer as the upper layer, a chromium oxide film (CrO) was formed to a thickness of 20 nm. Deposition was carried out by DC magnetron sputtering using a target containing Cr and a gas containing argon and oxygen. The CrO film thus obtained had a composition of Cr:O=46:54.

The refractive index and the extinction coefficient for the light having a wavelength of 260 nm are 2.37 and 0.72, respectively. The refractive index and the extinction coefficient for the light having a wavelength of 190 nm are 1.91 and 1.13, respectively.

The surface of the CrO film had a surface roughness of 0.3 nmRms.

The reflectivity on the surface of the CrO film was 14% for the inspection light having a wavelength of 257 nm.

As described above, a reflective mask blank in this example was obtained.

Next, using the mask blank, a reflective mask having a 16 Gbit-DRAM pattern with 0.07 µm design rule was produced.

In the manner similar to Example 1-1, a resist pattern was at first formed on the low-reflectivity layer. Subsequently, by dry etching using chlorine and oxygen, the CrO low-reflectivity layer was patterned along the resist pattern to expose a part of the TaBN film as the absorber lower layer.

Next, by dry etching using a chlorine gas, the TaBN film thus exposed was patterned in conformity with the CrO film to expose a part of the CrN buffer layer.

Herein, in the manner similar to Example 1-1, the absorber pattern was inspected by the use of the inspection light having a wavelength of 257 nm.

The ratio of reflectivity between the surface of the absorber layer and the surface of the buffer layer for the inspection light was 1:3.7. The contrast value was 58%. Thus, a sufficient contrast was obtained.

In the manner similar to Example 1-1, defects were repaired by FIB. Thereafter, the exposed part of the CrN buffer layer was removed by dry etching using chlorine and oxygen to form a pattern in conformity with the absorber pattern.

As described above, a reflective mask in this example was obtained.

The reflective mask was subjected to final inspection of the pattern by the use of the inspection light having a wavelength of 257 nm. The ratio of reflectivity between the surface of the absorber layer and the surface of the multilayer reflective film for the inspection light was 1:4.3. The contrast value was 62%. Thus, a sufficient contrast was obtained.

Using the reflective mask in this example, pattern transfer was carried out onto a semiconductor substrate (silicon wafer) with a resist in the manner similar to Example 1-1. As a result, it was confirmed that the reflective mask in this example had an accuracy of 16 nm or less which is a required accuracy in the 70 nm design rule.

Example 1-10

SiON as the Upper Layer

In the manner similar to Example 1-4, a Mo/Si reflective multilayer film, a CrN buffer layer of 50 nm, and an absorber lower layer comprising a TaBN film of 50 nm were formed on a glass substrate.

Next, as the low-reflectivity layer as the upper layer, a film comprising Si, O, and N (SiON) was formed to a thickness of 22 nm. Deposition was carried out by DC magnetron sputtering using a Si target and a gas containing argon, oxygen, and nitrogen. The SiON film thus obtained had a composition of Si:O:N=28:62:10.

The refractive index and the extinction coefficient for the light having a wavelength of 260 nm are 1.74 and 0.0018, respectively. The refractive index and the extinction coefficient for the light having a wavelength of 190 nm are 1.86 and 0.0465, respectively.

The surface of the SiON film had a surface roughness of 0.3 nmRms.

The reflectivity on the surface of the SiON film was 5% for the inspection light having a wavelength of 257 nm.

As described above, a reflective mask blank in this example was obtained.

Next, using the mask blank, a reflective mask having a 16 Gbit-DRAM pattern with 0.07 µm design rule was produced.

In the manner similar to Example 1-1, a resist pattern was at first formed on the low-reflectivity layer. Subsequently, by dry etching using fluoride, the SiON low-reflectivity layer was patterned along the resist pattern to expose a part of the TaBN film as the absorber lower layer.

Next, by dry etching using a chlorine gas, the TaBN film thus exposed was patterned in conformity with the SiON film to expose a part of the CrN buffer layer.

Herein, in the manner similar to Example 1-1, the absorber pattern was inspected by the use of the inspection light having a wavelength of 257 nm.

The ratio of reflectivity between the surface of the absorber layer and the surface of the buffer layer for the inspection light was 1:10.4. The contrast value was 82%. Thus, a sufficient contrast was obtained.

In the manner similar to Example 1-1, defects were repaired by FIB. Thereafter, the exposed part of the CrN buffer layer was removed by dry etching using chlorine and oxygen to form a pattern in conformity with the absorber pattern.

As described above, a reflective mask in this example was obtained.

The reflective mask was subjected to final inspection of the pattern by the use of the inspection light having a wavelength of 257 nm. The ratio of reflectivity between the surface of the absorber layer and the surface of the multilayer reflective film for the inspection light was 1:12. The contrast value was 85%. Thus, a sufficient contrast was obtained.

Using the reflective mask in this example, pattern transfer was carried out onto a semiconductor substrate (silicon wafer) with a resist in the manner similar to Example 1-1. As a result, it was confirmed that the reflective mask in this example had an accuracy of 16 nm or less which is a required accuracy in the 70 nm design rule.

Example 1-11

Having the TaBN/TaBO Intermediate Region

In the manner similar to Example 1-4, an EUV light reflective layer comprising a Mo/Si periodic laminate film and a buffer layer comprising a chromium nitride film were formed on a substrate.

Next, as the lower layer of the absorber layer, a tantalum boron nitride (TaBN) film was formed.

The TaBN film was formed by DC magnetron sputtering using a target containing Ta and B and a gas containing Ar with 10% nitrogen added thereto.

When the TaBN film was formed to about 50 nm, supply of the gas containing Ar and nitrogen was gradually reduced in ten seconds to be stopped while DC is kept supplied. Simultaneously, oxygen is added to Ar up to 30% in the above-mentioned ten seconds without exhausting and deposition using the same target was continuously carried out in the same deposition chamber. After the introduction of oxygen is started, about 15 nm deposition was carried out.

The surface of the absorber layer thus formed had a roughness of 0.25 nmRms and was very smooth.

The absorber layer had an amorphous structure.

Figure 13:
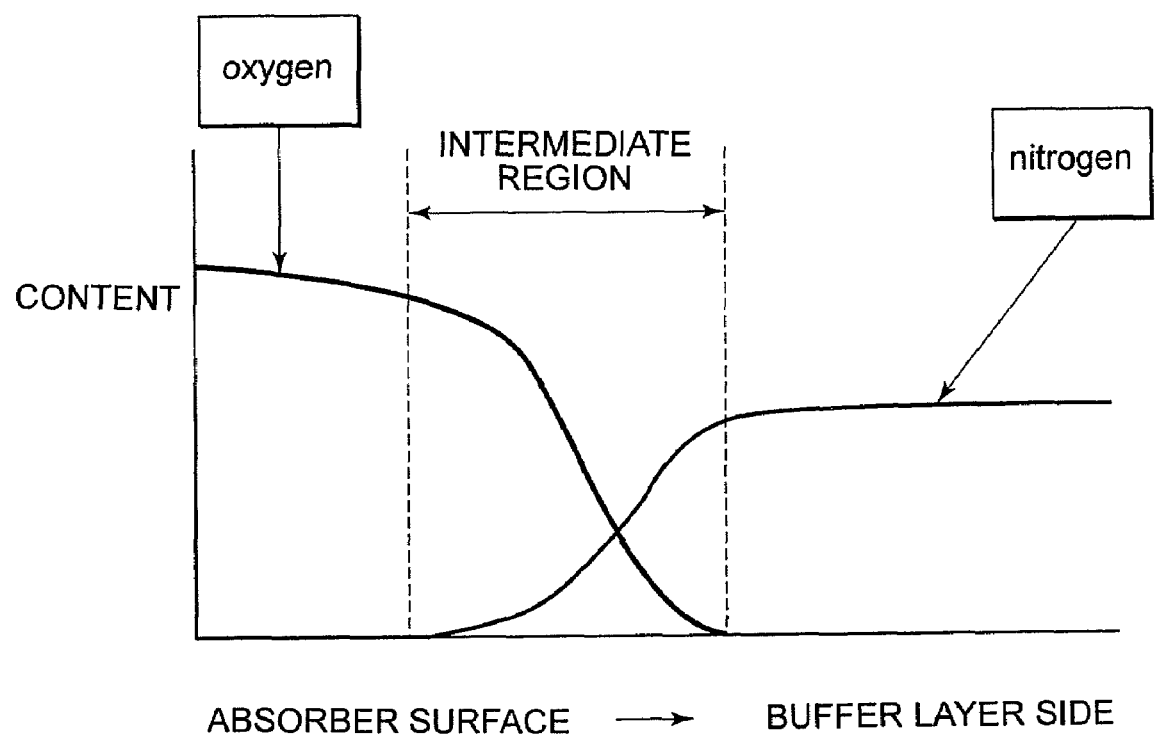
FIG. 13 is a view for describing a TaBN/TaBO intermediate region in an example 1-11 of this invention.

By X-ray photoelectron spectroscopy (XPS), the composition of nitrogen and oxygen in the thickness direction of the absorber layer was analyzed. As a result, as illustrated in FIG. 13, it was confirmed that an intermediate region where the composition was continuously changed from the composition of the lower layer towards the composition of the upper layer is formed between the upper and the lower layers. The intermediate region had a thickness of about 5 nm. In the intermediate region, the composition is continuously changed in the manner such that the content of nitrogen is gradually reduced and the content of oxygen is increased from a lower layer side adjacent to the buffer layer towards an upper layer side adjacent to the surface of the absorber layer. The lower layer adjacent to the buffer layer was a TaBN film having a composition of Ta:B:N=0.5:0.1:0.4. The upper layer adjacent to the surface of the absorber layer was a TaBO film having a composition of Ta:B:O=0.4:0.1:0.5.

The reflectivity on the surface of the absorber layer for the inspection light having a wavelength of 257 nm was 5%.

The refractive index and the extinction coefficient of the TaBO film as the upper layer are 2.5 and 0.3 for the light having a wavelength of 257 nm, respectively.

As described above, a reflective mask blank in this example was obtained.

Next, using the reflective mask blank, a reflective mask having a 16 Gbit-DRAM pattern with 0.07 µm design rule was produced.

In the manner similar to Example 1-1, a resist pattern was at first formed on the low-reflectivity layer. Subsequently, by dry etching using a gas containing chlorine, the absorber layer was patterned along the resist pattern. The upper layer of the absorber layer, the intermediate region, and the lower layer were continuously patterned by dry etching to expose a part of the CrN buffer layer.

Since the intermediate region having continuous change in composition was formed between the upper layer and the lower layer, the absorber layer could be patterned to have an excellent rectangular section which is continuous without a step. Herein, in the manner similar to Example 1-1, the absorber pattern was inspected by the use of the inspection light having a wavelength of 257 nm.

The ratio of reflectivity between the surface of the absorber layer and the surface of the buffer layer for the inspection light was 1:10.4. The contrast value was 82%. Thus, a sufficient contrast was obtained.

In the manner similar to Example 1-1, defects were repaired by FIB. Thereafter, the exposed part of the CrN buffer layer was removed by dry etching using chlorine and oxygen to form a pattern in conformity with the absorber pattern.

As described above, a reflective mask in this example was obtained.

The reflective mask was subjected to final inspection of the pattern by the use of the inspection light having a wavelength of 257 nm. The ratio of reflectivity between the surface of the absorber layer and the surface of the multilayer reflective film for the inspection light was 1:12. The contrast value was 85%. Thus, a sufficient contrast was obtained.

Using the reflective mask in this example, pattern transfer was carried out onto a semiconductor substrate (silicon wafer) with a resist in the manner similar to Example 1-1. As a result, it was confirmed that the reflective mask in this example had an accuracy of 16 nm or less which is a required accuracy in the 70 nm design rule.

The first embodiment of this invention described in the foregoing is summarized as follows.

(1-1) On a substrate, a reflective layer for reflecting exposure light in a short-wavelength region including an EUV region, a buffer layer for protecting the reflective layer during formation of a mask pattern, and an absorber layer for absorbing the exposure light are successively formed. The absorber layer has an at least two-layer structure including as a lower layer an exposure light absorbing layer for absorbing the exposure light in the short-wavelength region including the EUV region and as an upper layer a low-reflectivity layer for inspection light used in inspection of the mask pattern. With this structure, the absorber layer on the surface of a reflective mask to be formed is functionally separated into a layer for absorbing the exposure light and a layer having a low reflectivity for the wavelength of mask pattern inspection light. Thus, a sufficient exposure light absorption function is assured and the reflectivity on the surface of an absorber pattern at the wavelength of the inspection light is remarkably lowered. As a result, a difference in reflectivity between the surface of the absorber pattern as an uppermost layer and the surface of the buffer layer in an area without the absorber pattern is increased so that a sufficient contrast during pattern inspection is assured. Therefore, it is possible to accurately and quickly inspect the mask pattern by the use of an existing mask inspection apparatus using inspection light in a deep ultraviolet region.

(1-2) By selecting a specific substance as an exposure light absorber of the lower layer of the absorber layer, the effect of the invention in (1-1) is further exhibited.

(1-3) By selecting a particular substance as the inspection light low-reflectivity layer as the upper layer of the absorber layer, the effect of the invention in (1-1) is further exhibited.

(1-4) A reflective mask obtained by using the mask blank of this invention and forming a mask pattern thereon exhibits the above-mentioned effect.

(1-5) The mask blank of this invention is obtained by the steps of forming on a substrate a reflective layer for reflecting exposure light in a short-wavelength region including an EUV region, forming on the reflective layer a buffer layer for protecting the reflective layer during formation of a mask pattern, forming on the buffer layer an exposure light absorbing layer for absorbing the exposure light in the short-wavelength region including the EUV region, and forming on the exposure light absorbing layer a low-reflectivity layer for inspection light used in inspection of the mask pattern. Therefore, a known deposition method is applicable. It is thus possible to provide the mask blank easy in production and low in cost.

(1-6) Depending upon a material of an absorber, it is possible to form the low-reflectivity layer for the inspection light used in inspection of the mask pattern by forming on the buffer layer the exposure light absorbing layer for absorbing the exposure light in the short-wavelength region including the EUV region and thereafter treating the surface of the absorbing layer. Therefore, it is possible to shorten a time required for changing a deposition condition or the like, to reduce the number of kinds of materials, and to reduce the number of deposition chambers. Thus, the work is simplified and the working time is shortened.

(1-7) By obtaining the relationship between the thickness of the low-reflectivity layer formed on the exposure light absorbing layer and the reflectivity on the low-reflectivity layer at the wavelength of the inspection light, it is possible to control the thickness of the low-reflectivity layer so as to minimize the reflectivity on the low-reflectivity layer for the wavelength of the inspection light.

(1-8) The reflective mask of this invention is produced by patterning the absorber layer in the mask blank. The reflective mask is easily produced by the use of known patterning means. It is therefore possible to provide the reflective mask at a low cost.

(1-9) After patterning the absorber layer of the mask blank, the buffer layer is removed in an area where the absorber layer is removed. Consequently, the exposure light reflective layer is exposed in an area where the absorber pattern is not present. It is therefore possible to improve an exposure light reflection characteristic of the reflective mask.

2nd Embodiment

Next, a second embodiment of this invention will be described in detail with reference to the drawing.

Figure 14:
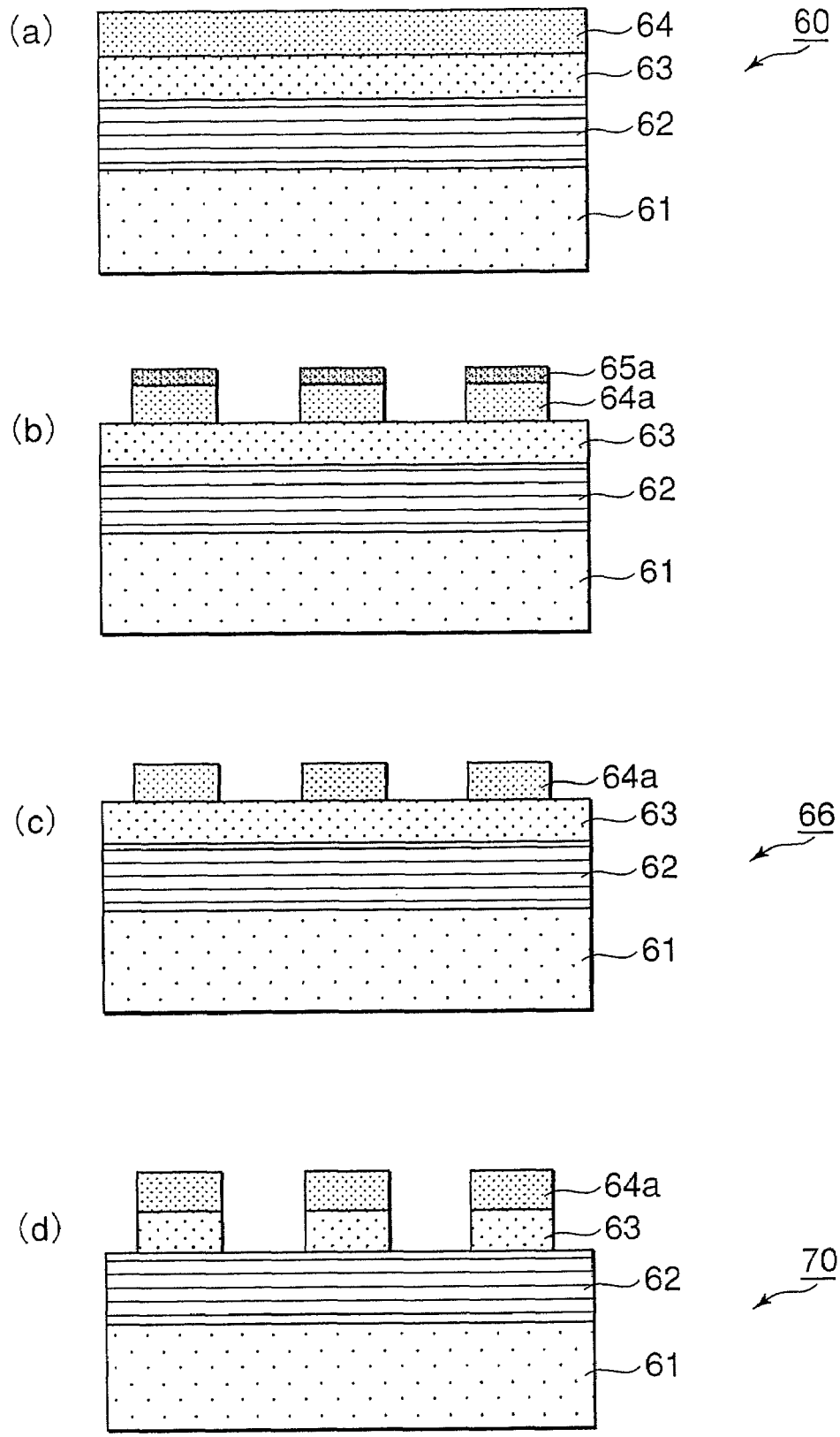
FIG. 14 show schematic sectional views for describing a production process of a reflective mask according to a second embodiment of this invention.

FIG. 14 shows schematic sectional views illustrating a process of producing a reflective mask by the use of a reflective mask blank 60 according to the second embodiment of this invention.

The reflective mask blank 60 according to this invention comprises a substrate 61 on which a multilayer reflective film 62, a buffer layer 63, and an absorber layer 64 are successively formed, as illustrated in FIG. 14(*a*).

At first, description will be made of the respective layers of the reflective mask blank 60 according to this invention.

The absorber layer 64 of the reflective mask blank 60 of this invention has a function of absorbing EUV light as exposure light.

As the absorber layer 64 of this invention, use is made of a material containing tantalum, boron, and at least one of oxygen and nitrogen. By the use of the material, it is possible to sufficiently lower the reflectivity of the absorber layer 64 for a pattern inspection wavelength as compared with the reflectivity of the buffer layer 63 and to improve a contrast during pattern inspection. Specifically, it is desired to select a material so that the reflectivity of the surface of the absorber layer 64 for the pattern inspection wavelength is 20% or less, preferably 10% or less.

As the above-mentioned material, use may be made of, for example, tantalum boron nitride (TaBN), tantalum boron oxide (TaBO), and tantalum boron oxynitride (TaBNO).

Tantalum is an excellent material of the absorber layer, which has a large absorption coefficient for the EUV light and which is easily dry-etched by chlorine and excellent in processability.

The tantalum boron alloy (TaB) is easily amorphized and provides a film excellent in smoothness. The TaB film is suppressed from reduction of the EUV light absorption coefficient as compared with a Ta metal. Further, because of excellent controllability of a film stress, this film is an absorber layer material capable of achieving a high dimensional accuracy of a mask pattern.

By further adding nitrogen to TaB as the above-mentioned material, it is possible to lower the reflectivity for deep ultraviolet (hereinafter referred to as DUV) light of 190 nm to 260 nm used as the pattern inspection wavelength. By addition of nitrogen, it is possible to obtain an effect of improving the smoothness of the film and reducing the surface roughness.

If the surface roughness of the surface of the absorber layer is large, edge roughness of the absorber pattern is increased and the dimensional accuracy of the pattern is degraded. As the pattern is finer, the influence of the edge roughness is remarkable and, therefore, the surface of the absorber layer is required to be smooth.

In the reflective mask and the reflective mask blank according to this invention, the surface roughness of the surface of the absorber is preferably 0.5 nmRms or less, more preferably 0.4 nmRms or less, further preferably 0.3 nmRms or less.

In order to reduce the surface roughness on the surface of the absorber, it is effective that the absorber layer comprises a film having an amorphous structure. In case where the buffer layer is provided, it is necessary to use a smooth film as the buffer layer.

By further adding oxygen to TaB, the reflectivity for the DUV light used as the pattern inspection wavelength is lowered, like in the case of nitrogen. As compared with nitrogen, oxygen is greater in effect of reducing the reflectivity for the DUV light. By including both nitrogen and oxygen in TaB, it is possible to obtain the effect of reducing the reflectivity for the pattern inspection wavelength and improving the smoothness of the film.

Next, a preferable composition ratio will be described with respect to tantalum boron nitride (TaBN), tantalum boron oxide (TaBO), and tantalum boron oxynitride (TaBNO) as the material of the absorber layer 4. In order that the absorber has a smooth surface, the material is preferably a film having an amorphous structure.

(1) In Case of TaBN

In case of TaBN, the composition of Ta, B, and N is as follows. Preferably, the content of B is 5-25 at %. The ratio of Ta and N (Ta:N) preferably falls within a range of 8:1 to 2:7. The content of B within the above-mentioned range is preferable to obtain an amorphous state. If the content of N is small with respect to Ta, a sufficiently low reflectivity can not be obtained for the inspection light. On the contrary, if the content of N is large, the film density is lowered. In this event, the EUV light absorption coefficient is decreased and the acid resistance is decreased.

(2) In Case of TaBO

In case of TaBO, the content of B is preferably 5-25 at % in order to achieve the amorphous state. The ratio of Ta and O (Ta:O) preferably falls within a range of 7:2 to 1:2. If the content of O is small, a sufficiently low reflectivity can not be obtained for the inspection light. On the other hand, if the content of O is large, the film density is lowered. The EUV light absorption coefficient is decreased and the insulation is enhanced to cause easy occurrence of charge-up.

(3) In Case of TaBNO

In case of TaBNO, the content of B is preferably 5-25 at % in order to achieve the amorphous state. The ratio of Ta, N, and O (Ta:(N+O)) preferably falls within a range of 7:2 to 2:7. If the content of N and O is small, a sufficiently low reflectivity can not be obtained for the inspection light. On the contrary, if the content of N and O is large, the film density is lowered. The EUV light absorption coefficient is decreased and the acid resistance is decreased. Further, the insulation is enhanced to cause each occurrence of charge-up.

As described above, the absorber layer 64 according to this invention preferably comprises a material which contains tantalum, boron, and at least one of oxygen and nitrogen. In addition, an element such as Si, Ge, and Ti may be contained.

The absorber layer 64 according to this invention preferably has an amorphous film structure as described above. A crystalline film is susceptible to stress change with time and is changed in surface composition by an oxygen-containing plasma process. Consequently, the reflectivity for the inspection light is changed. Therefore, in order to be stable against each of mask cleaning, atmospheric air, and a plasma environment, the absorber layer 64 preferably comprises a film having an amorphous structure without containing a crystalline part.

Preferably, the absorber layer 64 in this invention has an absorption coefficient of 0.025 or more, further 0.030 or more at the wavelength of the exposure light in order to reduce the thickness of the absorber layer. The absorber layer 4 must have a thickness sufficient to absorb the EUV light as the exposure light. Generally, the thickness is on the order of 30 to 100 nm.

The absorber layer 64 in this invention may be formed by sputtering such as magnetron sputtering. For example, the absorber layer may be deposited by sputtering using a target containing tantalum and boron and an argon gas with oxygen or nitrogen added thereto.

The absorber layer 64 in this invention may have a predetermined distribution of the content of oxygen or nitrogen in the thickness direction. In this invention, oxygen or nitrogen may be distributed in the absorber layer 64 to that the content is increased from the side adjacent to the buffer layer 3 or the reflective multilayer film towards the surface. For example, the content of nitrogen or oxygen distributed in the absorber layer 64 may be increased from the side adjacent to the buffer layer 3 towards the surface in profile of a linear shape, a curved shape, or a stepwise shape. Such distribution of nitrogen or oxygen may easily be achieved by changing, during deposition, the amount of an oxygen gas or a nitrogen gas added during deposition of the absorber layer 4.

Alternatively, nitrogen or oxygen may be added only to a predetermined depth from the surface of the absorber layer 64 (for example, over a thickness of about 10 nm to 20 nm from the surface contributing to reflection of the inspection light). Such distribution of nitrogen or oxygen in the absorber layer 64 may be obtained by adjusting the amount of the gas added during deposition as described above. Alternatively, such distribution may be obtained by at first forming the absorber layer containing Ta and B and then nitriding or oxidizing the surface of the absorber layer. Such nitriding or oxidizing may be carried out by ion implantation into the surface of the absorber layer or by exposure of the surface of the absorber layer to plasma. Oxidizing may also be carried out by heat treatment.

Generally, as the content of nitrogen or oxygen is increased, the absorptivity of the EUV light as the exposure light tends to be decreased. Therefore, a desired distribution is formed in the thickness of the absorber layer 64 so that the content of nitrogen or oxygen is increased in the vicinity of the surface of the absorber layer 64 contributing to reflection of the inspection light while the content of nitrogen or oxygen is reduced in a portion adjacent to the buffer layer 63 not contributing to reflection of the inspection light, as described above. In this event, it is possible to suppress the reduction in absorptivity of the EUV light in the absorber layer 64 as a whole.

Next, the buffer layer 63 of the reflective mask blank 60 of this invention has a function of protecting the multilayer reflective film 2 upon forming a pattern on the absorber layer 64 or upon repairing the pattern.

As a material of the buffer layer 63 to be combined with the material of the absorber layer 64 of this invention, i.e., the material containing Ta, B, and at least one of oxygen and nitrogen, a material containing chromium (Cr) is preferably used.

The buffer layer 63 comprising a material containing Cr assures a large etch selectivity of 20 or more with respect to the absorber layer 64 of this invention containing Ta. The material containing Cr has a reflectivity of about 40% to 55% at the pattern inspection wavelength and is preferable in view of the relationship in reflectivity among the surface of the multilayer reflective film 62, the surface of the buffer layer 63, and the surface of the absorber layer 64 (the reflectivity is desirably smaller in this order) at the inspection wavelength, which will later be described. Further, the material containing Cr can be removed without any substantial damage upon the multilayer reflective film 62 during removal of the buffer layer 63.

As the material containing Cr used as the buffer layer 63 of this invention, use is preferably made of a Cr element and a material containing Cr and at least one element selected from N, O, and C. For example, use may be made of chromium nitride (CrN), chromium oxide (CrO), chromium carbide (CrC), chromium oxynitride (CrNO), and chromium carboxynitride (CrCNO). By adding N to Cr, the acid resistance is improved so that the resistance against a mask cleaning solution is improved. In addition, the smoothness of the film is improved and the film stress is decreased. By adding O to Cr, low stress controllability during deposition is improved. By adding C to Cr, dry etching resistance is improved.

For example, in case of chromium nitride (CrN), a preferable composition ratio of chromium and nitrogen is $Cr_{1-X}N_X$ where $0.05 \leqq X \leqq 0.5$, more preferably $0.05 \leqq X \leqq 0.2$. X being smaller than 0.05 is unfavorable in view of the acid resistance, the film stress, and the surface roughness. If X is greater than 0.5, the reflectivity for the inspection light is excessively lowered so that the contrast with the surface of the absorber layer 64 can not be sufficiently large. To the $Cr_{1-X}N_X$ film, oxygen, carbon, or the like may be added in a small amount, for example, about 5%.

The buffer layer 63 comprising the material containing Cr may be formed by sputtering such as magnetron sputtering. For example, in case of the chromium nitride film mentioned above, deposition may be carried out using a Cr target in a gas atmosphere containing argon with 5-40% nitrogen added thereto.

In case where the absorber pattern is repaired by the use of focused ion beam (hereinafter referred to as FIB), the buffer layer is damaged. Therefore, in order to prevent the multilayer reflective film 2 as the underlying layer from being affected by the damage, the thickness of the buffer layer 63 in this invention is preferably 30-50 nm. However, if the FIB is not used, the thickness may be as thin as 4-10 nm.

Besides, the material of the buffer layer to be used in combination with the absorber layer 64 of this invention may be $SiO_2$, silicon oxynitride (SiON), Ru, and so on.

The buffer layer is formed if necessary. Depending upon the condition of pattern formation onto the absorber or repair, the absorber layer may be formed directly on the reflective multilayer film.

Next, description will be made of the multilayer reflective film 62 of the reflective mask blank 60 according to this invention. As the reflective film 62, a multilayer film comprising elements different in refractive index and periodically laminated. Generally, use is made of a multilayer film obtained by alternately laminating thin films of a heavy element or its compound and thin films of a light element or its compound in about 40 periods.

For example, as a multilayer reflective film for the EUV light having a wavelength of 13-14 nm, use is preferably made of a Mo/Si periodic multilayer film comprising Mo and Si alternately laminated in about 40 periods. Besides, as a multilayer reflective film used in the region of the EUV light, use may be made of a Ru/Si periodic multilayer film, a Mo/Be periodic multilayer film, a Mo compound/Si compound periodic multilayer film, a Si/Nb periodic multilayer film, a Si/Mo/Ru periodic multilayer film, a Si/Mo/Ru/Mo periodic multilayer film, and a Si/Ru/Mo/Ru periodic multilayer film. Depending upon the exposure wavelength, a material is appropriately selected.

The multilayer reflective film 62 may be formed by depositing the respective layers by DC magnetron sputtering, ion beam deposition, or the like. In case of the Mo/Si periodic multilayer film described above, DC magnetron sputtering is used. At first, a Si film of about several nanometers is deposited using a Si target in an Ar gas atmosphere. Thereafter, a Mo film of about several nanometers is deposited using a Mo target in an Ar gas atmosphere. Defining the above-mentioned deposition as a single period, deposition is carried out in 30 to 60 periods. Finally, a Si film is formed.

As the substrate 61 of the reflective mask blank according to this invention, it is preferable to use a material having a low thermal expansion coefficient (within a range of $0 \pm 1.0 \times 10^{-7}/°C.$, more preferably within a range of $0 \pm 0.3 \times 10^{-7}/°C.$) and excellent in smoothness, flatness, and resistance against a mask cleaning solution. Therefore, use may be made of a glass having a low thermal expansion, for example, a $SiO_2$—$TiO_2$ glass. Alternatively, use may be made of a crystallized glass with β-quartz solid solution precipitated therein, a quartz glass, a silicon or a metal substrate, and so on. As the metal substrate, an Invar alloy (Fe—Ni alloy) may be used.

Preferably, the substrate 61 has a smooth surface of 0.2 nmRms or less and a flatness of 100 nm or less in order to achieve high reflectivity and high transfer accuracy. In order to prevent deformation due to a film stress of a film formed thereon, the substrate 61 preferably has high rigidity. In particular, the substrate preferably has a high Young's modulus of 65 GPa or more.

A unit Rms indicative of the smoothness in this invention is a root-mean-square roughness and can be measured by the use of an atomic force microscope. The flatness in this invention is a value indicating surface warp (deformation) given by TIR (Total Indicated Reading). This value is an absolute value of a difference in level between a highest position on a substrate surface above a focal plane and a lowest position on the substrate surface below the focal plane where the focal plane is a plane determined by the least square method with reference to the substrate surface. In this invention, the flatness is measured in an area of 140 mm×140 mm.

The reflective mask blank 60 according to this invention has the above-mentioned structure.

Next, description will be made of a production process of the reflective mask using the reflective mask blank of this invention and pattern inspection.

The reflective mask blank 60 (see FIG. 14(*a*)) in this invention is obtained by successively forming, on the substrate 61, the multilayer reflective film 62, the buffer layer 63, and the absorber layer 64. The material and the forming method of each layer are described above.

Next, an absorber pattern is formed on the absorber layer 64 of the reflective mask blank 60. At first, an electron beam resist is applied on the absorber layer 64 and baked. Next, writing is carried out by the use of an electron beam writer and development is carried out to form a resist pattern 65*a*.

Using the resist pattern 65*a* as a mask, the Ta-based absorber layer 64 of this invention is dry-etched using chlorine to form the absorber pattern 64*a* (see FIG. 14(*b*)).

Next, using hot dense sulfuric acid, the resist pattern 65*a* remaining on the absorber pattern 64*a* is removed to form a mask 66 (see FIG. 14(*c*)).

Herein, inspection (first inspection) is carried out to confirm whether or not the absorber pattern 64*a* is formed exactly as designed. For the inspection of the absorber pattern 64*a*, use is generally made of DUV light having a wavelength of about 190 nm to 260 nm as described above. The inspection light is incident to the mask 66 with the absorber pattern 64*a* formed thereon. Herein, the inspection is carried out by detecting inspection light reflected on the absorber pattern

64a and inspection light reflected by the buffer layer 63 exposed after the absorber layer 64 is removed, and observing the contrast therebetween.

In the above-mentioned manner, detection is made of a pinhole defect (white defect) at which the absorber layer is removed although it should not be removed, or a residue of the absorber layer (black defect) which is not removed due to underetching. Upon occurrence of the pinhole defect and the underetching defect, these defects are repaired.

The pinhole defect may be repaired by depositing a carbon film using FIB assisted deposition. The underetching defect may be repaired by removing an unnecessary part by FIB irradiation or the like.

After completion of the pattern inspection and the repair as mentioned above, the exposed part of the buffer layer 63 is removed in conformity with the absorber pattern 64a. Thus, a pattern 63a is formed on the buffer layer to produce a reflective mask 70 (see FIG. 14(d)). Herein, in case of the buffer layer 63 containing chromium such as chromium nitride, dry etching with a gas containing chlorine and oxygen may be used.

Finally, the pattern formed as mentioned above is subjected to inspection for final confirmation (final inspection). The inspection for final confirmation is to finally confirm whether or not the absorber pattern 64a has a dimensional accuracy in exact conformity with the specification. In the inspection for final confirmation also, the above-mentioned DUV light having a wavelength of about 190 nm to 260 nm is used. The inspection light is incident to the reflective mask 70 in which the absorber layer 64 and the buffer layer 63 are patterned. In this case, inspection is carried out by detecting inspection light reflected on the absorber pattern 64a and inspection light reflected on the multilayer reflective film 62 exposed after the buffer layer 63 is removed and observing the contrast therebetween.

Thus, the inspection of the reflective mask includes two kinds, i.e.:

(a) inspection for detecting a pattern defect after forming the absorber pattern (first inspection)

(b) inspection for confirming a final specification of the mask (final inspection)

In order to accurately and quickly carry out the inspection in each of (a) and (b), it is necessary to obtain a sufficient contrast.

Specifically, the inspection (a) requires the contrast of reflection between the surface of the absorber layer 64 and the surface of the buffer layer 63. The inspection (b) requires the contrast of reflection between the surface of the absorber layer 64 and the surface of the multilayer reflective film 62.

The contrast value upon inspection is defined by the following formula.

$$\text{contrast value (\%)} = \{(R_2 - R_1)/(R_2 + R_1)\} \times 100$$

(where $R_1$ and $R_2$ are values of reflectivity in the respective layers to be inspected, $R_2 > R_1$)

The periodic laminate film of Si and Mo generally used as the multilayer reflective film 62 for the EUV light having a wavelength of about 13 nm has a reflectivity of about 60% for the inspection light (DUV light). Taking the contrast with the multilayer reflective film 62 into consideration, it is advantageous to lower the reflectivity on the surface of the absorber layer 64 for the inspection light. Therefore, in this invention, it is desired to select the material so that the reflectivity on the surface of the absorber layer 64 is lower than that on the multilayer reflective film 62.

Further, it is preferable to design the reflectivity so that the reflectivity for the inspection light is successively lowered in the order of the surface of the multilayer reflective film 2, the surface of the buffer layer 63, and the surface of the absorber layer 64. In this manner, in the inspection in each of (a) and (b) mentioned above, a portion where the absorber pattern 64a is present is dark without reversal of the pattern contrast. Therefore, the setting of the inspection apparatus need not be changed and the result is easily recognizable.

In view of the above, it is desired that the surface of the absorber layer 64 has a reflectivity of 20% or less, preferably 10% or less for the inspection wavelength. The contrast value (the above-mentioned definition formula) in the inspection is 40% or more, preferably 50% or more, further preferably 60% or more. Herein, the contrast value is a contrast between the absorber layer and the reflective multilayer film or a contrast between the absorber layer and the buffer layer.

Upon selection of the material of the absorber layer 64 satisfying the above-mentioned condition, optimization is achieved by preliminarily obtaining the relationship among the composition of the material of the absorber layer 64 having the EUV light absorption characteristic, the inspection wavelength, and the reflectivity for the inspection light. For example, with respect to a specific inspection wavelength, the relationship between the composition of the material of the absorber layer 64 and the reflectivity is obtained. Based on the relationship, the reflectivity on the surface of the absorber layer 4 is adjusted to a desired value. Specifically, the amount of nitrogen or oxygen added to TaB is adjusted so as to achieve a desired reflectivity for the wavelength of light used in the inspection.

The removal of the buffer layer 63 in the mask production process mentioned above may not be carried out if the buffer layer 63 is thin and has less influence upon decrease in reflectivity. In this case, the reflective mask is used in a state where the buffer layer 63 covers an entire surface of the multilayer reflective film 62.

As described above, in this invention, the absorber layer 4 is formed by a material comprising an alloy material containing tantalum and boron excellent in EUV light absorption and processability and at least one of nitrogen and oxygen added thereto. It is therefore possible to obtain the reflective mask blank and the reflective mask having a sufficient contrast for the inspection light upon inspection of the mask pattern.

Each of the above-mentioned reflective masks and the above-mentioned reflective mask blanks according to this invention is particularly suitable if the EUV light (having a wavelength of about 0.2-100 nm) is used as the exposure light but may be appropriately used for light having other wavelengths.

Examples

Now, this invention will be described more in detail in connection with specific examples. For convenience of description, the reference numerals in FIG. 14 are used as appropriate.

Example 2-1

At first, the reflective mask blank 60 as illustrated in FIG. 14(a) was produced. The substrate 61 used herein is a $SiO_2$—$TiO_2$ glass substrate (having an outer dimension of 6 inch square and a thickness of 6.3 mm). The substrate 61 has a coefficient of thermal expansion of $0.2 \times 10^{-7}/°$C. and a Young's modulus of 67 GPa. The glass substrate was subjected to mechanical polishing to have a smooth surface of 0.2 nmRms or less and a flatness of 100 nm or less.

As the multilayer reflective film 62 formed on the substrate 61, a Mo/Si periodic multilayer reflective film was used in this example in order to form the multilayer reflective film suitable for an exposure light wavelength band of 13-14 nm. Specifically, the multilayer reflective film 62 was formed by alternately laminating Mo and Si on the substrate 61 by DC magnetron sputtering. At first, using a Si target, a Si film was deposited to the thickness of 4.2 nm under an Ar gas pressure of 0.1 Pa. Thereafter, using a Mo target, a Mo film was deposited to a thickness of 2.8 nm under an Ar gas pressure of 0.1 Pa. Defining the above-mentioned deposition as a single period, deposition was carried out in 40 periods. Finally, a Si film was deposited to a thickness of 4 nm. The total thickness was 284 nm. The multilayer reflective film 62 had a reflectivity of 65% for light of 13.4 nm at an incident angle of 2 degrees. The surface of the multilayer film 62 had a surface roughness of 0.12 nmRms. The surface of the multilayer reflective film for inspection light having a wavelength of 257 nm was 60%.

The buffer layer 63 formed on the multilayer reflective film 62 comprises chromium nitride and has a thickness of 50 nm. Herein, chromium nitride is represented by $Cr_{1-X}N_X$ where X=0.1. The buffer layer 63 was formed by DC magnetron sputtering using a Cr target and a sputter gas containing Ar with 10% nitrogen added thereto. By X-ray diffraction, it was confirmed that the buffer layer 63 thus formed had a fine crystalline state as a crystal condition.

The buffer layer 63 had a stress of +40 MPa. The surface of the buffer layer 63 had a reflectivity of 52% for the light having a wavelength of 257 nm. The surface of the buffer layer had a surface roughness of 0.27 nmRms.

As the absorber layer 64 formed on the buffer layer 63 in this example, tantalum boron nitride (TaBN) was formed to a thickness of 50 nm. In order to obtain a desired reflectivity for the inspection light of 257 nm, the relationship between the composition of the material of the absorber layer 64 and the reflectivity for the inspection light of 257 nm was obtained and the composition of Ta:B:N was determined as 45:10:45. The absorber layer 64 was deposited by DC magnetron sputtering using a sintered target containing Ta and B and a gas containing Ar with 40% nitrogen added thereto. The relationship between a film stress and a supply power to the target was preliminarily obtained. The supply power to the target was controlled so that the absorber layer 64 had a stress of −50 MPa which is reverse to the stress of the buffer layer 63. The absorber layer 64 deposited under the above-mentioned deposition condition had an amorphous structure. The surface of the absorber layer 64 had a reflectivity of 20% for the light of 257 nm and an absorption coefficient of 0.036 for the EUV light of a wavelength of 13.4 nm. The surface of the absorber layer had a surface roughness of 0.25 nmRms.

As described above, the reflective mask blank 60 in this example was obtained as illustrated in FIG. 14(a).

Next, description will be made of a method of producing the reflective mask 70 illustrated in FIG. 14(d). At first, an electron beam irradiation resist was applied on the absorber layer 64 of the reflective mask blank 60. By electron beam, a 16 Gbit-DRAM pattern with 0.07 µm design rule was written. Then, development was carried out to form the resist pattern 65a.

With the resist pattern 65a used as a mask, the absorber layer 64 was dry-etched using chlorine to form the absorber pattern 64a (see FIG. 14(b)).

Next, the resist pattern 65a remaining on the absorber pattern 64a was removed by hot sulfuric acid at 100° C. to obtain the mask 66 (see FIG. 14(c)).

Figure 15:
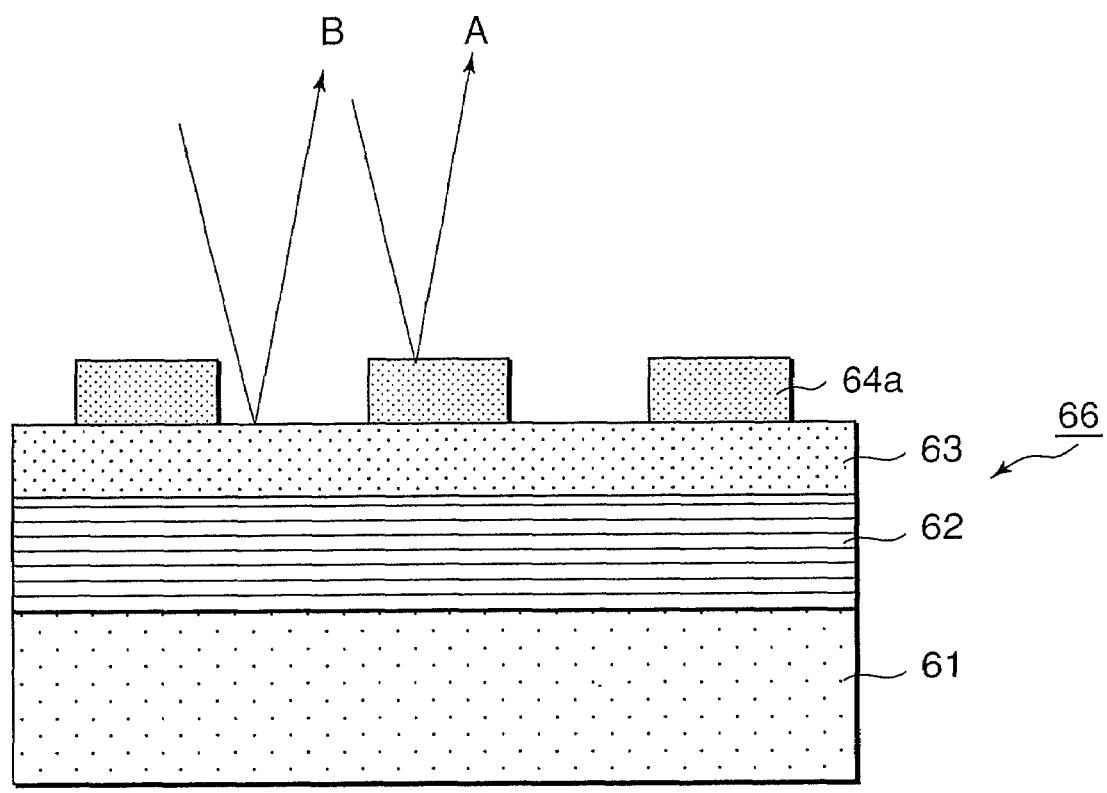
FIG. 15 is a schematic view for describing an inspection method for an absorber pattern of the reflective mask according to the second embodiment of this invention.

In this state, the absorber pattern 64a was inspected. As illustrated in FIG. 15, the absorber pattern 64a was inspected by the use of the inspection light having a wavelength of 257 nm and incident to the surface of the mask 66 and monitoring the contrast between inspection light A reflected by the absorber pattern 64a and inspection light B reflected on the surface of the buffer layer 63.

The ratio of reflectivity for the inspection light between the surface of the buffer layer 63 and the surface of the absorber pattern 64a is 1:0.38. The contrast value by the above-mentioned definition formula was 44%. Thus, a sufficient contrast was obtained in the inspection.

Next, the chromium nitride layer as the buffer layer 63 remaining on a reflection region (an area where the absorber pattern 64a is absent) of the mask 66 was removed in conformity with the absorber pattern 64a to form a buffer layer pattern 63a (see FIG. 14(d) described above). The buffer layer 63 was removed by dry etching using a mixed gas of chlorine and oxygen.

As described above, the reflective mask 70 having the structure illustrated in FIG. 14(d) was obtained.

Figure 16:
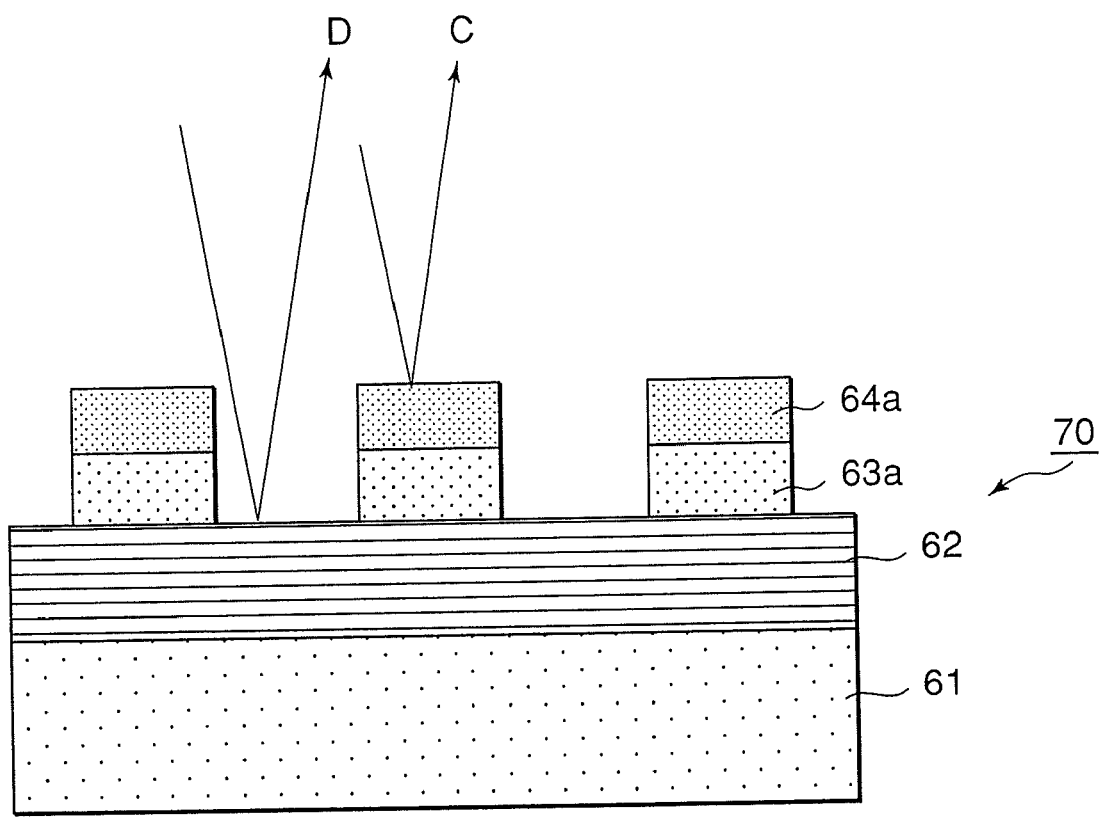
FIG. 16 is a schematic view for describing an inspection method for an absorber pattern of the reflective mask according to the second embodiment of this invention.

After the pattern 63a was formed on the buffer layer as described above, the reflective mask 70 was subjected to the inspection for final confirmation. As inspection light, light having a wavelength of 257 nm was used. The light was incident to the surface of the mask 70 as illustrated in FIG. 16. Observation was made of the contrast between inspection light C reflected by the absorber pattern 64a and inspection light D reflected on the multilayer reflective film 62. The ratio of reflectivity for the inspection light between the surface of the multilayer reflective film 62 exposed after the buffer layer 63 was removed and the surface of the absorber pattern 64a is 1:0.33. The contrast value was 50%. Thus, a sufficient contrast was obtained in the inspection for final confirmation also.

By the inspection, it was confirmed that a 16 Gbit-DRAM pattern with 0.07 µm design rule was formed on the reflective mask 70 exactly as designed.

Next, description will be made of a method of transferring a pattern by EUV light onto a semiconductor substrate (silicon wafer) with a resist by the use of a pattern transfer apparatus shown in FIG. 17 and the reflective mask 70.

The pattern transfer apparatus 50' with the reflective mask 70 mounted thereto generally comprises a laser plasma X-ray source 32', the reflective mask 70, and a reducing optical system 33'. The reducing optical system 33' comprises an X-ray reflection mirror. The pattern reflected by the reflective mask 70 is generally reduced to about ¼ by the reducing optical system 33'. Since the wavelength band of 13-14 nm is used as the exposure wavelength, an optical path was preliminarily positioned in vacuum.

In the above-mentioned state, the EUV light obtained from the laser plasma X-ray source 32' was incident to the reflective mask 70. The light reflected by the mask was transferred to the silicon wafer 34' through the reducing optical system 33'.

The light incident to the reflective mask 70 was absorbed by the absorber layer and was not reflected in an area where the absorber pattern 64a is present. On the other hand, the light incident to an area where the absorber pattern 64a is not present was reflected by the multilayer reflective film 62. Thus, an image formed by the light reflected from the reflective mask 70 was incident to the reducing optical system 33'. The exposure light passing through the reducing optical system 33' exposed a transfer pattern to a resist layer on the silicon wafer 34'. By developing the resist layer after exposure, a resist pattern was formed on the silicon wafer 34'.

As described above, pattern transfer onto the semiconductor substrate was carried out. As a result, it was confirmed that the reflective mask 70 in this example had an accuracy of 16 nm or less which is a required accuracy in the 70 nm design rule.

Example 2-2

This example is different from Example 2-1 in that tantalum boron oxynitride (TaBNO) was used as a material of the absorber layer 64.

In the manner similar to Example 2-1, the multilayer reflective film 62 and the buffer layer 63 of chromium nitride were formed on the substrate 61.

Next, on the buffer layer 63, a tantalum boron oxynitride (TaBNO) film was formed as the absorber layer 64 to a thickness of 50 nm. The absorber layer 64 was formed by DC magnetron sputtering using a target containing Ta and B and a mixed gas containing Ar with 10% nitrogen and 20% oxygen added thereto. By controlling the sputtering condition, the stress of the absorber layer 64 was adjusted to −50 MPa.

With reference to the relationship between the composition of TaBNO and the reflectivity for the inspection light having a wavelength of 257 nm, the composition of the material of the absorber layer 64 was selected so that a desired reflectivity is obtained. Specifically, Ta:B:N:O=55:10:10:25. The absorber layer 64 thus deposited had an amorphous structure. The surface of the absorber layer 64 had a reflectivity of 15% for the light of 257 nm and an absorption coefficient of 0.036 for the EUV light having a wavelength of 13.4 nm. The surface roughness on the surface of the absorber layer was 0.25 nmRms.

As described above, the reflective mask blank 60 in this example was obtained.

Next, in the manner similar to Example 2-1, a reflective mask was produced from the reflective mask blank in this example.

Specifically, the absorber pattern 64a was formed on the absorber layer 64. After the resist pattern 65a left on the absorber pattern 64a was removed, the absorber pattern 64a was inspected in the manner similar to Example 2-1.

In this example, the ratio of reflectivity for the inspection light between the surface of the buffer layer 63 and the surface of the absorber pattern 64a was 1:0.29. The contrast value was 55%. Thus, a sufficient contrast was obtained in the inspection.

Next, in the manner similar to Example 1-1, the chromium nitride layer as the buffer layer 63 remaining on the reflection region (the area where the absorber pattern 64a is absent) of the mask was removed in conformity with the absorber pattern 64a to form the buffer layer pattern 63a. After the pattern 63a was formed on the buffer layer, the reflective mask 70 was subjected to the inspection for final confirmation in the manner similar to Example 2-1.

The ratio of reflectivity for the inspection light between the surface of the multilayer reflective film 62 exposed after the buffer layer 63 was removed and the surface of the absorber pattern 64a was 1:0.25. The contrast value was 60%. Thus, a sufficient contrast was obtained in the inspection for final confirmation also.

As described above, the reflective mask 70 in this example was obtained. It was confirmed by the inspection that, in the reflective mask 70 in this example also, a 16 Gbit-DRAM pattern with 0.07 μm design rule was formed exactly as designed.

Figure 17:
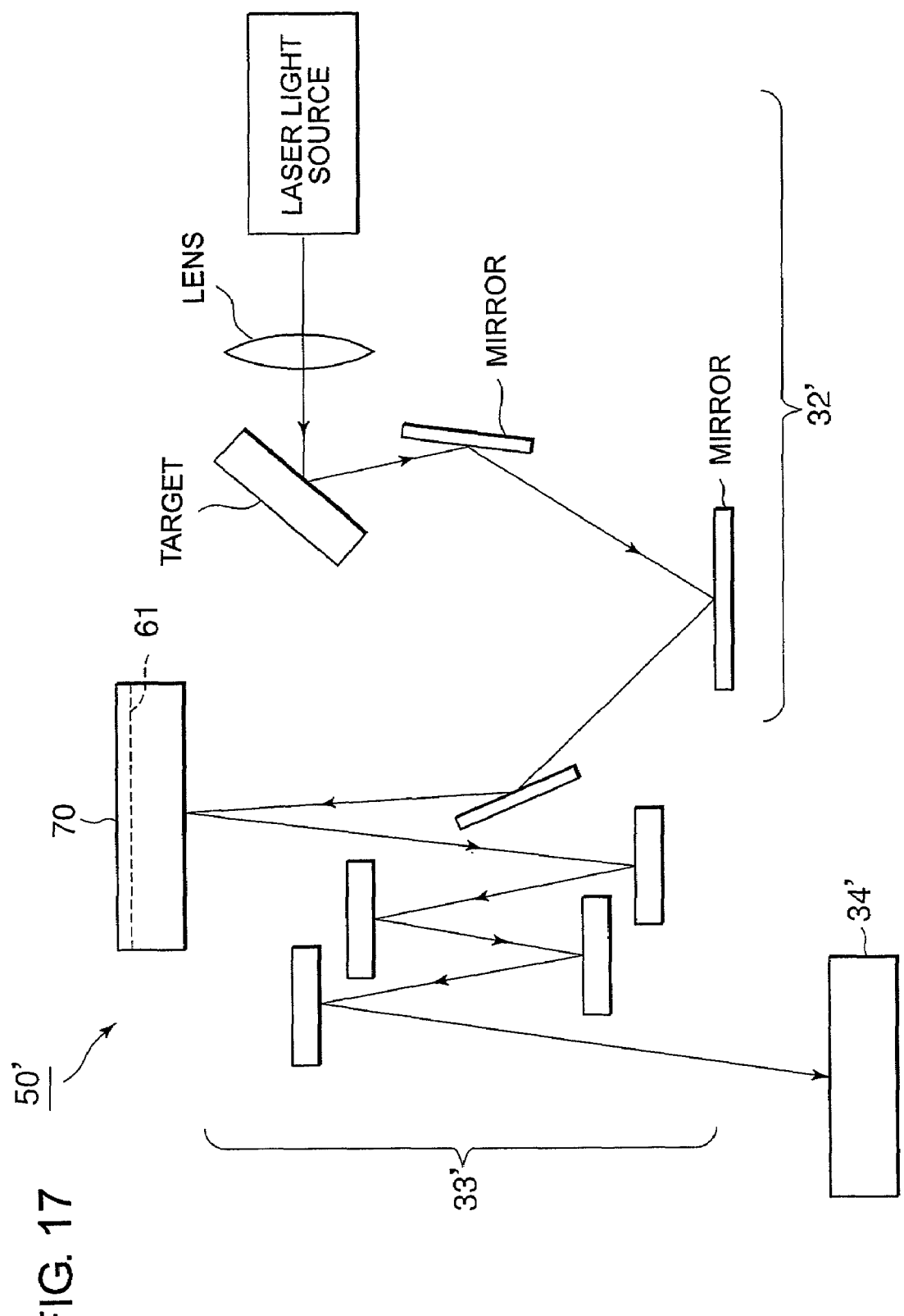
FIG. 17 is a schematic view of a pattern transfer apparatus for carrying out pattern transfer onto a semiconductor substrate by the use of the reflective mask in FIG. 14.

Using the reflective mask 70 in this example, pattern transfer onto a silicon wafer was carried out by the use of the pattern transfer apparatus illustrated in FIG. 17 in the manner similar to Example 2-1. As a result, it was confirmed that the reflective mask in this example had an accuracy of 16 nm or less which is a required accuracy in the 70 nm design rule.

Example 2-3

This example is different from Examples 2-1 and 2-2 in that tantalum boron oxide (TaBO) was used as a material of the absorber layer 64.

In the manner similar to Example 2-1, the multilayer reflective film 62 and the buffer layer 63 of chromium nitride were formed on the substrate 61.

Next, on the buffer layer 63, a tantalum boron oxide (TaBO) film was formed as the absorber layer 64 to a thickness of 50 nm. The absorber layer 64 was formed by DC magnetron sputtering using a target containing tantalum and boron and a mixed gas containing Ar with 25% oxygen added thereto. By controlling the sputtering condition, the stress of the absorber layer 64 was adjusted to −50 MPa. For the material of the absorber layer, the relationship between the composition of TaBO and the reflectivity for the inspection light having a wavelength of 257 nm was obtained. The composition was selected as Ta:B:O=45:10:45 so that a desired reflectivity was obtained. The absorber layer 64 thus deposited had an amorphous structure. The surface of the absorber layer 64 had a reflectivity of 10% for the light of 257 nm and an absorption coefficient of 0.035 for the EUV light having a wavelength of 13.4 nm. The surface roughness on the surface of the absorber layer was 0.25 nmRms.

As described above, the reflective mask blank 60 in this example was obtained.

Next, in the manner similar to Example 2-1, a reflective mask was produced from the reflective mask blank in this example.

Specifically, the absorber pattern 64a was formed on the absorber layer 64. After the resist pattern 65a left on the absorber pattern 64a was removed, the absorber pattern 64a was inspected in the manner similar to Example 1-1.

In this example, the ratio of reflectivity for the inspection light between the surface of the buffer layer 63 and the surface of the absorber pattern 64a was 1:0.19. The contrast value was 68%. Thus, a sufficient contrast was obtained in the inspection.

Next, in the manner similar to Example 1-1, the chromium nitride layer as the buffer layer 63 remaining in the reflection region (the area where the absorber pattern 64a is absent) of the mask was removed in conformity with the absorber pattern 64a to form the buffer layer pattern 63a. After the pattern 63a was formed on the buffer layer, the reflective mask 70 was subjected to the inspection for final confirmation in the manner similar to Example 1-1.

The ratio of reflectivity for the inspection light between the surface of the multilayer reflective film 62 exposed after the buffer layer 63 was removed and the surface of the absorber pattern 64a was 1:0.17. The contrast value was 71%. Thus, a sufficient contrast was obtained in the inspection for final confirmation also.

As described above, the reflective mask in this example was obtained. It was confirmed by the inspection that, in the reflective mask in this example, a 16 Gbit-DRAM pattern with 0.07 μm design rule was formed exactly as designed.

Using the reflective mask in this example, pattern transfer onto a silicon wafer was carried out by the use of the pattern transfer apparatus illustrated in FIG. 17 in the manner similar to Example 1. As a result, it was confirmed that the reflective mask in this example had an accuracy of 16 nm or less which is a required accuracy in the 70 nm design rule.

Comparative Example 1

This comparative example is different from Examples 2-1 to 2-3 described above in that a tantalum boron alloy (TaB) not containing nitrogen and oxygen was used as a material of the absorber layer 64.

In the manner similar to Example 1-1, the multilayer reflective film 62 and the buffer layer 63 of chromium nitride were formed on the substrate 61.

Next, on the buffer layer 63, a tantalum boron (TaB) film was formed as the absorber layer 64 to a thickness of 50 nm. The absorber layer was formed by DC magnetron sputtering using a target containing tantalum and boron and an Ar gas. By controlling the sputtering condition, the stress of the absorber layer was adjusted to −50 MPa. In the absorber layer, Ta:B=4:1. The absorber layer thus deposited had an amorphous structure. The surface of the absorber layer 64 had a reflectivity of 40% for the light of 257 nm.

As described above, the reflective mask blank in the comparative example was obtained.

Next, in the manner similar to Example 2-1, a reflective mask was produced from the reflective mask blank in the comparative example.

At first, the absorber pattern 64a was formed on the absorber layer 64. After the resist pattern left on the absorber pattern was removed, the absorber pattern was inspected in the manner similar to Example 1-1.

In the comparative example, the ratio of reflectivity for the inspection light between the surface of the buffer layer and the surface of the absorber pattern was 1:0.77. The contrast value was 13%. Thus, a sufficient contrast was not obtained in the inspection.

Next, in the manner similar to Example 2-1, the chromium nitride layer as the buffer layer remaining in the reflection region (the area where the absorber pattern is absent) of the mask was removed in conformity with the absorber pattern 64a to form the buffer layer pattern. After the pattern was formed on the buffer layer 63, the reflective mask was subjected to the inspection for final confirmation in the manner similar to Example 2-1.

The ratio of reflectivity for the inspection light between the surface of the multilayer reflective film 62 exposed after the buffer layer was removed and the surface of the absorber pattern 64a was 1:0.67. The contrast value was 25%. Thus, a sufficient contrast was not obtained in the inspection for final confirmation.

In the reflective mask in the comparative example, a sufficient contrast was not obtained as described above. Therefore, an accurate inspection could not be carried out. It was therefore impossible to confirm whether or not a 16 Gbit-DRAM pattern with 0.07 μm design rule was formed exactly as designed.

Example 2-4

Mode without the Buffer Layer, TaBN

In the manner similar to Example 2-1, a Mo/Si periodic multilayer reflective film was formed on a glass substrate. Herein, a Si film as an uppermost layer was formed to a thickness of 11 nm, considering the reduction in film thickness during pattern formation onto the absorber layer.

The reflectivity on the multilayer reflective film was 60% for the inspection light having a wavelength of 257 nm.

The reflectivity for the EUV light (at an incident angle of 2 degrees) having a wavelength of 13.4 nm was 64%.

Next, as the absorber layer, tantalum boron nitride (TaBN) was formed on the multilayer reflective film to a thickness of 100 nm.

Considering the reflectivity for the inspection light having a wavelength of 257 nm, the composition of the TaBN film was determined as Ta:B:N=45:10:45 like in Example.

The TaBN film was formed by DC magnetron sputtering in the manner similar to Example 2-1. Herein, as a result of adjusting the supply power to the target, the TaBN film thus obtained had a stress of −30 MPa. The film had an amorphous structure.

The reflectivity on the surface of the TaBN film was 20% for the light of 257 nm.

The surface roughness was 0.19 nmRms and a very flat surface was obtained.

As described above, the reflective mask blank in this example was obtained.

In the manner similar to Example 2-1, a part of the TaBN absorber layer of the reflective mask blank thus obtained was removed and patterned using a chlorine gas to expose the multilayer reflective film. Thus, the absorber pattern was formed.

In this state, the absorber pattern was inspected using the inspection light having a wavelength of 257 nm. The ratio of reflectivity between the inspection light reflected on the surface of the absorber pattern and the inspection light reflected on the surface of the multilayer reflective film was 1:3. The contrast value was 50%. Thus, a sufficient contrast was obtained.

As described above, pattern inspection of the reflective mask in this example was carried out successfully.

Using the reflective mask in this example, pattern transfer was carried out onto a semiconductor substrate with a resist in the manner similar to Example 1. As a result, it was confirmed that the reflective mask in this example had an accuracy of 16 nm or less which is a required accuracy in the 70 nm design rule.

Example 2-5

Mode without the Buffer Layer, TaBO

In the manner similar to Example 4, a reflective mask blank and a reflective mask were produced except that tantalum boron oxide (TaBO) was used as a material of the absorber layer.

Considering the reflectivity for the inspection light having a wavelength of 257 nm, the TaBO absorber layer had a composition of Ta:B:O=45:10:45 similar to Example 3. The thickness was 100 nm.

The TaBO absorber layer was formed by DC magnetron sputtering in the manner similar to Example 3. Herein, as a result of adjusting the supply power to the target, the TaBO film thus obtained had a stress of −20 MPa. The film had an amorphous structure.

The reflectivity on the surface of the TaBO film was 10% for the light of 257 nm.

The surface roughness was 0.20 nmRms and a very flat surface was obtained.

As described above, the reflective mask blank in this example was obtained.

In the manner similar to Example 2-4, a part of the TaBO absorber layer of the reflective mask blank thus obtained was removed and patterned using a chlorine gas to expose the multilayer reflective film. Thus, the absorber pattern was formed.

In this state, the absorber pattern was inspected using the inspection light having a wavelength of 257 nm. The ratio of reflectivity between the inspection light reflected on the surface of the absorber pattern and the inspection light reflected on the surface of the multilayer reflective film was 1:6. The contrast value was 71%. Thus, a sufficient contrast was obtained.

As described above, pattern inspection of the reflective mask in this example was carried out successfully.

Using the reflective mask in this example, pattern transfer was carried out onto a semiconductor substrate with a resist in the manner similar to Example 1. As a result, it was confirmed that the reflective mask in this example had an accuracy of 16 nm or less which is a required accuracy in the 70 nm design rule.

Comparative Example 2

SiO$_2$ Buffer Layer+TaO Single Layer

In the manner similar to Example 2-1, a Mo/Si multilayer reflective film was formed on a glass substrate.

Next, on the multilayer reflective film, a SiO$_2$ film was formed as the buffer layer to a thickness of 50 nm.

The SiO$_2$ film was deposited by DC magnetron sputtering using a Si target and a mixed gas of argon and oxygen.

The surface of the SiO$_2$ buffer layer had a reflectivity of 42% for the inspection light having a wavelength of 257 nm.

The surface roughness was 0.5 nmRms and was greater than that of the CrN film in Examples.

Further, on the SiO$_2$ buffer layer, the absorber layer of tantalum oxide (TaO) was formed to a thickness of 70 nm.

Formation was carried out by DC magnetron sputtering using a target containing Ta and a mixed gas containing Ar with oxygen added thereto.

The TaO film thus formed had a composition of Ta:O=(60:40) and was a crystalline film.

The surface of the TaO film thus obtained had a reflectivity as low as 12% for the inspection light having a wavelength of 257 nm. On the other hand, the surface roughness was as considerably great as 0.8 nmRms as compared with Examples of this invention because TaO was the crystalline film.

The ratio of reflectivity for the inspect light between the surface of the absorber layer and the buffer layer was 1:3.5. The contrast value was 56%. The ratio of reflectivity between the surface of the absorber layer and the surface of the multilayer reflective film was 1:5. The contrast value was 67%. Thus, a sufficient contrast was obtained in the inspection.

Using the reflective mask in this comparative example, a pattern was transferred onto a semiconductor substrate with a resist in the manner similar to Example 2-1. As a result, in the reflective mask in this comparative example, the edge roughness of the pattern was great because of a large surface roughness on the surface of the absorber. Therefore, an accuracy of 16 nm which is a required accuracy in the 70 nm design rule could not be satisfied.

Example 2-6

Mode in which the Composition Varies Towards the Surface (TaBNO)

In the manner similar to Example 2-1, a Mo/Si periodic multilayer reflective film and a CrN buffer layer were formed on a glass substrate.

Next, on the CrN buffer layer, tantalum boron oxide (TaBO) was formed as the absorber layer to a thickness of 50 nm. The TaBO film was formed by DC magnetron sputtering. A target containing Ta and B was used. A mixed gas of Ar and oxygen was used. Herein, the introduced amount of oxygen was substantially linearly increased from 0% to 25% with time of deposition.

The TaBO film thus obtained had a stress of −50 MPa. The film had an amorphous structure.

Confirmation was made by X-ray photoelectron spectroscopy (XPS). As a result, the TaBO film thus obtained had a distribution of composition in which the content of oxygen is increased in the thickness direction from a side adjacent to the buffer layer towards the surface of the absorber.

The uppermost surface of the TaBO film had a composition of Ta:B:O=45:10:45 approximately.

The reflectivity on the surface of the TaBO film was 12% for the light of 257 nm.

The surface roughness was 0.24 nmRms and a very smooth surface was obtained.

As described above, the reflective mask blank in this example was obtained.

Next, using the mask blank, a reflective mask having a 16 Gbit-DRAM pattern with 0.07 μm design rule was produced.

At first, in the manner similar to Example 2-1, a resist pattern was formed on the absorber layer. Subsequently, by dry etching using a chlorine gas, the TaBO absorber layer was patterned in conformity with the resist pattern to expose a part of the CrN buffer layer.

Herein, the absorber pattern was inspected using the inspection light having a wavelength of 257 nm.

The ratio of reflectivity for the inspection light between the surface of the absorber layer and the surface of the buffer layer was 1:4.3. The contrast value was 63%. Thus, a sufficient contrast was obtained.

After detected defects were repaired by FIB, the exposed part of the CrN buffer layer was removed by dry etching using chlorine and oxygen in conformity with the absorber pattern.

As described above, the reflective mask in this example was obtained.

The reflective mask was subjected to final inspection of the pattern by the use of the inspection light having a wavelength of 257 nm. The ratio of reflectivity for the inspection light between the surface of the absorber layer and the surface of the multilayer reflective film was 1:5. The contrast value was 67%. Thus, a sufficient contrast was obtained.

In the manner similar to Example 2-1, pattern transfer was carried out onto a semiconductor substrate (silicon wafer) with a resist by the use of the reflective mask in this example. As a result, it was confirmed that the reflective mask in this example had an accuracy of 16 nm or less which is a required accuracy in the 0.07 μm design rule.

The second embodiment of this invention described in the foregoing is summarized as follows.

(2-1) In a reflective mask blank comprising a substrate on which a multilayer reflective film for reflecting exposure light, a buffer layer, and an absorber layer for absorbing the exposure light are successively formed, the absorber layer is made of a material containing tantalum (Ta), boron (B), and nitrogen (N). The composition of Ta, B, and N is selected so that the content of B is 5 at % to 25 at % and the ratio of Ta and N (Ta:N) falls within a range of 8:1 to 2:7. Thus, the reflectivity of the absorber layer for the pattern inspection wavelength is sufficiently lowered so as to improve the contrast during pattern inspection. As a result, it is possible to accurately and quickly carry out pattern inspection.

(2-2) The absorber layer is made of a material containing tantalum (Ta), boron (B), and oxygen (O). Like in (2-1), by forming the absorber layer using a specific material, a sufficient contrast is obtained in pattern inspection. It is therefore possible to accurately and quickly carry out pattern inspection.

(2-3) The material of the absorber layer in (2-2) further contains nitrogen (N). Thus, in addition to the effect of (2-2), an effect of improving the smoothness of the film of the absorber layer is obtained.

(2-4) The material of the absorber layer has an amorphous state. Thus, in addition to the effects in (2-1) to (2-3), it is possible to obtain an effect of stabilizing the structure of the absorber layer so that the reflectivity for the inspection light is unchanged.

(2-5) The buffer layer is made of a material containing chromium (Cr). Thus, the etch selectivity with the tantalum-based absorber layer in this invention is large. The relationship with the reflectivity of other layers for the inspection wavelength is easily adjustable. Further, there is another effect that the buffer layer can be removed without no substantial damage upon the multilayer reflective film.

{2-6) A reflective mask obtained by the use of the reflective mask blank in this invention assures a sufficient contrast in pattern inspection and enables accurate and quick pattern inspection.

The invention claimed is:

1. A reflective mask blank comprising a substrate on which a reflective layer for reflecting exposure light in a short-wavelength region including an extreme ultraviolet region and an absorber layer for absorbing the exposure light are successively formed, the absorber layer having an at least two-layer structure including as a lower layer an exposure light absorbing layer comprising an absorber for the exposure light and as an upper layer a low-reflectivity layer comprising an absorber for inspection light used in inspection of a mask pattern, the upper layer being farther from the substrate than the lower layer,
   wherein the exposure light absorbing layer as the lower layer of the absorber layer is made of at least one substance selected from a lower layer substance group consisting of:
   one element selected from an element group consisting of chromium, manganese, cobalt, copper, zinc, gallium, germanium, molybdenum, palladium, silver, cadmium, tin, antimony, tellurium, iodine, hafnium, tantalum, tungsten, titanium, and gold;
   a substance comprising at least one of nitrogen and oxygen and said one element;
   an alloy comprising said one element; and
   a substance comprising at least one of nitrogen and oxygen and said alloy;
   wherein the low-reflectivity layer as the upper layer of the absorber layer is made of at least one substance selected from an upper layer substance group consisting of:
   one of nitride, oxide, and oxynitride of the substance forming the exposure light absorbing layer;
   one of the nitride, the oxide, and the oxynitride with silicon added thereto; and
   oxynitride of silicon; and
   wherein a contrast between reflected light reflected on a surface of the reflective layer and reflected light reflected on a surface of the absorber layer is 40% or more at the wavelength of light used in inspection of a pattern formed on the absorber layer.

2. A reflective mask blank comprising a substrate on which a reflective layer for reflecting exposure light in a short-wavelength region including an extreme ultraviolet region and an absorber layer for absorbing the exposure light are successively formed, the absorber layer having an at least two-layer structure including as a lower layer an exposure light absorbing layer comprising an absorber for the exposure light and as an upper layer a low-reflectivity layer comprising an absorber for inspection light used in inspection of a mask pattern, the upper layer being farther from the substrate than the lower layer,
   wherein the exposure light absorbing layer as the lower layer of the absorber layer is made of at least one substance selected from a lower layer substance group consisting of:
   one element selected from an element group consisting of chromium, manganese, cobalt, copper, zinc, gallium, germanium, molybdenum, palladium, silver, cadmium, tin, antimony, tellurium, iodine, hafnium, tantalum, tungsten, titanium, and gold;
   a substance comprising at least one of nitrogen and oxygen and said one element;
   an alloy comprising said one element; and
   a substance comprising at least one of nitrogen and oxygen and said alloy;
   wherein the low-reflectivity layer as the upper layer of the absorber layer is made of at least one substance selected from an upper layer substance group consisting of:
   one of nitride, oxide, and oxynitride of the substance forming the exposure light absorbing layer;
   one of the nitride, the oxide, and the oxynitride with silicon added thereto; and
   oxynitride of silicon; and
   wherein the reflectivity on the surface of the absorber layer is 20% or less at the wavelength of light used in inspection of a pattern formed on the absorber layer.

3. The reflective mask blank as claimed in claim 1 or 2, wherein each of the exposure light absorbing layer and the low-reflectivity layer of the absorber layer comprises tantalum.

4. The reflective mask blank as claimed in claim 1 or 2, wherein the low-reflectivity layer as the upper layer of the absorber layer is made of oxide of the substance forming the exposure light absorbing layer.

5. The reflective mask blank as claimed in claim 1 or 2, wherein the low-reflectivity layer as the upper layer of the absorber layer further comprises boron.

6. The reflective mask blank as claimed in claim 1 or 2, wherein the exposure light absorbing layer as the lower layer of the absorber layer is made of a substance selected from a group consisting of Ta, TaN, TaO, TaSi, TaSiN, TaB, TaBN, TaGe, and TaGeN.

7. The reflective mask blank as claimed in claim 1 or 2, further comprising a buffer layer formed between the reflective layer and the absorber layer to protect the reflective layer during pattern formation on the absorber layer;
   a contrast between reflected light reflected on a surface of the buffer layer and reflected light reflected on a surface of the absorber layer being 40% or more at the wavelength of light used in inspection of a pattern formed on the absorber layer.

8. The reflective mask blank as claimed in claim 7, wherein the buffer layer is formed by Cr or a substance comprising Cr as a main component.

9. A reflective mask obtained by patterning the absorber layer of the reflective mask blank claimed in claim 1 or 2.

10. A method of producing a semiconductor, wherein a pattern is transferred onto a semiconductor substrate by the use of the reflective mask claimed in claim 9.

* * * * *